US012765205B2

(12) United States Patent
Katayama et al.

(10) Patent No.: US 12,765,205 B2
(45) Date of Patent: Oct. 13, 2026

(54) DISPLAY DEVICE

(71) Applicant: SEMICONDUCTOR ENERGY LABORATORY CO., LTD., Atsugi (JP)

(72) Inventors: Masahiro Katayama, Isehara (JP); Yukinori Shima, Tatebayashi (JP); Masataka Nakada, Tochigi (JP); Shingo Eguchi, Atsugi (JP); Daiki Nakamura, Atsugi (JP); Koji Kusunoki, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 220 days.

(21) Appl. No.: 18/689,899

(22) PCT Filed: Sep. 5, 2022

(86) PCT No.: PCT/IB2022/058311
§ 371 (c)(1),
(2) Date: Mar. 7, 2024

(87) PCT Pub. No.: WO2023/042027
PCT Pub. Date: Mar. 23, 2023

(65) Prior Publication Data

US 2024/0292697 A1 Aug. 29, 2024

(30) Foreign Application Priority Data

Sep. 16, 2021 (JP) ................................ 2021-151469

(51) Int. Cl.
*H10K 59/32* (2023.01)
*H10K 59/131* (2023.01)
(Continued)

(52) U.S. Cl.
CPC ........... *H10K 59/32* (2023.02); *H10K 59/131* (2023.02); *H10K 59/38* (2023.02); *H10K 59/805* (2023.02);
(Continued)

(58) Field of Classification Search
CPC ...... H10K 59/32; H10K 59/131; H10K 59/38; H10K 59/805
See application file for complete search history.

(56) References Cited

U.S. PATENT DOCUMENTS

| | | | |
|---|---|---|---|
| 5,953,985 | A | 9/1999 | Kobayashi |
| 6,120,338 | A | 9/2000 | Hirano et al. |

(Continued)

FOREIGN PATENT DOCUMENTS

| | | | |
|---|---|---|---|
| CN | 001622728 | A | 6/2005 |
| CN | 102738077 | A | 10/2012 |

(Continued)

OTHER PUBLICATIONS

Lamprecht.B et al., "Organic optoelectronic device fabrication using standard UV photolithography", Phys. Stat. Sol. (RRL) (Physica Status Solidi. Rapid Research Letters.), Oct. 30, 2007, vol. 2, No. 1, pp. 16-18.

(Continued)

*Primary Examiner* — Samuel A Gebremariam
(74) *Attorney, Agent, or Firm* — Fish & Richardson P.C.

(57) ABSTRACT

A display device in which a voltage drop is inhibited adequately is provided. The display device includes a first light-emitting device including a first light-emitting layer, a first charge-generation layer over the first light-emitting layer, and a second light-emitting layer over the first charge-generation layer; a first color filter overlapping with the first light-emitting device; a second light-emitting device including a third light-emitting layer, a second charge-generation
(Continued)

layer over the third light-emitting layer, and a fourth light-emitting layer over the second charge-generation layer; a second color filter overlapping with the second light-emitting device; a common electrode included in the first light-emitting device and the second light-emitting device; and an auxiliary wiring electrically connected to the common electrode. The auxiliary wiring includes a first wiring layer and a second wiring layer, the second wiring layer is electrically connected to the first wiring layer through a contact hole of an insulating layer, and the second wiring layer has a lattice shape in a top view.

16 Claims, 27 Drawing Sheets

(51) Int. Cl.
*H10K 59/38* (2023.01)
*H10K 59/80* (2023.01)
*G09G 3/3233* (2016.01)

(52) U.S. Cl.
CPC ... *G09G 3/3233* (2013.01); *G09G 2300/0814* (2013.01); *G09G 2300/0842* (2013.01); *G09G 2320/0223* (2013.01)

(56) References Cited

U.S. PATENT DOCUMENTS

| | | | |
|---|---|---|---|
| 7,294,962 | B2 | 11/2007 | Kim et al. |
| 8,877,532 | B2 | 11/2014 | Hiroki et al. |
| 8,928,018 | B2 | 1/2015 | Ikeda et al. |
| 9,412,793 | B2 | 8/2016 | Seo et al. |
| 10,033,016 | B2 | 7/2018 | Seo et al. |
| 10,418,594 | B2 | 9/2019 | Seo et al. |
| 10,862,036 | B2 | 12/2020 | Ke et al. |
| 11,968,863 | B2 | 4/2024 | Ikeda et al. |
| 11,997,904 | B2 | 5/2024 | Sugisawa et al. |
| 2002/0072139 | A1 | 6/2002 | Kashiwabara |
| 2005/0116623 | A1 | 6/2005 | Kim et al. |
| 2011/0148290 | A1 | 6/2011 | Oota |
| 2012/0252149 | A1 | 10/2012 | Hiroki et al. |
| 2012/0252150 | A1 | 10/2012 | Hiroki et al. |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto. et al. |
| 2015/0069360 | A1 | 3/2015 | Sato |
| 2015/0076476 | A1 | 3/2015 | Odaka et al. |
| 2015/0255520 | A1 | 9/2015 | Seo et al. |
| 2016/0172595 | A1 | 6/2016 | Malinowski et al. |
| 2016/0190225 | A1 | 6/2016 | Kim et al. |
| 2016/0315133 | A1 | 10/2016 | Sato |
| 2017/0033321 | A1 | 2/2017 | Seo et al. |
| 2017/0141167 | A1 | 5/2017 | Naganuma |
| 2017/0256754 | A1 | 9/2017 | Defranco et al. |
| 2018/0190908 | A1 | 7/2018 | Ke et al. |
| 2018/0226581 | A1 | 8/2018 | Chang et al. |
| 2018/0323249 | A1 | 11/2018 | Kim et al. |
| 2018/0342694 | A1 | 11/2018 | Tang |
| 2018/0351135 | A1 | 12/2018 | Seo et al. |
| 2020/0203662 | A1 | 6/2020 | Mollard et al. |
| 2021/0257581 | A1 | 8/2021 | Wang et al. |
| 2023/0016214 | A1 | 1/2023 | Yamazaki et al. |
| 2023/0269987 | A1 | 8/2023 | Nakamura et al. |
| 2024/0049543 | A1 | 2/2024 | Kusunoki et al. |

FOREIGN PATENT DOCUMENTS

| | | | |
|---|---|---|---|
| CN | 102738201 | A | 10/2012 |
| CN | 105742324 | A | 7/2016 |
| CN | 106057844 | A | 10/2016 |
| CN | 106784375 | A | 5/2017 |
| CN | 108292714 | A | 7/2018 |
| CN | 110085648 | A | 8/2019 |
| EP | 1536473 | A | 6/2005 |
| JP | 2000-036385 | A | 2/2000 |
| JP | 2003-059663 | A | 2/2003 |
| JP | 2005-327694 | A | 11/2005 |
| JP | 2006-286493 | A | 10/2006 |
| JP | 2007-273261 | A | 10/2007 |
| JP | 2008-098106 | A | 4/2008 |
| JP | 2008-147072 | A | 6/2008 |
| JP | 2008-251270 | A | 10/2008 |
| JP | 2008-288075 | A | 11/2008 |
| JP | 2010-085866 | A | 4/2010 |
| JP | 2012-216501 | A | 11/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-085969 | A | 5/2016 |
| JP | 2016-197494 | A | 11/2016 |
| JP | 2018-521459 | | 8/2018 |
| JP | 2019-133835 | A | 8/2019 |
| JP | 2019-179696 | A | 10/2019 |
| JP | 2020-021750 | A | 2/2020 |
| JP | 2020-160305 | A | 10/2020 |
| JP | 2021-036330 | A | 3/2021 |
| JP | 2021-082388 | A | 5/2021 |
| KR | 2005-0052290 | A | 6/2005 |
| KR | 2012-0112074 | A | 10/2012 |
| KR | 2012-0112075 | A | 10/2012 |
| KR | 2016-0080042 | A | 7/2016 |
| KR | 2016-0130466 | A | 11/2016 |
| KR | 2018-0021002 | A | 2/2018 |
| KR | 2019-0068814 | A | 6/2019 |
| TW | 201240077 | | 10/2012 |
| TW | 201240078 | | 10/2012 |
| TW | 201539734 | | 10/2015 |
| TW | 201705585 | | 2/2017 |
| TW | 201937725 | | 9/2019 |
| WO | WO-2015/132693 | | 9/2015 |
| WO | WO-2017/001353 | | 1/2017 |
| WO | WO-2018/119926 | | 7/2018 |
| WO | WO-2020/233525 | | 11/2020 |

OTHER PUBLICATIONS

International Search Report (Application No. PCT/IB2022/058311) Dated Nov. 29, 2022.

Written Opinion (Application No. PCT/IB2022/058311) Dated Nov. 29, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke. T et al., "Technology Developments in High-Resolution FMM-free OLED and BEOL IGZO TFTs for Power- Efficient Microdisplays", SID Digest '21 : SID International Symposium Digest of Technical Papers, May 1, 2021, vol. 52, No. 1, pp. 127-130.

(56) References Cited

OTHER PUBLICATIONS

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW'20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

DISPLAY DEVICE

CROSS REFERENCE TO RELATED APPLICATIONS

This application is a U.S. National Phase Application under 35 U.S.C. § 371 of International Application PCT/IB2022/058311, filed on Sep. 5, 2022, which is incorporated by reference and claims the benefit of a foreign priority application filed in Japan on Sep. 16, 2021, as Application No. 2021-151469.

TECHNICAL FIELD

One embodiment of the present invention relates to a display device.

Note that one embodiment of the present invention is not limited to the above technical field. Examples of the technical field of one embodiment of the present invention disclosed in this specification and the like include a semiconductor device, a light-emitting apparatus, a power storage device, a memory device, an electronic device, a lighting device, an input device, an input/output device, and a manufacturing method thereof.

BACKGROUND ART

A structure of an active matrix display device achieving high resolution has been proposed in which an upper auxiliary wiring adjacent to only a red pixel and a lower auxiliary wiring connected to the upper auxiliary wiring to control an electric resistance of a cathode electrode (upper electrode) are provided (see Patent Document 1).

As a method for manufacturing an organic EL element, a method for manufacturing an organic optoelectronic device employing standard UV photolithography is disclosed (see Non-Patent Document 1).

REFERENCES

Patent Document

[Patent Document 1] Japanese Published Patent Application No. 2010-85866

Non-Patent Document

[Non-Patent Document 1] B. Lamprecht et al., "Organic optoelectronic device fabrication using standard UV photolithography", phys. stat. sol. (RRL) 2, No. 1, pp. 16-18 (2008).

SUMMARY OF THE INVENTION

Problems to be Solved by the Invention

In the active matrix display device disclosed in Patent Document 1, the lower auxiliary wiring is formed in the same layer as a power supply line and a scan line; thus, a voltage drop of the upper electrode cannot be inhibited adequately.

It is difficult to provide a high-resolution display device by the method disclosed in Non-Patent Document 1.

In view of the above, an object of one embodiment of the present invention is to provide a display device in which a voltage drop is inhibited adequately and a method for fabricating the display device. Another object of one embodiment of the present invention is to provide a high-resolution display device and a method for fabricating the display device.

Note that the description of these objects does not preclude the existence of other objects. These objects should be construed as being independent of one another. One embodiment of the present invention only needs to achieve at least one of these objects and does not necessarily achieve all the objects. Other objects can be derived from the description of the specification, the drawings, and the claims, which are this specification and the like.

Means for Solving the Problems

In view of the above objects, one embodiment of the present invention is a display device including a first light-emitting device including a first lower electrode, a first light-emitting layer over the first lower electrode, a first charge-generation layer over the first light-emitting layer, and a second light-emitting layer over the first charge-generation layer; a first color filter overlapping with the first light-emitting device; a second light-emitting device including a second lower electrode, a third light-emitting layer over the second lower electrode, a second charge-generation layer over the third light-emitting layer, and a fourth light-emitting layer over the second charge-generation layer; a second color filter overlapping with the second light-emitting device; a common electrode in the first light-emitting device and the second light-emitting device; and an auxiliary wiring electrically connected to the common electrode. A color exhibited by a light-emitting material of the first light-emitting layer is different from a color exhibited by a light-emitting material of the second light-emitting layer. A color exhibited by a light-emitting material of the third light-emitting layer is different from a color exhibited by a light-emitting material of the fourth light-emitting layer. The auxiliary wiring includes a first wiring layer and a second wiring layer. The second wiring layer is electrically connected to the first wiring layer through a contact hole of an insulating layer. The second wiring layer has a lattice shape in atop view.

Another embodiment of the present invention is a display device including a first light-emitting device including a first lower electrode, a first light-emitting layer over the first lower electrode, a first charge-generation layer over the first light-emitting layer, and a second light-emitting layer over the first charge-generation layer; a first color filter overlapping with the first light-emitting device; a second light-emitting device including a second lower electrode, a third light-emitting layer over the second lower electrode, a second charge-generation layer over the third light-emitting layer, and a fourth light-emitting layer over the second charge-generation layer; a second color filter overlapping with the second light-emitting device; a common electrode in the first light-emitting device and the second light-emitting device; and an auxiliary wiring electrically connected to the common electrode. A color exhibited by a light-emitting material of the first light-emitting layer is different from a color exhibited by a light-emitting material of the second light-emitting layer. A color exhibited by a light-emitting material of the third light-emitting layer is different from a color exhibited by a light-emitting material of the fourth light-emitting layer. The auxiliary wiring includes a first wiring layer and a second wiring layer. The second wiring layer is electrically connected to the first wiring layer through a contact hole of an insulating layer. The first wiring layer has a lattice shape in a top view. The first lower electrode, the second lower electrode, and the second wiring layer each include a region over the insulating layer.

Another embodiment of the present invention is a display device including a first light-emitting device including a first lower electrode, a first light-emitting layer over the first lower electrode, a first charge-generation layer over the first light-emitting layer, and a second light-emitting layer over the first charge-generation layer; a first color filter overlapping with the first light-emitting device; a second light-emitting device including a second lower electrode, a third light-emitting layer over the second lower electrode, a second charge-generation layer over the third light-emitting layer, and a fourth light-emitting layer over the second charge-generation layer; a second color filter overlapping with the second light-emitting device; a common electrode in the first light-emitting device and the second light-emitting device; and an auxiliary wiring electrically connected to the common electrode. A color exhibited by a light-emitting material of the first light-emitting layer is different from a color exhibited by a light-emitting material of the second light-emitting layer. A color exhibited by a light-emitting material of the third light-emitting layer is different from a color exhibited by a light-emitting material of the fourth light-emitting layer. The auxiliary wiring includes a first wiring layer and a second wiring layer. The second wiring layer is electrically connected to the first wiring layer through a contact hole of an insulating layer. The first wiring layer and the second wiring layer each have a lattice shape in a top view. The first lower electrode, the second lower electrode, and the second wiring layer each include a region over the insulating layer. The width of the second wiring layer is smaller than the width of the first wiring layer.

In the present invention, it is preferable that the charge-generation layers each contain an inorganic compound containing lithium and oxygen.

Another embodiment of the present invention is a display device including a first light-emitting device including a first lower electrode, a first light-emitting layer over the first lower electrode, and a second light-emitting layer over the first light-emitting layer; a first color filter overlapping with the first light-emitting device; a second light-emitting device including a second lower electrode, a third light-emitting layer over the second lower electrode, and a fourth light-emitting layer over the third light-emitting layer; a second color filter overlapping with the second light-emitting device; a common electrode in the first light-emitting device and the second light-emitting device; and an auxiliary wiring electrically connected to the common electrode. A color exhibited by a light-emitting material of the first light-emitting layer is different from a color exhibited by a light-emitting material of the second light-emitting layer. A color exhibited by a light-emitting material of the third light-emitting layer is different from a color exhibited by a light-emitting material of the fourth light-emitting layer. The auxiliary wiring includes a first wiring layer and a second wiring layer. The second wiring layer is electrically connected to the first wiring layer through a contact hole of an insulating layer. The second wiring layer has a lattice shape in atop view.

Another embodiment of the present invention is a display device including a first light-emitting device including a first lower electrode, a first light-emitting layer over the first lower electrode, and a second light-emitting layer over the first light-emitting layer; a first color filter overlapping with the first light-emitting device; a second light-emitting device including a second lower electrode, a third light-emitting layer over the second lower electrode, and a fourth light-emitting layer over the third light-emitting layer; a second color filter overlapping with the second light-emitting device; a common electrode in the first light-emitting device and the second light-emitting device; and an auxiliary wiring electrically connected to the common electrode. A color exhibited by a light-emitting material of the first light-emitting layer is different from a color exhibited by a light-emitting material of the second light-emitting layer. A color exhibited by a light-emitting material of the third light-emitting layer is different from a color exhibited by a light-emitting material of the fourth light-emitting layer. The auxiliary wiring includes a first wiring layer and a second wiring layer. The second wiring layer is electrically connected to the first wiring layer through a contact hole of an insulating layer. The first wiring layer has a lattice shape in a top view. The first lower electrode, the second lower electrode, and the second wiring layer each include a region over the insulating layer.

Another embodiment of the present invention is a display device including a first light-emitting device including a first lower electrode, a first light-emitting layer over the first lower electrode, and a second light-emitting layer over the first light-emitting layer; a first color filter overlapping with the first light-emitting device; a second light-emitting device including a second lower electrode, a third light-emitting layer over the second lower electrode, and a fourth light-emitting layer over the third light-emitting layer; a second color filter overlapping with the second light-emitting device; a common electrode in the first light-emitting device and the second light-emitting device; and an auxiliary wiring electrically connected to the common electrode. A color exhibited by a light-emitting material of the first light-emitting layer is different from a color exhibited by a light-emitting material of the second light-emitting layer. A color exhibited by a light-emitting material of the third light-emitting layer is different from a color exhibited by a light-emitting material of the fourth light-emitting layer. The auxiliary wiring includes a first wiring layer and a second wiring layer. The second wiring layer is electrically connected to the first wiring layer through a contact hole of an insulating layer. The first wiring layer and the second wiring layer each have a lattice shape in a top view. The first lower electrode, the second lower electrode, and the second wiring layer each include a region over the insulating layer. The width of the second wiring layer is smaller than the width of the first wiring layer.

In the present invention, end portions of the first lower electrode and the second lower electrode each preferably have a tapered shape.

In the present invention, a taper angle of an end surface of an organic compound layer including the first light-emitting layer and the second light-emitting layer is preferably greater than or equal to 450 and less than 90°.

In the present invention, a taper angle of an end surface of an organic compound layer including the third light-emitting layer and the fourth light-emitting layer is preferably greater than or equal to 450 and less than 90°.

Effect of the Invention

According to one embodiment of the present invention, it is possible to provide a display device in which a voltage drop is inhibited adequately and a method for fabricating the display device. According to another embodiment of the present invention, a high-resolution display device and a method for fabricating the display device can be provided.

Note that the description of these effects does not preclude the existence of other effects. These effects should be construed as being independent of one another. One embodiment of the present invention only needs to have at least one of these effects and does not necessarily have all the effects. Other effects can be derived from the description of the specification, the drawings, and the claims, which are this specification and the like.

BRIEF DESCRIPTION OF THE DRAWINGS

FIG. 1B1 to FIG. 1C2 are top views of the pixel portion.

FIG. 2B1 to FIG. 2C2 are top views of the pixel portion.

MODE FOR CARRYING OUT THE INVENTION

Figure 1A:
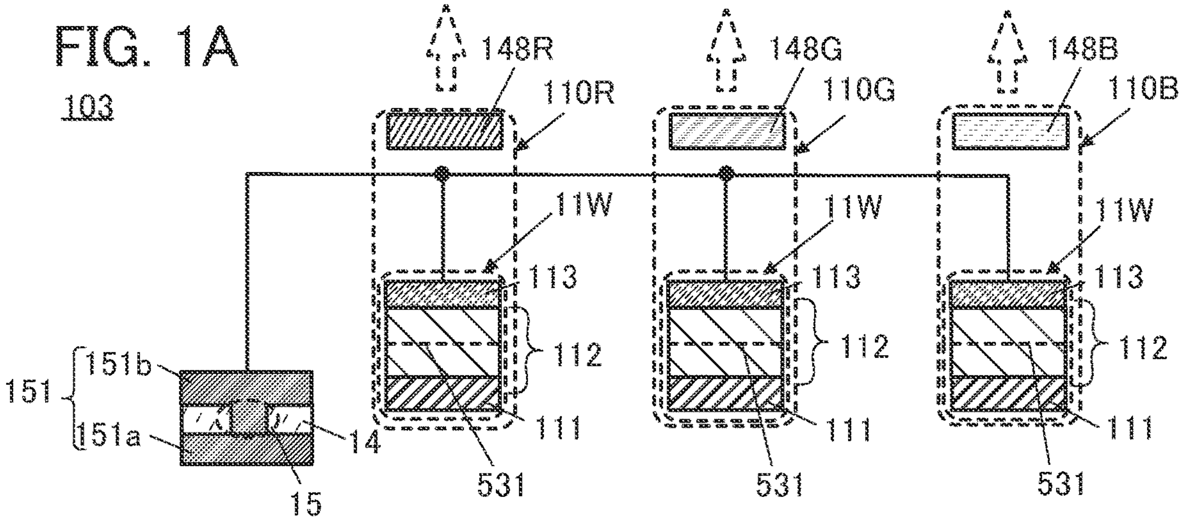
FIG. 1A is a conceptual diagram of a pixel portion including an auxiliary wiring.
Figure 1A:
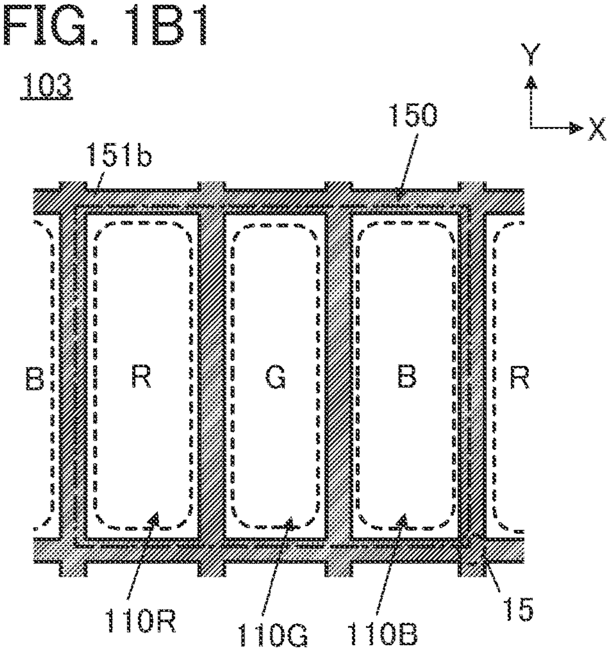
Figure 1A:
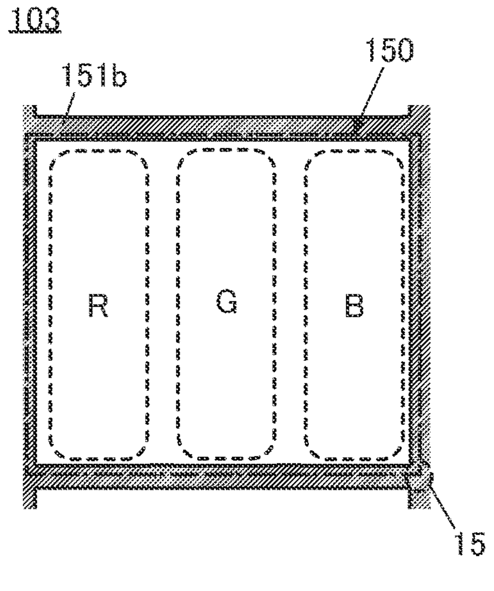
Figure 1A:
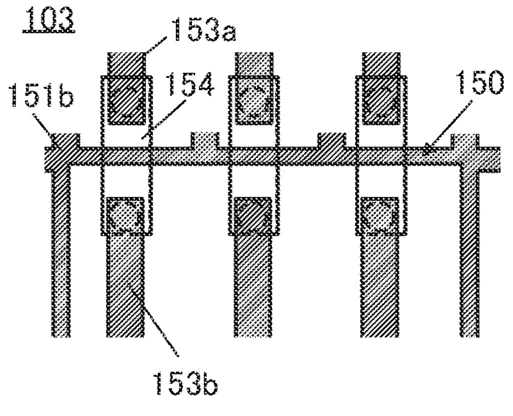
Figure 1A:
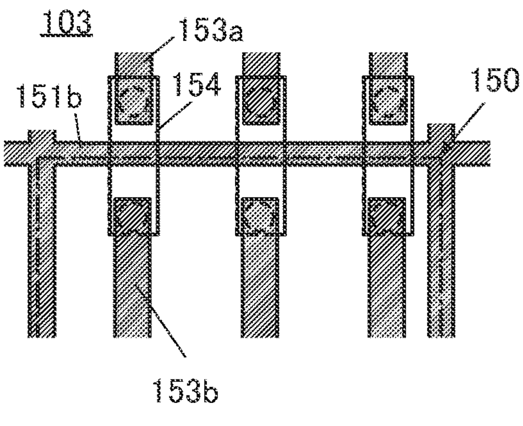

In this specification and the like, components are classified based on their functions and the components are described using independent blocks in a diagram in some cases; however, it is difficult to classify actual components based on their functions, and one component may have a plurality of functions.

In this specification and the like, the terms “source” and “drain” of a transistor interchange with each other depending on the polarity of the transistor or the levels of potentials applied to the terminals. In general, in an n-channel transistor, a terminal to which a lower potential is supplied is called a source, and a terminal to which a higher potential is supplied is called a drain. In a p-channel transistor, a terminal to which a lower potential is supplied is called a drain, and a terminal to which a higher potential is supplied is called a source. Although the names of the source and the drain sometimes interchange with each other in reality depending on the above-described relationship of potentials, a source and a drain are fixed for convenience in the description of the connection relationship of a transistor in this specification and the like.

In this specification and the like, a source of a transistor means a source region that is part of a semiconductor layer functioning as an active layer or means a source electrode connected to the source region. Similarly, a drain of a transistor means a drain region that is part of the semiconductor film or a drain electrode connected to the drain region. Moreover, a gate of a transistor means a gate electrode.

In this specification and the like, a state where transistors are connected in series means, for example, a state where only one of a source and a drain of a first transistor is connected to only one of a source and a drain of a second transistor. In addition, a state where transistors are connected in parallel means a state where one of a source and a drain of a first transistor is connected to one of a source and a drain of a second transistor and the other of the source and the drain of the first transistor is connected to the other of the source and the drain of the second transistor.

In this specification and the like, connection is sometimes referred to as electrical connection and includes a state where current, voltage, or a potential can be supplied or transmitted. Accordingly, connection includes connection via an element such as a wiring, a resistor, a diode, or a transistor. Electrical connection includes direct connection without via an element such as a wiring, a resistor, a diode, or a transistor.

In this specification and the like, a first electrode and a second electrode are used for description of a source and a drain of a transistor in some cases; when one of the first electrode and the second electrode refers to a source, the other thereof refers to a drain.

In this specification and the like, a conductive layer sometimes has a plurality of functions such as those of a wiring and an electrode.

In this specification and the like, a light-emitting device is referred to as a light-emitting element in some cases. A light-emitting device has a structure in which an organic compound layer is sandwiched between a pair of electrodes. One of the pair of electrodes is an anode, the other of the pair of electrodes is a cathode, the organic compound layer is a stack of functional layers, and at least one of the functional layers is a light-emitting layer. The pair of electrodes are referred to as a lower electrode and an upper electrode in some cases; the lower electrode can function as one of an anode and a cathode and the upper electrode can function as the other of the anode and the cathode.

In this specification and the like, a light-emitting device including an organic compound layer formed using a metal mask (MM) is sometimes referred to as a light-emitting device having a metal mask (MM) structure.

In this specification and the like, a metal mask is sometimes referred to as a fine metal mask (FMM or a high-resolution metal mask) depending on the minuteness of its opening portions.

In this specification and the like, a light-emitting device including an organic compound layer formed without using a metal mask or a fine metal mask is sometimes referred to as a light-emitting device having a metal maskless (MML) structure.

In this specification and the like, light-emitting devices exhibiting, for example, red, green, and blue are sometimes referred to as a red-light-emitting device, a green-light-emitting device, and a blue-light-emitting device, respectively. Fabrication of a red-light-emitting device, a green-light-emitting device, and a blue-light-emitting device enables a full-color display device to be provided.

In this specification and the like, a light-emitting device emitting white light is sometimes referred to as a white-light-emitting device. Note that a combination of white-light-emitting devices with coloring layers (e.g., color filters or color conversion layers) enables a full-color display device to be provided.

In this specification and the like, a structure in which light-emitting layers of light-emitting devices of different colors are separately formed is sometimes referred to as an SBS (Side By Side) structure. For example, a red-light-emitting device, a green-light-emitting device, and a blue-light-emitting device can be fabricated using an SBS structure.

Light-emitting devices can be classified roughly into a single structure and a tandem structure. A single structure is a structure including one light-emitting unit between a pair of electrodes. The light-emitting unit is an organic compound layer including one or more light-emitting layers and refers to a stack of layers.

A white-light-emitting device with a single structure can be obtained when one light-emitting unit includes two or more light-emitting layers and the emission colors of the two or more light-emitting layers are complementary colors. The two or more light-emitting layers may be in contact with each other in the light-emitting unit. A white-light-emitting device can also be obtained when a light-emitting unit includes three or more light-emitting layers and the emission colors are complementary colors. The three or more light-emitting layers may be in contact with each other in the light-emitting unit.

A tandem structure is a structure including two or more light-emitting units between a pair of electrodes. Each of the two or more light-emitting units is an organic compound layer including one or more light-emitting layers and refers to a stack of layers. In the tandem structure, providing a charge-generation layer or the like between the plurality of light-emitting units is suitable. Note that the charge-generation layer has a function of injecting holes into one of the light-emitting units that is formed in contact with the charge-generation layer and a function of injecting electrons into the other light-emitting unit, when voltage is applied between a cathode and an anode. For example, the tandem structure is preferably a structure in which a first light-emitting unit, a charge-generation layer, and a second light-emitting unit are provided between a pair of electrodes and the charge-generation layer injects holes into the first light-emitting unit and injects electrons into the second light-emitting unit.

In order to obtain a white-light-emitting device with a tandem structure, the light-emitting device is configured to obtain white light emission by combining light from light-emitting layers of two or more light-emitting units. In the combination of light-emitting layers capable of white light emission, light of complementary colors is emitted as in the single structure.

When the white-light-emitting device and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is suitable in terms of lower manufacturing cost or higher manufacturing yield because the manufacturing process of the white-light-emitting device is simpler than that of the light-emitting device having an SBS structure.

A light-emitting layer contains a light-emitting material, and examples of the light-emitting material include a fluorescent material and a phosphorescent material.

In this specification and the like, a structure in which a connector such as an FPC (Flexible Printed Circuit) or a TCP (Tape Carrier Package) is attached to a substrate of a display panel, or a structure in which an IC is mounted on a substrate by a COG (Chip On Glass) method or the like is referred to as a display module in some cases. Thus, the display module is one embodiment of a display device.

Next, embodiments will be described in detail with reference to the drawings. Note that the present invention is not limited to the following description, and it will be readily understood by those skilled in the art that modes and details of the present invention can be modified in various ways without departing from the spirit and scope of the present invention. Thus, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, a structure example of a display device of one embodiment of the present invention will be described.

<Function of Auxiliary Wiring>

The display device of one embodiment of the present invention includes an auxiliary wiring. The auxiliary wiring refers to a layer having an auxiliary function for a main electrode, and an example of the auxiliary function is a function of inhibiting a voltage drop caused by the main electrode. An example of the main electrode is a pair of electrodes of a light-emitting device. The pair of electrodes have functions of a cathode and an anode of the light-emitting device and thus are formed using conductive materials having work functions suitable for the cathode and the anode; however, the conductive materials selected on the basis of the work functions sometimes have high resistivity. Hence, in the display device of one embodiment of the present invention, the auxiliary wiring is electrically connected to one of the pair of electrodes to inhibit a voltage drop adequately. The resistivity of a conductive material contained in the auxiliary wiring is lower than the resistivities of the conductive materials contained in the main electrode.

One of the pair of electrodes, e.g., an upper electrode, can be a continuous layer without being divided between a plurality of light-emitting devices. A continuous layer is referred to as a common layer and a continuous electrode is referred to as a common electrode in some cases. The area of a common electrode becomes larger as the size of a display device increases and accordingly a voltage drop is more likely to occur. Hence, in the display device of one embodiment of the present invention, the auxiliary wiring is electrically connected to one of the pair of electrodes to inhibit a voltage drop adequately.

Note that the auxiliary wiring is sometimes referred to as an auxiliary electrode according to its shape; in this specification and the like, description is made using the term "auxiliary wiring" regardless of its shape.

FIG. TA is a conceptual diagram of a pixel portion 103 included in the display device of one embodiment of the present invention.

<Light-Emitting Device and Color Filter>

The pixel portion 103 includes light-emitting devices 11W and color filters 148 (denoted as 148R, 148G, and 148B in the drawing) in addition to an auxiliary wiring 151. Each of the light-emitting devices 11W has a structure in which at least a lower electrode 111, an organic compound layer 112, and an upper electrode 113 are stacked in this order.

The organic compound layer 112 includes at least two or more light-emitting layers. It is further preferable that the light-emitting device 11W include, in addition to the organic compound layer 112, a charge-generation layer 531 positioned between the light-emitting layers. In FIG. TA, the charge-generation layer 531 is shown by a dotted line.

Each of the light-emitting layers is a layer containing a light-emitting material (also referred to as a light-emitting substance) and can contain one or more light-emitting substances. The light-emitting device 11W may include, as the organic compound layer, a functional layer other than the light-emitting layer. The light-emitting layer, the functional layer other than the light-emitting layer, and the like will be described later.

In the case of light-emitting devices that emit white light or the like (the light-emitting devices that emit white light are referred to as white-light-emitting devices), all the layers including the light-emitting layer in the organic compound layer 112 can be shared by the light-emitting devices. The organic compound layer shared by the light-emitting devices is sometimes referred to as a common layer.

When a common layer is formed in the pixel portion 103, a mask is used to determine a region where the common layer is formed, and such a mask is referred to as an area mask or a rough metal mask. All the layers including a light-emitting layer in an organic compound layer in a white-light-emitting device can be formed by an evaporation method or the like using the area mask or the rough metal mask.

Such a white-light-emitting device can employ a simpler manufacturing process than a light-emitting device with an SBS structure in which light-emitting layers are separately formed; thus, the manufacturing cost can be reduced or the manufacturing yield can be increased.

An organic compound layer for obtaining a white-light-emitting device can employ a tandem structure. As described above, the tandem structure includes two or more light-emitting units, a charge-generation layer is suitably positioned between the light-emitting units, and each of the light-emitting units includes one or more light-emitting layers. In the case where the light-emitting unit includes two light-emitting layers, a color exhibited by a first light-emitting material contained in a first light-emitting layer can be different from a color exhibited by a second light-emitting material contained in a second light-emitting layer, so that a white-light-emitting device having a tandem structure can be obtained.

In order to obtain a white-light-emitting device, a light-emitting device with a single structure may be used. As described above, the single structure includes one light-emitting unit including two or more light-emitting layers and does not require a charge-generation layer. For example, in the case where the number of two or more light-emitting layers is two, a color exhibited by a first light-emitting material contained in a first light-emitting layer can be different from a color exhibited by a second light-emitting material contained in a second light-emitting layer, so that a white-light-emitting device having a single structure can be obtained.

As described above, a white-light-emitting device includes a common layer. However, a white-light-emitting device may have, instead of a common layer, a structure in which an organic compound layer corresponding to a common layer is divided. The division is preferably performed by a lithography method or the like. As the lithography method, a photolithography method can be employed. Photolithography is a method in which light exposure is performed on a photosensitive substance to draw a desired pattern thereon and then a pattern is formed from an exposed portion and a non-exposed portion. As the light exposure, reduction exposure with use of a stepper can be employed.

Division performed by a photolithography method or the like may be referred to as patterning or simply as processing. The end surface of the organic compound layer 112 processed by a photolithography method rises perpendicularly or substantially perpendicularly from a formation surface such as a substrate in many cases, and a taper angle of the end surface of the organic compound layer 112 can be greater than or equal to 45° and less than 90°. That is, the outline of the organic compound layer 112 does not expand. Since the organic compound layer 112 is a stack of layers, the taper angle can be regarded as an angle formed by the formation surface and a line passing from the upper edge of the uppermost layer to the lower edge of the lowest layer in the stack. Note that in this specification and the like, an end surface includes a side surface in a cross-sectional view and a taper angle of the side surface can be greater than or equal to 45° and less than 90°.

Note that in this specification and the like, the taper angle refers to an inclination angle formed by the side surface and the bottom surface of a specific layer when the layer is observed from the direction perpendicular to the cross section (e.g., the plane perpendicular to the surface of the substrate). In the case where the bottom surface is unclear, an inclination angle can be determined using the surface of the substrate.

The distance between the organic compound layers 112 processed by a photolithography method can be less than or equal to 5 μm, less than or equal to 1 μm, less than or equal to 500 nm, less than or equal to 200 nm, less than or equal to 100 nm, or less than or equal to 50 nm. Since the organic compound layers are stacks of layers, the distance can be regarded as the distance between the lower edges of the lowest layers in the stacks.

Meanwhile, by a method in which the organic compound layer is patterned with the use of a fine metal mask in vacuum evaporation, it is difficult to shorten the distance between the organic compound layers. Typically, making the distance between the adjacent organic compound layers less than or equal to 10 μm is difficult with the use of a fine metal mask.

Although a common layer can be used in a white-light-emitting device, a light-emitting device including an organic compound layer intentionally divided by a photolithography method is preferably used. This is because the distance between the organic compounds can be minimized. Note that a method for fabricating a light-emitting device that involves a photolithography method or the like will be described later.

A light-emitting device including an organic compound layer divided by a photolithography method is referred to as a light-emitting device having an MML structure. The use of the MML structure enables a common electrode and an auxiliary wiring to be electrically connected to each other at any position. Specifically, a contact hole where the common electrode and the auxiliary wiring are electrically connected to each other can be provided between white-light-emitting devices. This allows the auxiliary wiring to inhibit a voltage drop effectively.

In order to perform full-color display using white-light-emitting devices, a color filter method can be employed. Specifically, the above-described color filters 148 (denoted as 148R, 148G, and 148B in the drawing) are placed to overlap with the light-emitting devices 11W. Structures including the color filters 148 and the light-emitting devices 11W may be referred to as subpixels 110 (denoted as 110R, 110G, and 110B in the drawing).

In FIG. 1A, as the color filters 148, the red color filter 148R that transmits light in a red wavelength range, the green color filter 148G that transmits light in a green wavelength range, and the blue color filter 148B that transmits light in a blue wavelength range are used. The light-emitting devices can emit red, green, and blue light in the direction of arrows through the color filters 148.

A color filter can be called a coloring layer that transmits light in a specific wavelength range. Transmitting light in a specific wavelength range refers to a state where light transmitted through a color filter has a peak at the wavelength corresponding to at least the specific color.

The color filters can be formed in desired positions using any of various materials such as a chromatic light-transmitting resin by a printing method, an ink-jet method, an etching method using a photolithography method, or the like. As the chromatic light-transmitting resin, a photosensitive or non-photosensitive organic resin can be used, and a photosensitive organic resin is preferably used because the number of resist masks used in the etching can be reduced and the process can be accordingly simplified.

Chromatic colors are colors except achromatic colors such as black, gray, and white; specifically, red, green, blue, and the like can be used. The colors of the color filters may be cyan, magenta, yellow, and the like.

The thickness of each of the color filters can be greater than or equal to 500 nm and less than or equal to 5 μm.

The use of the color filters can eliminate the need for an optical element such as a circularly polarizing plate or a polarizing plate. Eliminating the need for the optical element is preferable, in which case a display device can be lightweight or thin.

<Upper Electrode and Common Electrode>

Since the MML structure is employed, the upper electrodes 113 are divided between the light-emitting devices and included in the respective light-emitting devices. FIG. 1A illustrates the upper electrodes divided. The upper electrodes are not necessarily divided between the light-emitting devices and may be provided as a continuous electrode, i.e., a common electrode.

In this embodiment, the upper electrodes are used as the main electrode and the auxiliary wiring 151 is electrically connected to the upper electrodes. This state is shown by solid lines in FIG. 1A as in a circuit diagram. Voltage drops of the upper electrodes 113 to which the auxiliary wiring 151 is electrically connected are adequately inhibited.

Note that the effect of the auxiliary wiring 151 can be understood by those skilled in the art of this specification and the like also when the upper electrodes are replaced with a common electrode.

<Feature of Auxiliary Wiring>

The auxiliary wiring 151 of one embodiment of the present invention includes two or more wiring layers provided in different layers. The auxiliary wiring 151 includes a first wiring layer 151*a* and a second wiring layer 151*b* as illustrated in FIG. 1A, for example. The first wiring layer 151*a* is formed in a layer different from that of the second wiring layer 151*b*, and the formation surface of the first wiring layer 151*a* is different from the formation surface of the second wiring layer 151*b*. Wiring layers whose formation surfaces are different from each other are referred to as wiring layers provided in different layers.

Note that the wiring layer is sometimes referred to as an electrode layer according to its shape; in this specification and the like, description is made using the term "wiring layer" regardless of its shape.

In order to make the first wiring layer 151*a* and the second wiring layer 151*b* function as the auxiliary wiring 151, the first wiring layer 151*a* is electrically connected to the second wiring 151*b* layer through a contact hole 15 of an insulating layer 14 positioned between the first wiring layer 151*a* and the second wiring layer 151*b*.

As the auxiliary wiring, a multilayered wiring layer including three or more layers, e.g., a first wiring layer to a third wiring layer, may be provided. As the number of stacked layers in the multilayered wiring layer increases, the auxiliary wiring is more easily placed (hereinafter, sometimes referred to as laid out). For example, one wiring layer of the multilayered wiring layer can be laid out in a layer different from that of the lower electrode. In that case, the one wiring layer can have a region overlapping with the lower electrode; thus, the auxiliary wiring can have a larger area than a conventional auxiliary wiring. The auxiliary wiring including such a wiring layer is preferable because it can inhibit a voltage drop adequately. The auxiliary wiring including such a wiring layer is preferable also because even when one wiring layer of the multilayered wiring layer is restricted by the layout of electrodes such as an anode, the other wiring layers are not subjected to the restriction. Since there is no layout restriction, the multilayered wiring layer can inhibit a voltage drop adequately and thus is preferable.

As illustrated in FIG. 1B1, the second wiring layer 151*b* can be formed to have a lattice shape in atop view. Like the second wiring layer 151*b*, the first wiring layer 151*a* can be formed to have a lattice shape in a top view.

As described above, the feature of the auxiliary wiring 151 of one embodiment of the present invention is including the multilayered wiring layer, specifically, including two or more wiring layers provided in different layers. The wiring layers positioned in different layers are electrically connected to each other through the contact hole and can function as the auxiliary wiring 151. In addition, the multilayered wiring layer is subjected to little layout restriction and thus is suitable as the auxiliary wiring.

<Contact Hole>

A contact hole refers to an opening formed in an insulating layer and enables a wiring layer positioned below the insulating layer (referred to as a lower wiring layer) to be electrically connected to a wiring layer positioned above the insulating layer (referred to as an upper wiring layer). For the electrical connection, the lower wiring layer includes a region exposed in the opening, and the upper wiring layer includes a region positioned in the opening in a cross-sectional view.

In the display device of one embodiment of the present invention, an insulating layer provided with a contact hole may be an insulating layer having a stacked-layer structure (referred to as a stacked-layer insulating layer). For example, in the case where a contact hole is formed in a stacked-layer insulating layer in which a first insulating layer and a second insulating layer are stacked, a first contact hole is formed in the first insulating layer and a second contact hole is formed in the second insulating layer. In that case, the first contact hole has a region overlapping with at least the second contact hole so that the lower wiring layer can be electrically connected to the upper wiring layer. In the case where the second insulating layer is positioned over the first insulating layer, for example, the width of the second contact hole is preferably larger than the width of the first contact hole in a cross-sectional view; however, the widths of the contact holes in the insulating layers are not particularly limited as long as the lower wiring layer can be electrically connected to the upper wiring layer.

Since the auxiliary wiring 151 of one embodiment of the present invention includes the first wiring layer 151*a* and the second wiring layer 151*b*, even when one of the first wiring layer and the second wiring layer is positioned in the same layer as the lower electrode, the other of the first wiring layer and the second wiring layer is positioned in a layer different from that of the lower electrode, in which case the auxiliary wiring 151 can be laid out without being affected by the layout of the lower electrode. It is sometimes difficult to lay out an auxiliary wiring in a high-density pixel portion because of a short distance between lower electrodes; however, the auxiliary wiring 151 can be laid out with little or no influence of the layout of the lower electrode, and the auxiliary wiring 151 can adequately inhibit a voltage drop of the upper electrode.

In order to avoid the influence of the layout of the lower electrode, both the first wiring layer 151*a* and the second wiring layer 151*b* are preferably formed in layers different from the layer of the lower electrode.

In order to reduce the influence of the layout of the lower electrode when the second wiring layer 151*b* is positioned over the first wiring layer 151*a* and the second wiring layer includes the same conductive layer as the lower electrode, the second wiring layer 151*b* with a small area is formed and the first wiring layer 151*a* electrically connected to the second wiring layer 151*b* is laid out. This structure is preferable because the first wiring layer 151*a* and the lower electrode are positioned in different layers and thus the layout flexibility is high.

The auxiliary wiring 151 of one embodiment of the present invention can be laid out without being affected by the layout of the lower electrode. In FIG. TA, the first wiring layer 151*a* and the second wiring layer 151*b* are formed in layers different from the layer of the lower electrode 111 so as not to be affected by the layout of the lower electrode. Furthermore, the first wiring layer 151*a* and the second wiring layer 151*b* are preferably positioned below the lower electrode 111.

The first wiring layer 151*a* and the second wiring layer 151*b* provided in different layers can have different shapes in a top view. For example, the second wiring layer 151*b* can have a lattice shape, and the first wiring layer 151*a* can have a band shape. Alternatively, the first wiring layer 151*a* can have a lattice shape, and the second wiring layer 151*b* can have a band shape. A lattice is one pattern in which a plurality of vertical lines arranged in parallel are combined with a plurality of horizontal lines arranged in parallel. A band shape is sometimes referred to as a rectangular shape or a stripe shape.

FIG. 1B1 and FIG. 1B2 are top views of the pixel portion 103 each illustrating a state where the second wiring layer 151*b* has a lattice shape. Although not illustrated, the first wiring layer 151*a* is electrically connected to the second wiring layer 151*b* through the contact hole 15. The first wiring layer 151*a* may have a band shape and is preferably laid out in a region overlapping with part of the second wiring layer 151*b*. Note that the first wiring layer 151*a* is not limited to having a band shape and may have any shape.

In FIG. 1B1 and FIG. 1B2, the X direction and the Y direction intersecting with the X direction are indicated, and a layout or the like of a structure of the pixel portion 103 is described using the directions in some cases.

The second wiring layer 151*b* illustrated in FIG. 1B1 has a lattice shape including a plurality of vertical lines having regions overlapping with gaps between the subpixels. The gaps between the subpixels include a region between the end of the lower electrode 111 of the subpixel 110R and the end of the lower electrode 111 of the subpixel 110G and a region between the end of the lower electrode 111 of the subpixel 110G and the end of the lower electrode 111 of the subpixel 110B.

The second wiring layer 151*b* illustrated in FIG. 1B2 has a lattice shape including a plurality of vertical lines having regions overlapping with gaps between pixels 150. The gaps between the pixels 150 include, for example, a region between the end of the lower electrode 111 of the subpixel 110B positioned at the end of one pixel 150 and the end of the lower electrode 111 of the subpixel 110R positioned at the end of the adjacent pixel. The pixels may be adjacent to each other in either the X direction or the Y direction. The second wiring layer 151*b* illustrated in FIG. 1B2 does not include the plurality of vertical lines having the regions overlapping with the gaps between the subpixels, which are illustrated in FIG. 1B1.

It is preferable that wirings functioning as a scan line, a signal line, a power supply line, and the like not be provided in the same layer as the second wiring layer having a lattice shape. The wirings having the above functions need to extend in the X direction or the Y direction and thus cause a short circuit with the second wiring layer 151*b* having a lattice shape. Accordingly, in the case where the second wiring layer having a lattice shape is provided as the auxiliary wiring, it is preferable that the wirings functioning as a scan line, a signal line, a power supply line, and the like not be provided in the same layer as the second wiring layer. In the case where a scan line, a signal line, and a power supply line are to be provided, the lengths of the scan line, the signal line, the power supply line, and the like in the X direction or the Y-axis direction are adjusted such that a short circuit with the second wiring layer can be prevented.

In the case where the lengths in the X direction or the Y-axis direction are adjusted, electrical connection is obtained in a conductive layer different from that of the second wiring layer. A wiring for obtaining electrical connection is sometimes referred to as a bridge wiring. A bridge wiring is sometimes referred to as a bridge electrode according to its shape; in this specification and the like, description is made using the term "bridge wiring".

FIG. 1C1 and FIG. 1C2 illustrate the pixel portion 103 including a signal line and a bridge wiring. Since the light-emitting device 11W is not illustrated in FIG. 1C1 and FIG. 1C2, refer to FIG. 1B1 and FIG. 1B2 for the layout or the like of the light-emitting device 11W.

The signal line illustrated in FIG. 1C1 and FIG. 1C2 includes a third wiring layer 153*a* and a fourth wiring layer 153*b*, and the third wiring layer 153*a* and the fourth wiring layer 153*b* are separated from each other. Thus, the third wiring layer 153*a* and the fourth wiring layer 153*b* are electrically connected to each other using a bridge wiring 154. The third wiring layer 153*a* and the fourth wiring layer 153*b* include a conductive layer in the same layer as the second wiring layer 151*b*. The bridge wiring 154 includes a conductive layer in a layer different from that of the second wiring layer 151*b* and preferably includes a conductive layer in a layer below the second wiring layer 151*b*.

In the case where a scan line or a power supply line as well as the signal line is formed using a conductive layer in the same layer as the second wiring layer 151*b*, electrical connection can be obtained with the bridge wiring 154 or the like.

In a display device with a higher aperture ratio or higher resolution, a narrow gap between lower electrodes makes it difficult to lay out an auxiliary wiring in the gap between the lower electrodes. The gap between the lower electrodes is, for example, a distance between the end of the lower electrode 111 of the subpixel 110R and the end of the lower electrode 111 of the subpixel 110G or a distance between the end of the lower electrode 111 of the subpixel 110G and the end of the lower electrode 111 of the pixel 110B. Thus, in the case where the second wiring layer 151*b* and the lower electrode 111 are positioned in the same layer, a display device with higher resolution preferably employs the layout of the second wiring layer illustrated in FIG. 1B2.

The layout of the second wiring layer illustrated in FIG. 1B2 is preferable because the conductive layers can be easily laid out in the pixel portion 103 including the signal line and the bridge wiring illustrated in FIG. 1C2.

Figure 2A:
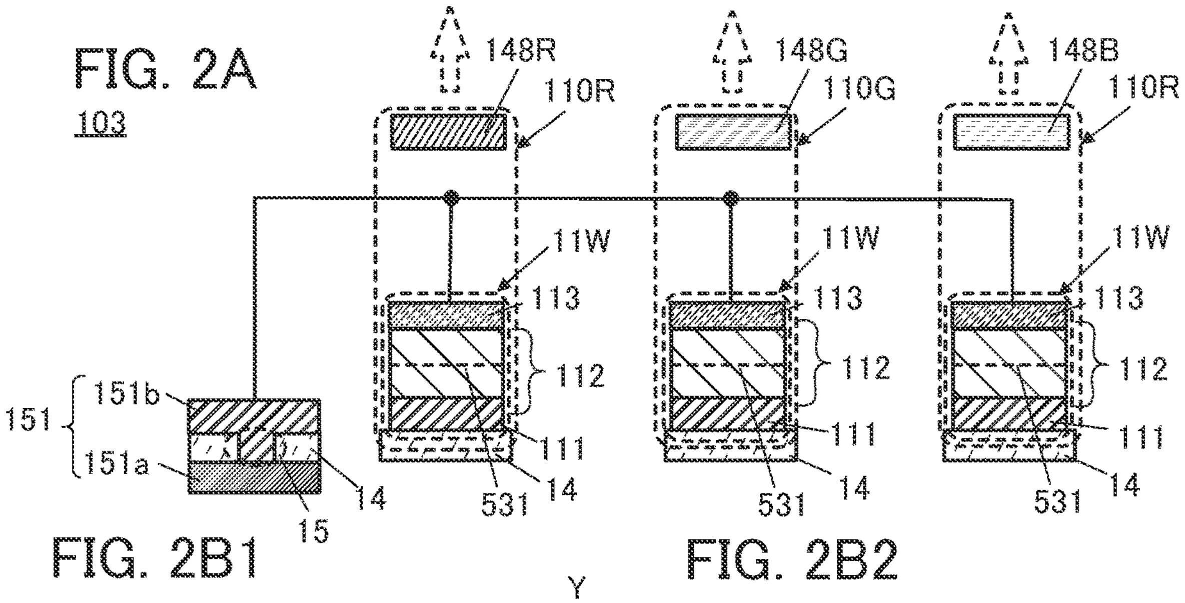
FIG. 2A is a conceptual diagram of a pixel portion including an auxiliary wiring.
Figure 2A:
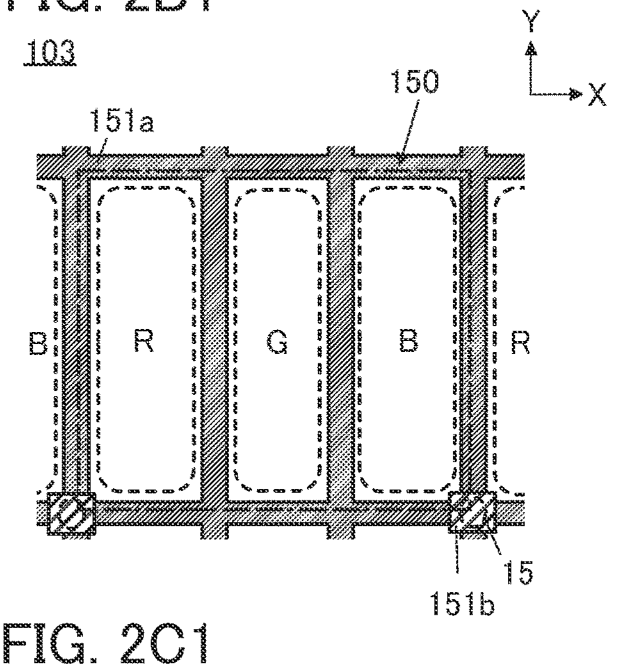
Figure 2A:
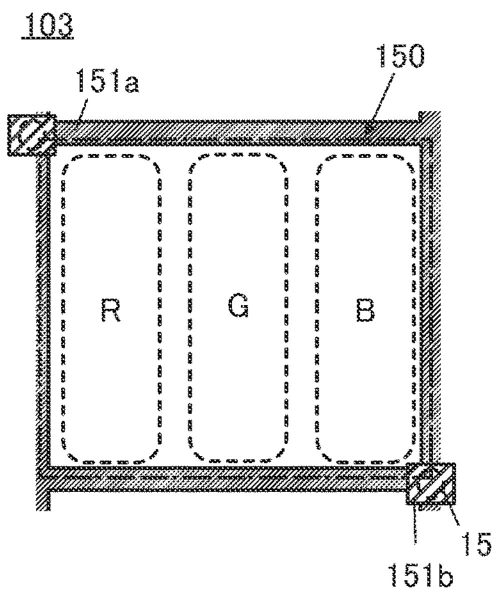
Figure 2A:
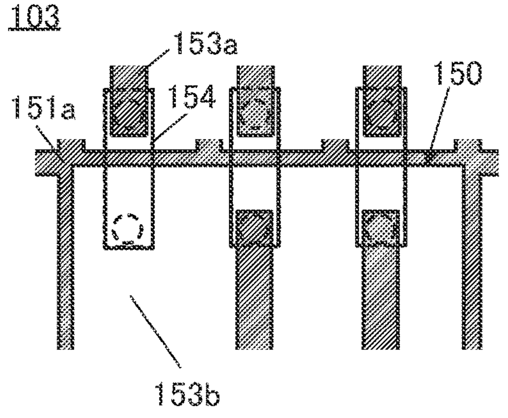
Figure 2A:
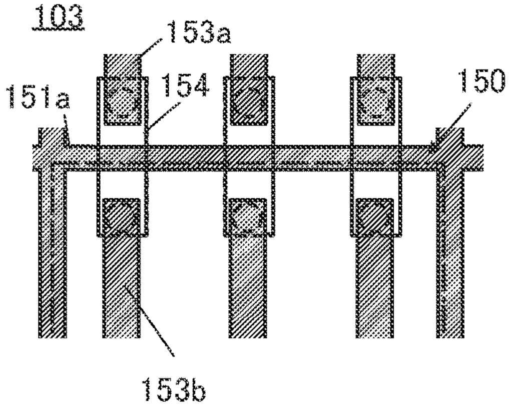

FIG. 2A illustrates another mode of the pixel portion 103 of one embodiment of the present invention. In FIG. 2A, the second wiring layer 151*b* is positioned on the same formation surface as the lower electrode 111. Note that the same formation surface corresponds to the top surface of the insulating layer 14. The other components can be the same as those in FIG. 1A.

FIG. 2B1 and FIG. 2B2 are top views of the pixel portion 103 each illustrating a state where the first wiring layer 151*a* has a lattice shape. For the layout of a lattice shape, refer to the layout of the second wiring layer 151*b* having a lattice shape illustrated in FIG. 1B1 and FIG. 1B2.

In the contact hole 15 illustrated in FIG. 2B1 and FIG. 2B2, the second wiring layer 151*b* is positioned to overlap with an intersection in the lattice shape of the first wiring layer 151*a*. The second wiring layer 151*b* overlaps with the intersection but does not need to overlap with the entire side of the first wiring layer 151*a* having a lattice shape. The second wiring layer 151*b* does not necessarily overlap with all the intersections in the lattice shape of the first wiring layer 151*a*. Since the second wiring layer 151*b* includes the same conductive layer as the lower electrode 111, the second wiring layer 151*b* needs to be laid out so as not to be in contact with the lower electrode 111; however, the first wiring layer 151*a* can adequately inhibit a voltage drop. The second wiring layer 151*b* laid out to have a small area is preferably referred to as an electrode layer in some cases.

FIG. 2C1 and FIG. 2C2 illustrate the pixel portion 103 including the signal line and the bridge wiring. The signal line illustrated in FIG. 2C1 and FIG. 2C2 includes the third wiring layer 153*a* and the fourth wiring layer 153*b*, and the third wiring layer 153*a* and the fourth wiring layer 153*b* are separated from each other. Thus, the third wiring layer 153*a* and the fourth wiring layer 153*b* are electrically connected to each other using the bridge wiring 154. The third wiring layer 153*a* and the fourth wiring layer 153*b* include a conductive layer in the same layer as the first wiring layer 151*a*. The bridge wiring 154 includes a conductive layer in a layer different from that of the first wiring layer 151*a* and preferably includes a conductive layer in a layer below the first wiring layer 151*a*.

For the bridge wiring 154, a conductive layer in the same layer as the second wiring layer 151*b* may be used. In that case, the lower electrode 111 and the bridge wiring 154 are laid out so as not to be in contact with each other.

Figure 3A:
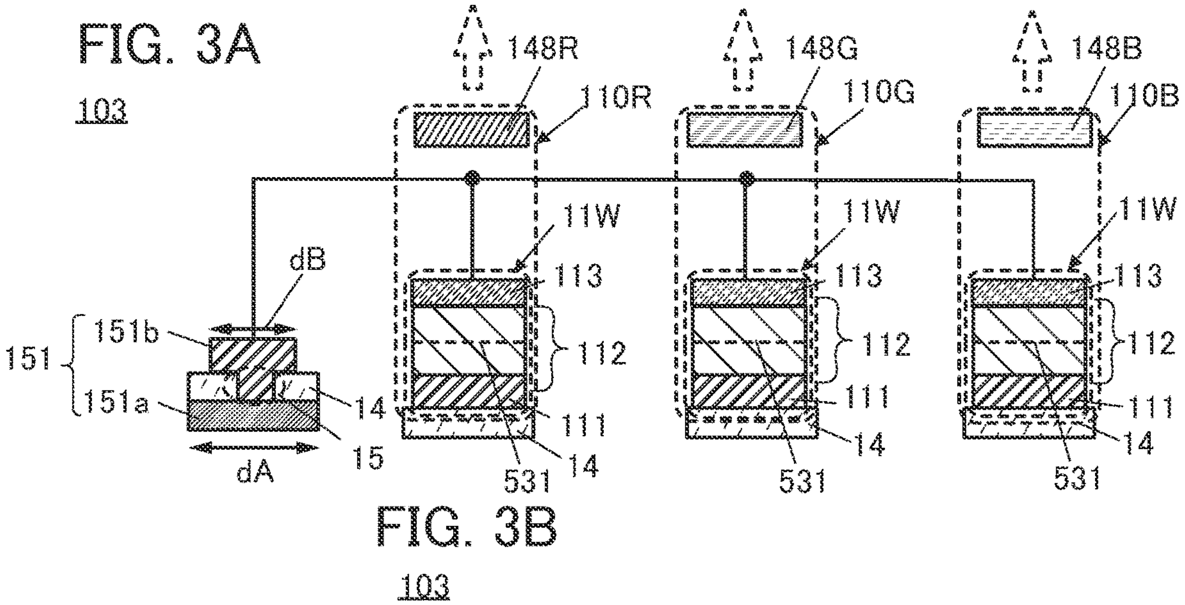
FIG. 3A is a conceptual diagram of a pixel portion including an auxiliary wiring.

FIG. 3A illustrates another mode of the pixel portion 103 of one embodiment of the present invention. FIG. 3A is different from FIG. 2A in that the width of the second wiring layer 151*b* (a width denoted by dB) is smaller than the width of the first wiring layer 151*a* (a width denoted by dA) in a cross-sectional view. The other components can be the same as those in FIG. 2A.

Figure 3B:
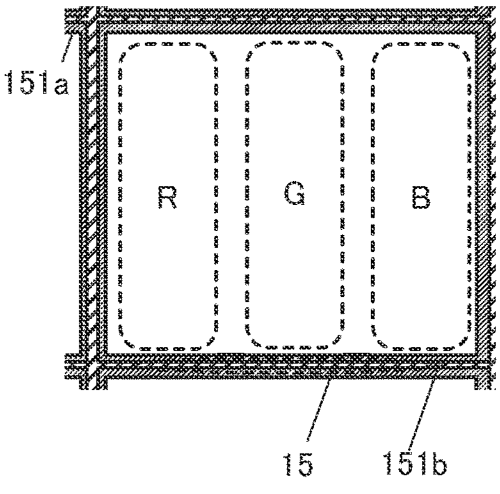
FIG. 3B and FIG. 3C are top views of the pixel portion.

FIG. 3B is a top view of the pixel portion 103 that illustrates a state where the first wiring layer 151*a* and the second wiring layer 151*b* each have a lattice shape. For the layout of a lattice shape, refer to the layout of the second wiring layer 151*b* having a lattice shape illustrated in FIG. 1B2.

The contact hole 15 illustrated in FIG. 3B can have a shape that fits with a region where the first wiring layer 151*a* and the second wiring layer 151*b* overlap with each other. For example, the contact hole 15 can have a shape along one side of the second wiring layer 151*b*.

Figure 3C:
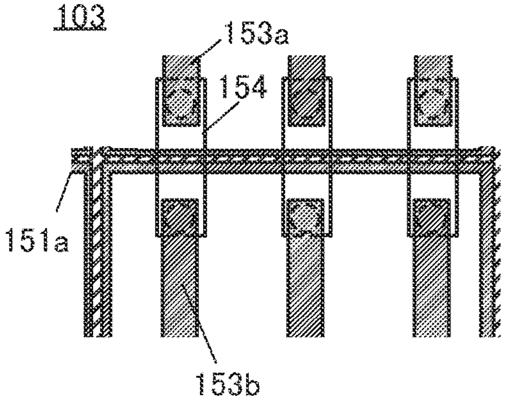

FIG. 3C illustrates the pixel portion 103 including the signal line and the bridge wiring. The signal line illustrated in FIG. 3C includes the third wiring layer 153*a* and the fourth wiring layer 153*b*, and the third wiring layer 153*a* and the fourth wiring layer 153*b* are separated from each other. Thus, the third wiring layer 153*a* and the fourth wiring layer 153*b* are electrically connected to each other using the bridge wiring 154. The third wiring layer 153*a* and the fourth wiring layer 153*b* include a conductive layer in the same layer as the first wiring layer 151*a*. The bridge wiring 154 includes a conductive layer in a layer different from that of the first wiring layer 151*a* and preferably includes a conductive layer in a layer below the first wiring layer 151*a*.

As described above, the auxiliary wiring 151 of one embodiment of the present invention including two or more wiring layers provided in different layers is preferable because the auxiliary wiring 151 has higher layout flexibility than an auxiliary wiring formed of one wiring layer. The auxiliary wiring 151 of one embodiment of the present invention is applicable to a high-resolution display device.

<Conductive Material Contained in Auxiliary Wiring>

As a conductive material contained in the auxiliary wiring 151 of one embodiment of the present invention, i.e., a conductive material contained in the first wiring layer 151*a* or the second wiring layer 151*b*, a metal such as aluminum, copper, silver, gold, platinum, chromium, or molybdenum can be used. An alloy of the metal can also be used as the conductive material. The conductive material is a metal and is anon-light-transmitting conductive material. The first wiring layer 151*a* or the second wiring layer 151*b* can be formed as a single layer or stacked layers with the use of the conductive material. For example, the first wiring layer 151*a* may be stacked layers and the second wiring layer 151*b* may be a single layer. Alternatively, the first wiring layer 151*a* may be a single layer and the second wiring layer 151*b* may be stacked layers. Further alternatively, the first wiring layer 151*a* may be stacked layers and the second wiring layer 151*b* may also be stacked layers.

As the conductive material contained in the auxiliary wiring of one embodiment of the present invention, i.e., the conductive material contained in the first wiring layer 151*a* or the second wiring layer 151*b*, a light-transmitting conductive material may be used. Specifically, an oxide containing indium and tin (also referred to as indium tin oxide, In—Sn oxide, or ITO), an oxide containing indium, silicon, and tin (also referred to as In—Si—Sn oxide or ITSO), an oxide containing indium and zinc (also referred to as indium zinc oxide or In—Zn oxide), an oxide containing indium, tungsten, and zinc (also referred to as In—W—Zn oxide), or the like can be used. The first wiring layer 151*a* or the second wiring layer 151*b* can be formed as a single layer or stacked layers with the use of the conductive material. In the case where the first wiring layer 151*a* or the second wiring layer 151*b* has a stacked-layer structure, the above-described conductive material using the metal or the like is preferably used for at least one layer.

The resistivity of the conductive material used for the auxiliary wiring of one embodiment of the present invention, i.e., the resistivity of the conductive material used for the first wiring layer 151*a* or the second wiring layer 151*b*, is preferably lower than the resistivity of a conductive material used for the common electrode. Note that in the case where a voltage drop caused by the common electrode can be inhibited adequately, the resistivity relationship is not necessarily satisfied.

This embodiment can be combined with any of the other embodiments as appropriate. In the case where a plurality of structure examples are described in one embodiment in this specification, the structure examples can be combined as appropriate.

Embodiment 2

In this embodiment, a specific example of a display device of one embodiment of the present invention will be described.

<Top-Emission Structure>

The display device of one embodiment of the present invention preferably has a top-emission structure. In the top-emission structure, an upper electrode needs to have a light-transmitting property, and light is emitted in the direction of the upper electrode. The light-transmitting property means transmission of visible light (light with wavelengths greater than or equal to 400 nm and less than 750 nm), and transmittance is preferably higher than or equal to 40%. The upper electrode may be rephrased as a common electrode.

A light-transmitting conductive material sometimes has high resistivity, in which case a common electrode has high resistance. This causes a voltage drop due to the common electrode and an uneven potential distribution in the display surface, leading to a variation in the luminance of light-emitting devices. In view of the above, the display device of one embodiment of the present invention having a top-emission structure may include an auxiliary wiring electrically connected to the common electrode. The auxiliary wiring can have an effect of inhibiting a voltage drop.

<Bottom-Emission Structure>

Note that the display device of one embodiment of the present invention may have a bottom-emission structure and may include an auxiliary wiring electrically connected to the common electrode. The auxiliary wiring can have an effect of inhibiting a voltage drop.

In the bottom-emission structure, a lower electrode needs to have a light-transmitting property, and light is emitted in the direction of the lower electrode. Furthermore, color filters need to be placed on the lower electrode side.

In this embodiment, a structure in which an auxiliary wiring is used in a display device having a top-emission structure will be described.

[Specific Example of Auxiliary Wiring]

Figure 4A:
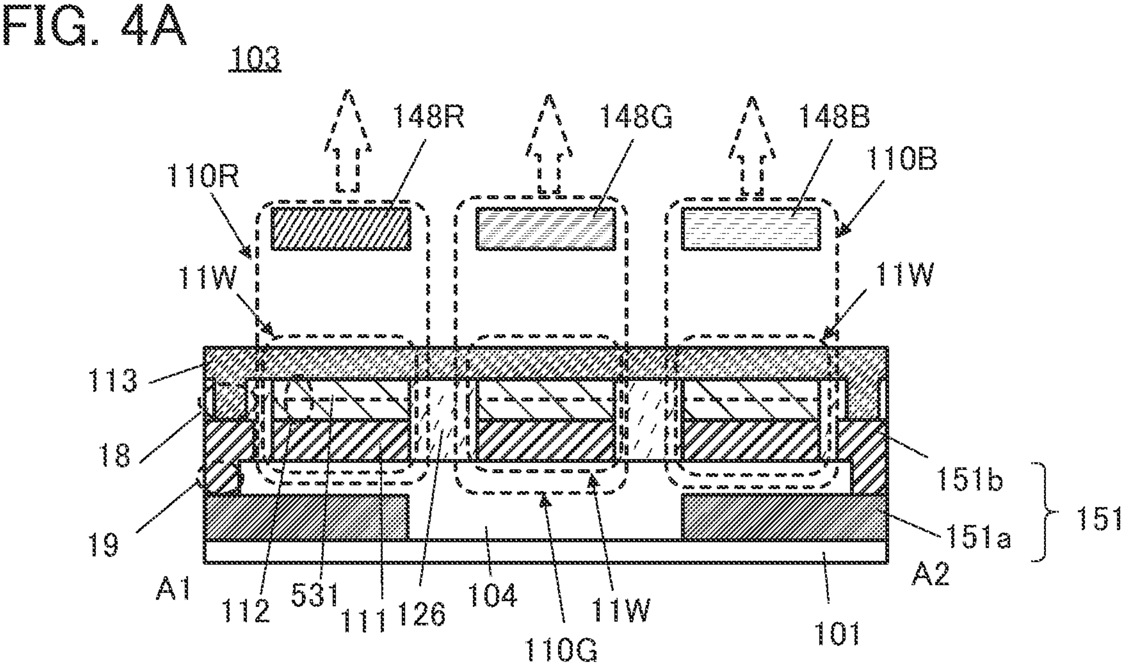
FIG. 4A is a cross-sectional view of a pixel portion.

FIG. 4A illustrates the pixel portion 103 included in a display device having a top-emission structure, and cross-sectional structures of the auxiliary wiring 151 and the like provided in the pixel portion 103 will be described. Although the cross-sectional structure of the auxiliary wiring 151 described in the above embodiment with reference to FIG. 3 or the like is employed in this embodiment, the display device having a top-emission structure may employ any of the cross-sectional structures of the auxiliary wiring 151 described in the above embodiment with reference to FIG. 1, FIG. 2, and the like.

The pixel portion 103 includes the light-emitting devices 11W. The light-emitting devices 11W are white-light-emitting devices and include the organic compound layers 112 divided. The organic compound layers 112 contain the same light-emitting material.

The light-emitting devices 11W further include the common electrode 113. The common electrode 113 has a light-transmitting property; thus, light is emitted from the light-emitting devices in the direction of arrows.

The light-emitting devices 11W are formed over an insulating layer 104, and the insulating layer 104 is formed over a substrate 101.

The auxiliary wiring 151 of one embodiment of the present invention includes two or more wiring layers provided in different layers, e.g., the first wiring layer 151*a* and the second wiring layer 151*b* illustrated in FIG. 4A. In this embodiment, as wiring layers provided in different layers, the first wiring layer 151*a* formed over the substrate 101 and the second wiring layer 151*b* formed over the insulating layer 104 are illustrated in FIG. 4A.

The common electrode 113 is positioned over an insulating layer 126, and the common electrode 113 can be electrically connected to the auxiliary wiring 151 through a contact hole 18 of the insulating layer 126. Furthermore, the second wiring layer 151*b* is electrically connected to the first wiring layer 151*a* through a contact hole 19 of the insulating layer 104 to function as the auxiliary wiring 151.

The auxiliary wiring 151 including two or more wiring layers provided in different layers is preferable because the auxiliary wiring 151 can be laid out without being affected by the layout of the lower electrode or with the minimized influence of the layout of the lower electrode even when any one of the wiring layers is provided on the same formation surface as the lower electrode.

In FIG. 4A, the second wiring layer 151*b* is provided in the same layer as the lower electrode 111. The first wiring layer 151*a* is provided in a layer different from that of the lower electrode 111 and thus can be laid out in a larger area than the second wiring layer 151*b*. Since the display device has a top-emission structure, an overlap of the first wiring layer 151*a* with the light-emitting devices does not decrease an aperture ratio. Thus, a conductive material with low resistivity can be used for the first wiring layer 151*a*. With the auxiliary wiring 151 of one embodiment of the present invention, a voltage drop of the common electrode 113 can be inhibited adequately.

The wiring layers included in the auxiliary wiring 151 may be provided in layers different from the layer of the lower electrode.

In this manner, the auxiliary wiring 151 of one embodiment of the present invention can include a wiring layer having a formation surface different from the formation surface of the lower electrode, and the wiring layer can be formed to have a large area without being affected by the layout of the lower electrode, whereby the effect of inhibiting a voltage drop can be sufficiently exerted.

Figure 4B:
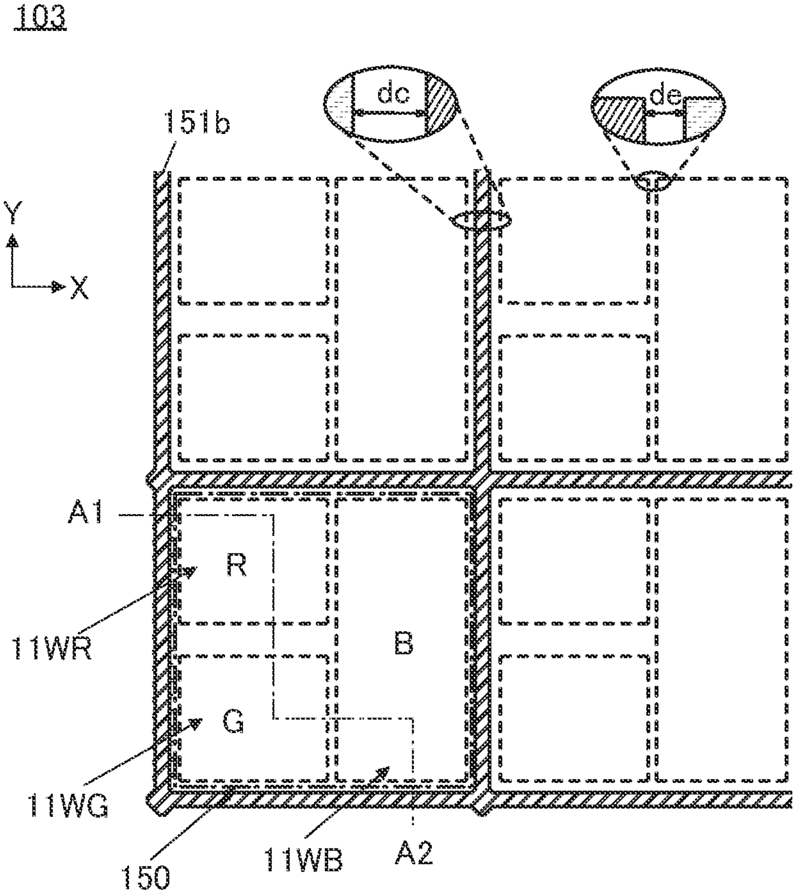
FIG. 4B is a top view of the pixel portion.

Next, a structure other than the auxiliary wiring 151 in the pixel portion 103 will be described. A top view of the pixel portion 103 illustrated in FIG. 4B is also referred to. Note that in FIG. 4B, the second wiring layer 151*b* is illustrated, and the first wiring layer 151*a* is omitted.

The dashed-dotted line A1-A2 in FIG. 4B corresponds to A1-A2 in FIG. 4A. In FIG. 4B, the X direction and the Y direction intersecting with the X direction are indicated, and a layout or the like of a structure of the pixel portion 103 is described using the directions in some cases.

As illustrated in FIG. 4B, the pixel portion 103 positioned in a display region includes the plurality of pixels 150. Besides the pixel portion 103, a protection circuit and the like are provided in the display region in some cases.

Each of the pixels 150 is used as a minimum unit capable of full-color display and includes at least the subpixel 110R, the subpixel 110G, and the subpixel 110B as illustrated in FIG. 4B. In order to perform full-color display, the subpixel 110R, the subpixel 110G, and the subpixel 110B each include a color filter.

Matters common to the subpixel 110R, the subpixel 110G, and the subpixel 110B are sometimes described using the collective term "subpixel 110".

The subpixel 110R, the subpixel 110G, and the subpixel 110B correspond to light-emitting regions of the light-emitting devices, and FIG. 4B illustrates an example in which each of the light-emitting regions has a rectangular shape. In the top view of FIG. 4B, the subpixel 110R corresponds to a light-emitting region of light passing through a red color filter (illustrated as R), the subpixel 110G corresponds to a light-emitting region of light passing through a green color filter (illustrated as G), and the subpixel 110B corresponds to a light-emitting region of light passing through a blue color filter (illustrated as B).

Note that the emission colors of the display device of one embodiment of the present invention are not limited thereto, and a white-light-emitting region without a color filter may be provided.

As illustrated in FIG. 4B, the subpixels 110R and the subpixels 110G are alternately laid out along the Y direction, and the subpixels 110B are arranged along the Y direction. The subpixel 110B can have a larger area than the subpixel 110R and the subpixel 110G.

As described above, the insulating layer 104 is provided over the substrate 101 and the subpixel 110R includes the lower electrode 111 over the insulating layer 104, the organic compound layer 112 over the lower electrode 111, and the common electrode 113 over the organic compound layer 112, as illustrated in FIG. 4A. The light-emitting device 11W of the subpixel 110R can emit light in the direction indicated by the arrow through the color filter 148R positioned on the common electrode 113 side.

As illustrated in FIG. 4A, the subpixel 110G and the subpixel 110B have structures similar to the structure of the subpixel 110R. The light-emitting device 11W of the subpixel 110G can emit light in the direction indicated by the arrow through the color filter 148G positioned on the common electrode 113 side. The light-emitting device 11W of the subpixel 110B can emit light in the direction indicated by the arrow through the color filter 148B positioned on the common electrode 113 side.

The subpixel 110 may include, in addition to the light-emitting devices, switching elements for controlling the light-emitting devices. Note that the switching elements are not illustrated in FIG. 4A and FIG. 4B. The display device of one embodiment of the present invention can perform display when light is emitted from the light-emitting devices controlled by the switching elements.

As described above, the second wiring layer 151*b* of the auxiliary wiring 151 is formed using a conductive layer provided in the same layer as the lower electrode 111, as illustrated in FIG. 4A. The auxiliary wiring 151 further includes the first wiring layer 151*a*, which is a wiring layer provided in a layer different from that of the lower electrode 111.

As illustrated in FIG. 4A, the second wiring layer 151*b* includes a wiring layer on the same formation surface as the lower electrode and is accordingly provided in a region not in contact with the lower electrode 111, i.e., not overlapping with the subpixel. Consequently, the second wiring layer 151*b* has a lattice shape in atop view, for example. The second wiring layer 151*b* includes regions that extend along the X direction and are arranged in parallel as horizontal lines and includes regions that extend along the Y direction and are arranged in parallel as vertical lines.

The second wiring layer 151*b* illustrated in FIG. 4B includes regions positioned between the subpixels 110R and the subpixels 110G as the regions that extend along the X direction, and the regions are arranged in parallel. The regions positioned between the subpixels 110R and the subpixels 110G correspond to regions between pixels. The second wiring layer 151*b* illustrated in FIG. 4B includes regions positioned between the subpixels 110G and the subpixels 110B as the regions that extend along the Y direction, and the regions are arranged in parallel.

A gap between the lower electrodes 111 is narrower in a higher-resolution display device. For example, in the pixel portion 103 of FIG. 4B included in a high-resolution display device, the distance de between the subpixels and the distance dc between the pixels are narrow. It is difficult to form a wiring layer for an auxiliary wiring in a narrow region. Thus, the second wiring layer 151*b* of the auxiliary wiring 151 of one embodiment of the present invention is preferably provided at least in a gap between the subpixels corresponding to the pixels. Furthermore, as a wiring layer provided in the gap between the subpixels, a wiring layer in a layer different from that of the lower electrode, e.g., the first wiring layer 151*a* or the like, is preferably used.

<Insulating Layer 126>

In the display device of one embodiment of the present invention, the insulating layer 126 is preferably positioned between the light-emitting devices as illustrated in FIG. 4A. The insulating layer 126, which is one of the components enabling a high-resolution display device to be provided, can fill gaps between the pixels and gaps between the subpixels, and the second wiring layer 151*b* is preferably positioned to overlap with the insulating layer 126. The insulating layer 126 can inhibit the second wiring layer 151*b* from being in contact with the lower electrode 111. Furthermore, with the insulating layer 126, the organic compound layers 112 can be surely apart or separated from each other, so that crosstalk between the light-emitting devices can be inhibited.

In FIG. 4A, the top surface of the insulating layer 126 is substantially aligned or aligned with the top surface of the organic compound layer 112. Such a positional relationship is preferably satisfied, in which case the formation surface of the common electrode 113 is flat and thus the common electrode 113 is unlikely to be cut.

Although not illustrated in FIG. 4A, the top surface of the insulating layer 126 may be positioned above the top surface of the organic compound layer 112 in order to prevent the common electrode 113 from being cut. In that case, the end portion of the insulating layer 126 is preferably made gradually thinner toward the organic compound layer 112. The shape where the thickness is made gradually smaller is sometimes referred to as a tapered shape.

Although not illustrated in FIG. 4A, the center portion of the insulating layer 126 is preferably higher in level than the end portion of the insulating layer 126 and further preferably includes a region rising above the end portion. Providing the common electrode 113 over the insulating layer 126 having such a shape is preferable because the common electrode 113 is unlikely to be cut.

Although the second wiring layer 151*b* of the auxiliary wiring 151 has a region in contact with the bottom of the common electrode 113 in FIG. 4A, inhibiting a voltage drop of the common electrode 113 only requires electrical connection between the auxiliary wiring 151 and the common electrode 113.

The display device of one embodiment of the present invention preferably has a top-emission structure. In the top-emission structure, the visible light transmittance of the common electrode 113 is desirably high and is preferably higher than or equal to 40%, for example.

[Specific Example of Auxiliary Wiring]

The feature of the auxiliary wiring 151 of one embodiment of the present invention is including at least two or more wiring layers. Specific layout examples of the first wiring layer 151*a* and the second wiring layer 151*b* are described with reference to FIG. 5 and the like. FIG. 5 and the like illustrate the subpixels (R, G, and B) as in FIG. 4B and do not illustrate the lower electrode 111 for easy viewing of the layout examples of the first wiring layer 151*a* and the second wiring layer 151*b*.

Figure 5A:
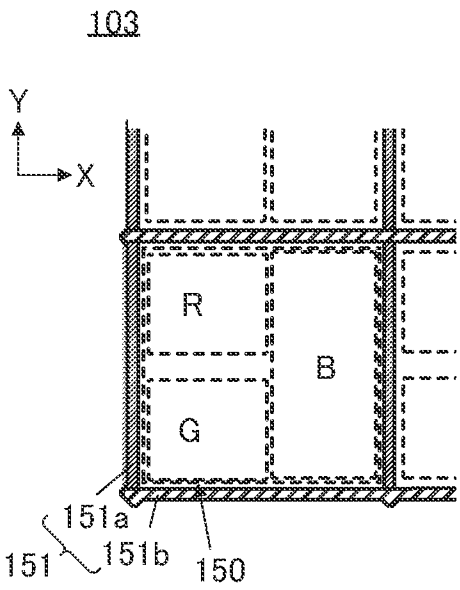
FIG. 5A to FIG. 5D are top views of a pixel portion.

In the pixel portion 103 illustrated in FIG. 5A, the auxiliary wiring 151 has a lattice shape in a top view and includes the first wiring layer 151*a* extending in the Y direction and the second wiring layer 151*b* extending in the X direction. Note that FIG. 5A does not illustrate a contact hole positioned in a region where the first wiring layer 151*a* and the second wiring layer 151*b* intersect with each other.

Either one of the first wiring layer 151*a* and the second wiring layer 151*b* may be formed in the same layer as the lower electrode 111, or both of them may be formed in layers different from the layer of the lower electrode 111.

In the pixel portion 103 illustrated in FIG. 5A, the first wiring layer 151*a* and the second wiring layer 151*b* are both positioned between the pixels. The pixel portion 103 is used in a high-resolution display device.

Figure 5B:
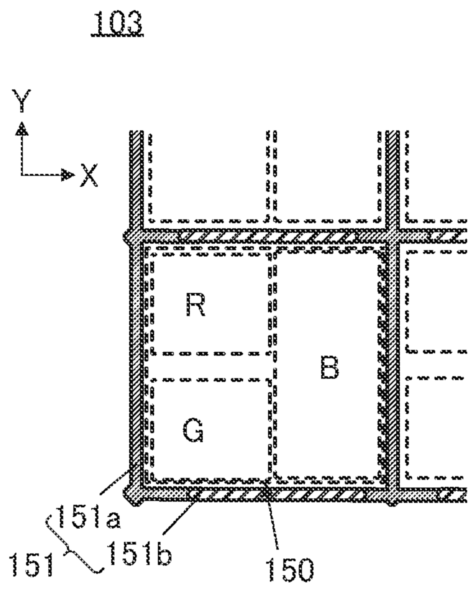

FIG. 5B illustrates the auxiliary wiring 151 in which the second wiring layer 151*b* has a shorter length than that illustrated in FIG. 5A. The first wiring layer 151*a* includes a region extending in the X direction for the length by which the second wiring layer 151*b* is shortened. Moreover, the second wiring layer 151*b* has a length such that one end overlaps with the subpixel 110G and the other end overlaps with the subpixel 1101B. The other components are the same as those in FIG. 5A.

Figure 5C:
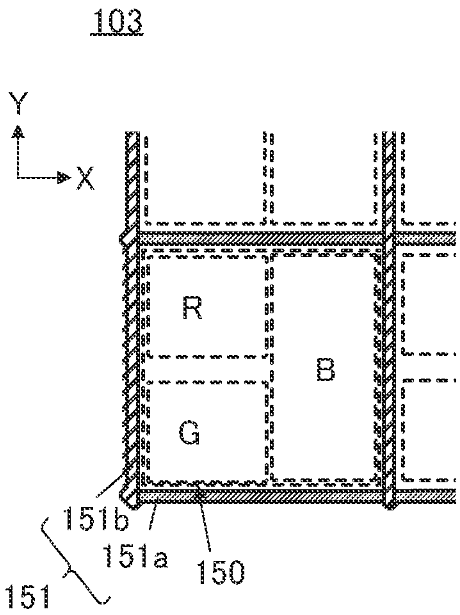

FIG. 5C illustrates the auxiliary wiring 151 in which the first wiring layer 151*a* illustrated in FIG. 5A is used as the second wiring layer 151*b* and the second wiring layer 151*b* illustrated in FIG. 5A is used as the first wiring layer 151*a*. The other components are the same as those in FIG. 5A.

Figure 5D:
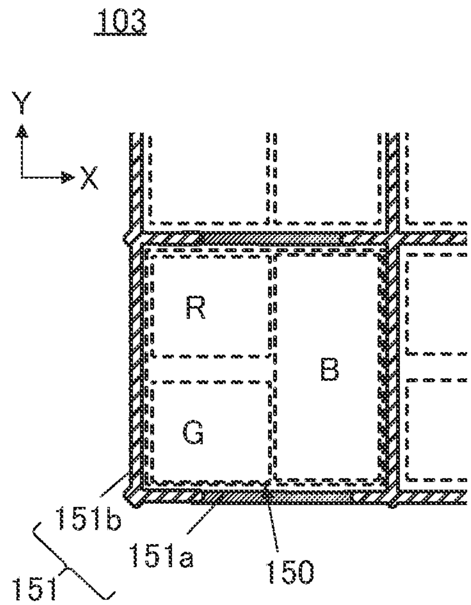

FIG. 5D illustrates the auxiliary wiring 151 in which the first wiring layer 151*a* has a shorter length than that illustrated in FIG. 5C. The second wiring layer 151*b* includes a region extending in the X direction for the length by which the first wiring layer 151*a* is shortened. The shortened first wiring layer 151*a* has a length such that one end overlaps with the subpixel 110G and the other end overlaps with the subpixel 110B. The other components are the same as those in FIG. 5C.

Figure 6A:
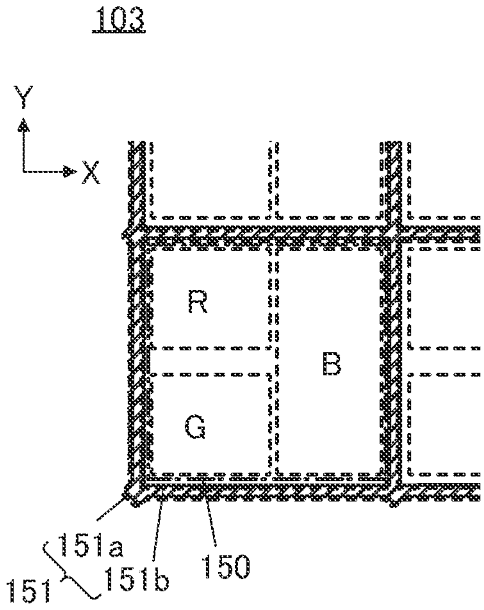
FIG. 6A and FIG. 6B are top views of a pixel portion.

FIG. 5A illustrates the auxiliary wiring 151 in which the first wiring layer 151*a* and the second wiring layer 151*b* have the same shape. In FIG. 6A, the first wiring layer 151*a* is denoted by a dotted line. The other components are the same as those in FIG. 5A.

Figure 6B:
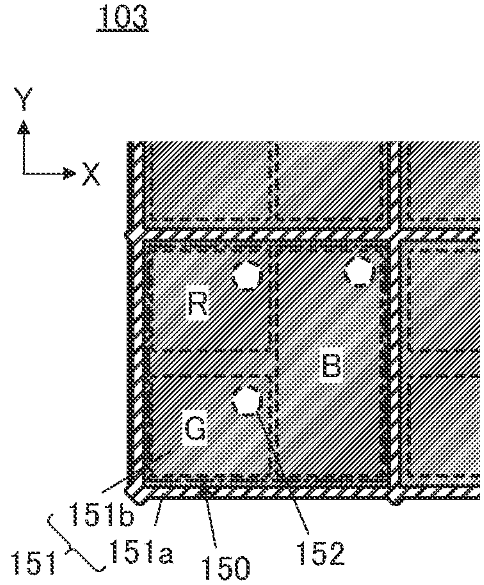

FIG. 6B illustrates the auxiliary wiring 151 including the first wiring layer 151*a* having a larger area than the second wiring layer 151*b*. The wiring layer functioning as the auxiliary wiring preferably has a large area. The first wiring layer 151*a*, which is formed in a layer different from that of the lower electrode 111, can be formed in a large area. An opening 152 is provided in the first wiring layer 151*a* to obtain electrical connection between the lower electrode and a transistor. The other components are the same as those in FIG. 5A.

In this manner, the auxiliary wiring 151 of one embodiment of the present invention includes the first wiring layer 151*a* and the second wiring layer 151*b* and accordingly can have various modes. In addition, electrically connecting the auxiliary wiring 151 to the common electrode can adequately inhibit a voltage drop of the common electrode. Moreover, a high-resolution pixel portion can be used in the display device of one embodiment of the present invention.

The auxiliary wiring 151 may be used for a bottom-emission structure. In that case, any of the cross-sectional structures of the auxiliary wiring 151 described in the above embodiment with reference to FIG. 1 to FIG. 3 and the like can be employed. In the bottom-emission structure, light is emitted downwardly through the lower electrode 111; thus, the first wiring layer 151*a* provided below the lower electrode 111 preferably has a lattice shape overlapping with the gap between the subpixels or the gap between the pixels, or a smaller area than the lattice shape. Moreover, the second wiring layer 151*b* provided below the lower electrode 111 preferably has a lattice shape overlapping with the gap between the subpixels or the gap between the pixels, or a smaller area than the lattice shape.

<Specific Example of Display Device>

A specific example of a display device having a top-emission structure illustrated in FIG. 4 and the like will be described with reference to FIG. 7A to FIG. 7C. A display device 100 includes the pixel portion 103 and a connection portion 140. The pixel portion 103 includes the plurality of pixels 150. The pixels 150 each include the plurality of subpixels 110 (denoted as 110R, 110G, and 110B in the drawing), and regions corresponding to the subpixels are denoted by reference numerals R, G, and B. The arrangement in FIG. 7A is similar to the arrangement in FIG. 4B and the like, and is regular arrangement.

The pixel portion 103 includes a contact hole 141. The contact hole 141 is selectively provided; for example, the contact hole 141 can be provided in a region corresponding to the periphery of the pixel 150. Examples of the region include four corners of the pixel 150.

As the light-emitting device 11W, an element such as an OLED (Organic Light Emitting Diode) or a QLED (Quantum-dot Light Emitting Diode) is preferably used. Examples of alight-emitting substance contained in the light-emitting device include a substance that emits fluorescent light (a fluorescent material), a substance that emits phosphorescent light (a phosphorescent material), an inorganic compound (a quantum dot material or the like), and a substance that exhibits thermally activated delayed fluorescence (a thermally activated delayed fluorescent (TADF) material).

Figure 7A:
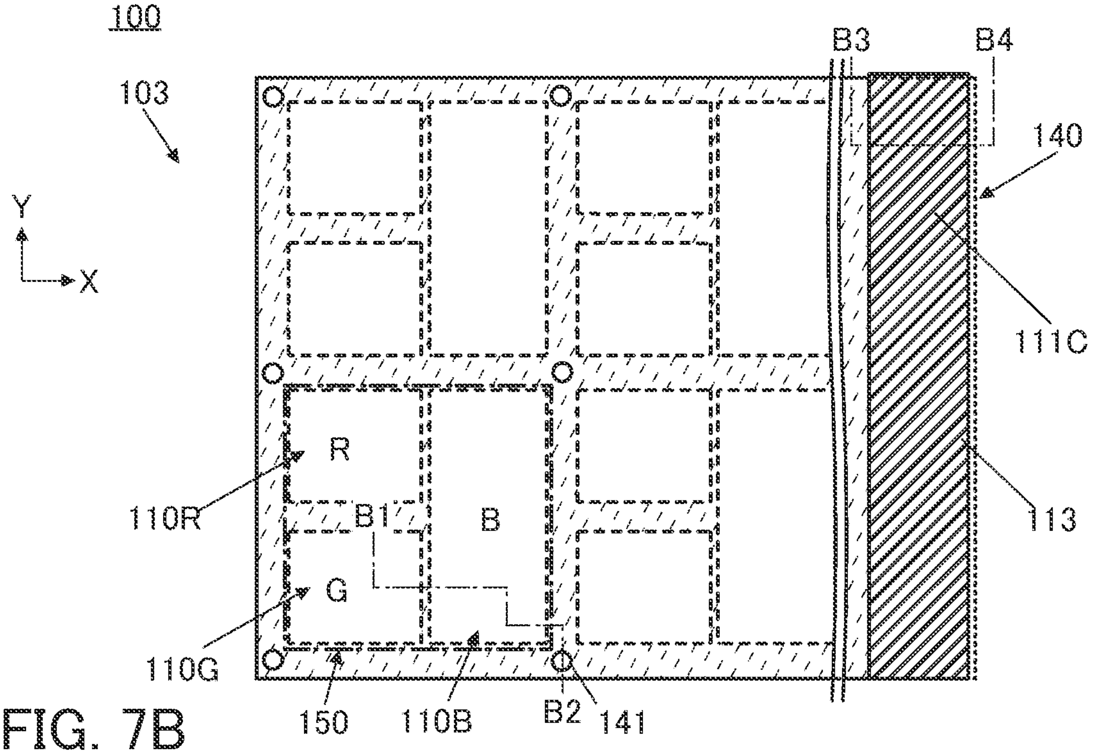
FIG. 7A is a top view.

The connection portion 140 illustrated in FIG. 7A is a region including a connection electrode 111C electrically connected to the common electrode 113. The connection portion 140 is sometimes referred to as a cathode contact portion. The common electrode 113 preferably extends to the connection portion 140 beyond the end of the pixel portion 103. In FIG. 7A, the common electrode 113 extending to the connection portion 140 is indicated by a dotted line. The connection electrode 111C is supplied with a potential to be supplied to the common electrode 113. A voltage drop may occur in the common electrode 113 in response to the distance from the connection portion 140. When a voltage drop occurs, the value of the potential varies. The display device of this embodiment including at least the auxiliary wiring 151 in the pixel portion 103 is preferable because the value of the potential does not vary. The auxiliary wiring 151 can be provided in the connection portion 140 as well as in the pixel portion 103.

The connection electrode 111C can be provided along the periphery of the pixel portion 103. For example, the connection electrode 111C may be provided along one side of the periphery of the pixel portion 103, or the connection electrode 111C may be provided along two or more sides of the periphery of the pixel portion 103. That is, in the case where the top surface shape of the pixel portion 103 is a rectangular shape, the top surface shape of the connection electrode 111C can be a band shape along one side of the periphery, an L shape along two sides of the periphery, a U-like shape along three sides of the periphery, a quadrangular shape along four sides of the periphery, or the like.

Here, the auxiliary wiring 151 can have a structure to which a power supply potential or a signal is not directly supplied. That is, the auxiliary wiring 151 can have a structure to which a wiring or an electrode other than the common electrode 113 is not connected. Meanwhile, a power supply potential (e.g., a cathode potential) may be supplied to the auxiliary wiring 151. Thus, a potential is supplied to the common electrode 113 not only from the connection electrode 111C but also from the auxiliary wiring 151, so that a voltage drop can be inhibited more effectively. Alternatively, a structure may be employed in which a power supply potential is supplied from the auxiliary wiring 151 to the common electrode 113 to omit the connection electrode 111C, the connection portion 140, and the like. This can downsize the display device.

Figure 7B:
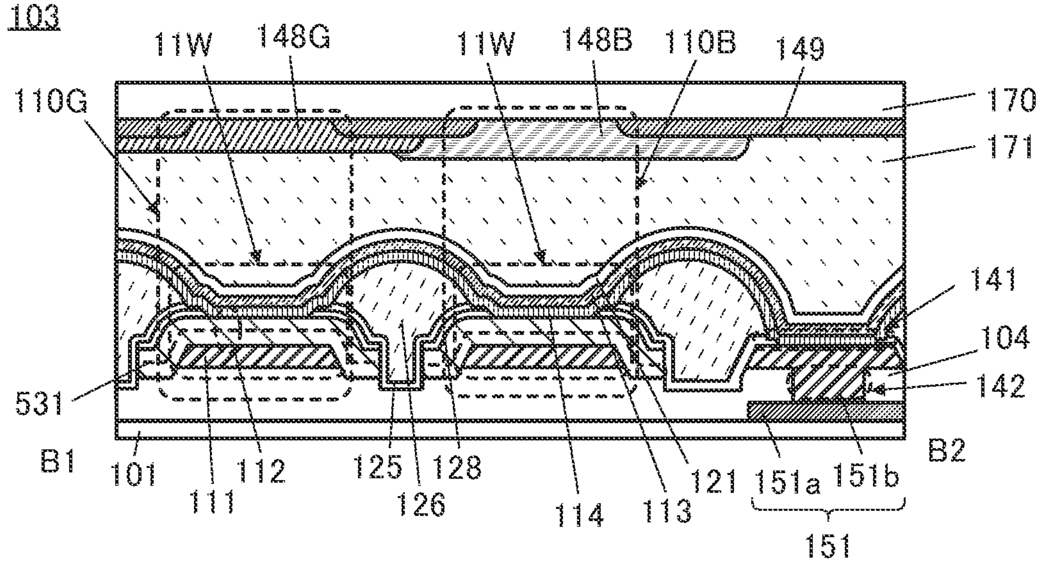
FIG. 7B is a cross-sectional view of a pixel portion.
Figure 7C:
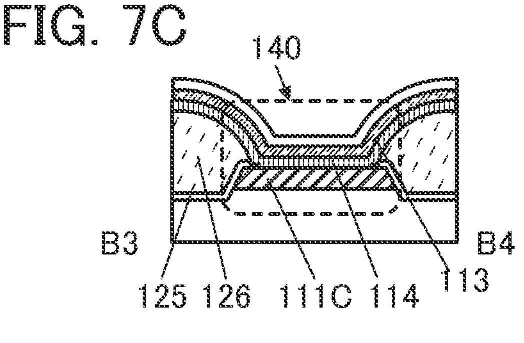
FIG. 7C is a cross-sectional view of a connection portion.

FIG. 7B and FIG. 7C are cross-sectional views taken along the dashed-dotted line B1-B2 and the dashed-dotted line B3-B4, respectively, in FIG. 7A.

As illustrated in FIG. 7B, the color filter 148G, the color filter 148B, and a light-blocking layer 149 are preferably placed on the substrate 170 side. The color filter 148B is formed to overlap with part of the color filter 148G formed earlier. The light-blocking layer 149 is sometimes referred to as a black matrix and is placed in a portion where the color filters overlap with each other. That is, the light-blocking layer 149 is preferably placed to overlap with a non-light-emitting region.

FIG. 7B also shows a cross-sectional view of the contact hole 141. The contact hole 141 is formed in the insulating layer 126. The second wiring layer 151*b* and the common electrode 113 can be electrically connected to each other through the contact hole 141. The contact hole 141 is the non-light-emitting region and preferably overlaps with the light-blocking layer 149.

Although not illustrated in FIG. 7A, the insulating layer 104 also includes a contact hole 142 in the pixel portion 103. The second wiring layer 151*b* and the first wiring layer 151*a* can be electrically connected to each other through the contact hole 142. The contact hole 142 may be formed in a region overlapping with the contact hole 141 or in a region not overlapping with the contact hole 141. In the case where the thickness of the insulating layer 126 is larger than the thickness of the insulating layer 104, the size (e.g., the width in a cross-sectional view) of the contact hole 141 is preferably larger than the size (e.g., the width in a cross-sectional view) of the contact hole 142.

As illustrated in FIG. 7B, the end surface of the organic compound layer 112 processed by a photolithography method is perpendicular or substantially perpendicular. The taper angle of the end surface of the organic compound layer 112 is preferably greater than or equal to 450 and less than 90°. It is preferable that the taper angles of the end surfaces of the other organic compound layers be greater than or equal to 45° and less than 90°. As described above, since the organic compound layer has a stack of layers, the taper angle can be regarded as an angle formed by the formation surface and a line passing from the upper edge of the uppermost layer to the lower edge of the lowest layer in the stack. The taper angle in the above range facilitates fine processing, e.g., formation of the contact hole 141 between the light-emitting devices.

The organic compound layer 112 includes a functional layer that enables a white-light-emitting device to be obtained. For example, with the use of a tandem structure or a single structure, a white-light-emitting device can be provided. In the case of the tandem structure, the charge-generation layer 531 is included.

The organic compound layer 112 may further include, as a functional layer other than a light-emitting layer, a layer containing any of a substance having a high hole-injection property, a substance having a high hole-transport property, a hole-blocking material, a substance having a high electron-transport property, a substance having a high electron-injection property, an electron-blocking material, a substance having a bipolar property (a substance having a high electron-transport property and a high hole-transport property), and the like. A layer containing a substance having a high hole-injection property is referred to as a hole-injection layer. A layer containing a substance having a high hole-transport property is referred to as a hole-transport layer. A layer containing a hole-blocking material is referred to as a hole-blocking layer. A layer containing a substance having a high electron-transport property is referred to as an electron-transport layer. A layer containing a substance having a high electron-injection property is referred to as an electron-injection layer. A layer containing an electron-blocking material is referred to as an electron-blocking layer. The hole-injection layer and the electron-injection layer may each be referred to as a carrier-injection layer.

The functional layer can be formed by a method such as an evaporation method (including a vacuum evaporation method), a transfer method, a printing method, an ink-jet method, or a coating method.

The common layer 114 can include one or two or more selected from an electron-injection layer, an electron-transport layer, a hole-injection layer, and a hole-transport layer. "Including two or more layers" includes the case where two or more functional layers different from each other are included in combination and the case where two or more layers that are the same functional layers but contain different materials are included in combination. Specific materials that can be used for the functional layer will be described later.

In this embodiment, the organic compound layer 112 includes two stacks each including a hole-injection layer, a hole-transport layer, a light-emitting layer, and an electron-transport layer in this order from the lower electrode 111 side, a charge-generation layer is positioned between the stacks, and the common layer 114 is an electron-injection layer included in the upper stack.

Note that the functional layers only need to have their respective functions, and do not necessarily contain organic compounds. For example, it is possible to use a layer only containing an inorganic compound or an inorganic substance as the electron-injection layer or the like.

The lower electrode 111 is provided for each light-emitting device. Each of the common electrode 113 and the common layer 114 is provided as a continuous layer shared by the light-emitting devices. A display device having a top-emission structure can be obtained by using a conductive film having a reflective property as the lower electrode 111 and using a conductive film having a visible-light-transmitting property as the common electrode 113.

The end portion of the lower electrode 111 preferably has a tapered shape. The end portion of the organic compound layer 112 is preferably positioned in a region beyond the lower electrode 111; when the end portion of the lower electrode 111 has a tapered shape, the organic compound layer 112 has a shape along the tapered shape. The tapered side surface of the lower electrode 111 can improve coverage with the organic compound layer or the like.

Note that the lower electrode 111 is an electrode electrically connected to a transistor and is sometimes referred to as a pixel electrode. Furthermore, the lower electrode 111 functions as one of an anode and a cathode of the light-emitting device and is thus sometimes referred to as an anode or a cathode.

The organic compound layer 112 is processed by a photolithography method. Thus, as described above, the end portion of the organic compound layer 112 has a taper angle greater than or equal to 45° and less than 90°.

The insulating layer 126 is preferably provided between two adjacent light-emitting devices. The insulating layer 126 is positioned between the two adjacent light-emitting devices and is provided to fill at least a space between two adjacent organic compound layers 112. The insulating layer 126 further preferably includes a region overlapping with the end portion of the organic compound layer 112. That is, the end portion of the insulating layer 126 can be positioned over the organic compound layer 112, and the level difference between the upper portion and the end portion of the insulating layer 126 can be made small. When the level difference between the upper portion and the end portion of the insulating layer 126 increases, the insulating layer 126 is easily peeled in some cases; accordingly, the difference is preferably small.

The upper portion of the insulating layer 126 preferably has a smooth projecting shape. An upper portion having a projecting shape can also be referred to as a shape in which the center portion of the insulating layer 126 rises above the end portion.

At least the common layer 114 and the common electrode 113 are provided to cover the insulating layer 126, whereby the common layer 114 and the common electrode 113 can be inhibited from being cut.

An insulating layer 125 is preferably provided in contact with the side surface of the organic compound layer 112. The insulating layer 125 is positioned between the insulating layer 126 and the organic compound layer 112 and functions as a protective film for preventing contact between the insulating layer 126 and the organic compound layer 112. In the case where the insulating layer 126 is in contact with the organic compound layer 112, the organic compound layer 112 might be dissolved by an organic solvent or the like used in the formation or processing of the insulating layer 126. In view of this, the insulating layer 125 is provided between the organic compound layer 112 and the insulating layer 126 as described in this embodiment to protect the organic compound layer 112.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have either a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when a metal oxide film such as an aluminum oxide film or a hafnium oxide film or an inorganic insulating film such as a silicon oxide film formed by an atomic layer deposition (ALD) method is used as the insulating layer 125, the insulating layer 125 having few pinholes and an excellent function of protecting the organic compound layer can be formed.

Note that in this specification and the like, an oxynitride refers to a material that contains more oxygen than nitrogen in its composition, and a nitride oxide refers to a material that contains more nitrogen than oxygen in its composition. For example, silicon oxynitride refers to a material that contains more oxygen than nitrogen in its composition, and a silicon nitride oxide refers to a material that contains more nitrogen than oxygen in its composition.

The insulating layer 125 can be formed by a sputtering method, a chemical vapor deposition (CVD) method, a pulsed laser deposition (PLD) method, an ALD method, or the like. The insulating layer 125 is preferably formed by an ALD method achieving good coverage.

An insulating layer containing an organic material can be suitably used as the insulating layer 126. For the insulating layer 126, an acrylic resin, a polyimide resin, an epoxy resin, an imide resin, a polyamide resin, a polyimide-amide resin, a silicone resin, a siloxane resin, a benzocyclobutene-based resin, a phenol resin, a precursor of any of these resins, or the like can be used, for example. For the insulating layer 126, an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin may be used.

Moreover, for the insulating layer 126, a photosensitive resin can be used. A photoresist may be used as the photosensitive resin. As the photosensitive resin, a positive material or a negative material can be used.

In the case where a material having photosensitivity is used for the insulating layer 126, light exposure and development are performed, whereby the processed insulating layer 126 can be formed. The surface of the processed insulating layer 126 may have a rounded shape or an uneven shape. Note that etching may be performed to adjust the surface level of the processed insulating layer 126. The insulating layer 126 is processed by ashing using oxygen plasma, so that the surface level can be adjusted.

The insulating layer 126 preferably contains a material absorbing visible light. For example, the insulating layer 126 itself may be formed of a material absorbing visible light, or the insulating layer 126 may contain a pigment absorbing visible light. For example, the insulating layer 126 can be formed using a resin that can be used as a color filter transmitting red, blue, or green light and absorbing other light, a resin that contains carbon black as a pigment and functions as a black matrix, or the like.

It is preferable that the top surface of the insulating layer 126 have a portion whose level is higher than the level of the top surface of the organic compound layer 112.

The insulating layer 126 can be formed by, for example, a wet deposition method such as spin coating, dipping, spray coating, ink-jetting, dispensing, screen printing, offset printing, a doctor knife method, slit coating, roll coating, curtain coating, or knife coating. In particular, the organic insulating film to be the insulating layer 126 is preferably formed by spin coating.

After the insulating layer 126 is formed, heat treatment is preferably performed in the air at a temperature higher than or equal to 85° C. and lower than or equal to 120° C. for longer than or equal to 45 minutes and shorter than or equal to 100 minutes. The insulating layer 126 can be dehydrated or degassed.

Between the insulating layer 125 and the insulating layer 126, a reflective film (e.g., a metal film containing one or more selected from silver, palladium, copper, titanium, aluminum, and the like) may be provided. For example, after the insulating layer 125 is formed, the reflective film can be formed. With the reflective film, light emitted from the light-emitting layer can be reflected. This can increase the light extraction efficiency.

As illustrated in FIG. 7B, an insulating layer 128 may be provided between the insulating layer 125 and the top surface of the organic compound layer 112. The insulating layer 128 is a remaining part of a protective layer (also referred to as a mask layer) for protecting the organic compound layer 112 during etching of the organic compound layer 112. For the insulating layer 128, the material that can be used for the insulating layer 125 is preferably used. It is particularly preferable to use the same material for the insulating layer 128 and the insulating layer 125 to facilitate processing. For example, both the insulating layer 128 and the insulating layer 125 preferably include an aluminum oxide film, a hafnium oxide film, or a silicon oxide film.

The insulating layer 125, the insulating layer 126, and the insulating layer 128 are insulating layers positioned between the light-emitting devices and may be collectively referred to as an insulating stack. Since the common layer 114 and the common electrode 113 are provided over the insulating stack, the end portion of the insulating stack preferably has a tapered shape to prevent disconnection of the common layer 114 and the common electrode 113. In order that the end portion of the insulating stack can have a tapered shape, the end portion of the insulating layer 125 may have a tapered shape, the end portion of the insulating layer 126 may have a tapered shape, the end portion of the insulating layer 128 may have a tapered shape, or the end portions of the insulating layer 125, the insulating layer 126, and the insulating layer 128 may each have a tapered shape. In the case where a plurality of insulating layers form a tapered shape, the end portions of the insulating layers are preferably continuously formed to have a tapered shape.

Furthermore, the center portion of the top surface of the insulating stack preferably has a rounded shape. That is, the insulating stack has a shape in which the center portion rises above the end portion. To obtain the above shape, the insulating layer 126 positioned in the uppermost layer of the insulating stack is preferably formed using an organic material.

Furthermore, the end portion of the insulating stack can have various shapes. For example, the insulating layer 125 positioned as a lower layer of the insulating stack may protrude from the insulating layer 126. In that case, part of an upper portion of the insulating layer 125 is removed at the time of processing of the insulating layer 126 in some cases. Removing part of the upper portion of the insulating layer 125 that protrudes from the insulating layer 126 has an effect of preventing the common layer 114 and the common electrode 113 from being cut.

The insulating layer 128 may protrude from the insulating layer 126. In that case, part of an upper portion of the insulating layer 128 is removed at the time of processing of the insulating layer 126 in some cases. Removing part of the upper portion of the insulating layer 128 that protrudes from the insulating layer 126 has an effect of preventing the common layer 114 and the common electrode 113 from being cut.

When the insulating layer 128 protrudes from the insulating layer 126, it is preferable that the end portion of the insulating layer 125 positioned below the insulating layer 128 be aligned or substantially aligned with the end portion of the insulating layer 128.

As illustrated in FIG. 7B, a protective layer 121 is provided over the common electrode 113. The protective layer 121 has a function of preventing diffusion of impurities into the light-emitting elements from above.

The protective layer 121 can have, for example, a single-layer structure or a stacked-layer structure at least including an inorganic insulating film. Examples of the inorganic insulating film include an oxide film and a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as an indium gallium oxide or an indium gallium zinc oxide may be used for the protective layer 121.

The protective layer 121 is bonded to the substrate 170 with an adhesive layer 171. For the adhesive layer 171, a variety of curable adhesives such as a reactive curable adhesive, a thermosetting adhesive, an anaerobic adhesive, and a photocurable adhesive such as an ultraviolet curable adhesive can be used. As the adhesive layer 171, an adhesive sheet or the like may be used.

In the connection portion 140 illustrated in FIG. 7C, an opening portion is provided in the insulating layer 125 and the insulating layer 126 over the connection electrode 111C. The connection electrode 111C and the common electrode 113 are electrically connected to each other in the opening portion. The opening portion for electrically connecting the connection electrode 111C and the common electrode 113 may be provided in any of the insulating layers.

FIG. 7C illustrates a structure in which the common layer 114 is provided over the connection electrode 111C and the common electrode 113 is provided over the common layer 114. In the case where a carrier-injection layer such as an electron-injection layer is used as the common layer 114, for example, the resistivity of a material used for the common layer 114 is sufficiently low; thus, the connection electrode 111C can be electrically connected to the common electrode 113 through the common layer 114. Accordingly, the common electrode 113 and the common layer 114 can be formed using the same area mask or rough metal mask, whereby the manufacturing cost can be reduced. The area mask or the rough metal mask is different from a fine metal mask. Needless to say, in the connection portion 140, the connection electrode 111C may include a region in contact with the common electrode 113.

A structure example of a display device whose structure is partly different from that in the above-described structure example will be described below. In the following description, the portions already described in the above specific examples are denoted by the same reference numerals, and the description thereof is not repeated in some cases.

In the display device described as the specific example, at least organic compound layers are separated. With this structure, crosstalk due to leakage current is inhibited, so that an image with extremely high display quality can be displayed. Moreover, both a high aperture ratio and high resolution can be achieved. The display device of one embodiment of the present invention can be used in an ultra-large display with a size greater than or equal to 40 inches, greater than or equal to 100 inches, and even greater than 100 inches.

This embodiment can be combined with any of the other embodiments as appropriate. In the case where a plurality of structure examples are described in one embodiment in this specification, the structure examples can be combined as appropriate.

Embodiment 3

In this embodiment, the layout of subpixels will be described.

<Layout>

There is no particular limitation on the arrangement of the subpixels, and stripe arrangement, S-stripe arrangement, matrix arrangement, delta arrangement, Bayer arrangement, PenTile arrangement, or the like can be used.

Examples of the top surface shape of the subpixel include polygons such as a triangle, a tetragon (including a rectangle and a square), and a pentagon; polygons with rounded corners; an ellipse; and a circle. The top surface shape of the subpixel herein corresponds to a light-emitting region of light from a light-emitting device that passes through a color filter.

Figure 8A:
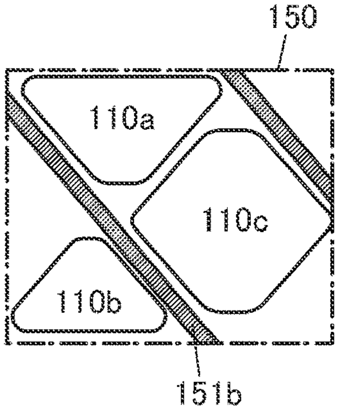
FIG. 8A to FIG. 8D are top views of a pixel portion.

The pixel portion 103 illustrated in FIG. 8A includes the second wiring layer 151*b* as part of the auxiliary wiring, and the pixel 150 includes a subpixel 110*a* whose top surface shape is a rough trapezoid with rounded corners, a subpixel 110*b* whose top surface shape is a rough triangle with rounded corners, and a subpixel 110*c* whose top surface shape is a rough tetragon or rough hexagon with rounded corners. The subpixel 110*a* has a larger light-emitting area than the subpixel 110*b*. In this manner, the shapes and sizes of the subpixels can be determined independently.

Figure 9A:
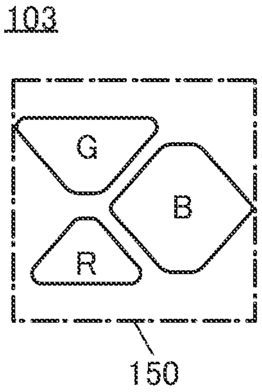
FIG. 9A to FIG. 9D are top views of a pixel portion.

When color filters are used in the pixel portion 103 illustrated in FIG. 8A, the subpixel 110*a* can be the subpixel 110G that emits green light, the subpixel 110*b* can be the subpixel 110R that emits red light, and the subpixel 110*c* can be the subpixel 110B that emits blue light, as illustrated in FIG. 9A.

Figure 8B:
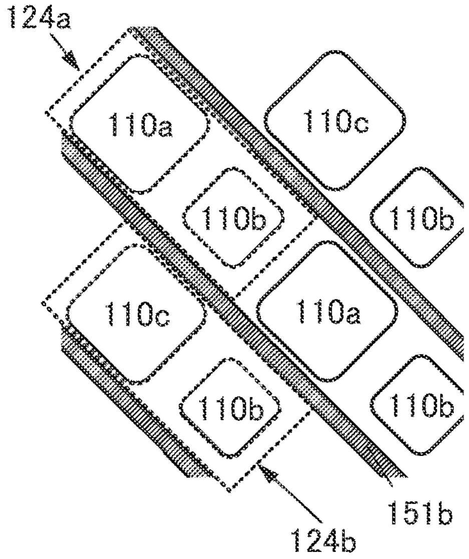

The pixel portion 103 illustrated in FIG. 8B includes the second wiring layer 151*b* as part of the auxiliary wiring, and PenTile arrangement is employed as the arrangement of the subpixels. In the PenTile arrangement, a pair 124*a* of subpixels including the subpixel 110*a* and the subpixel 110*b* and a pair 124*b* of subpixels including the subpixel 110*b* and the subpixel 110*c* are alternately laid out.

Figure 9B:
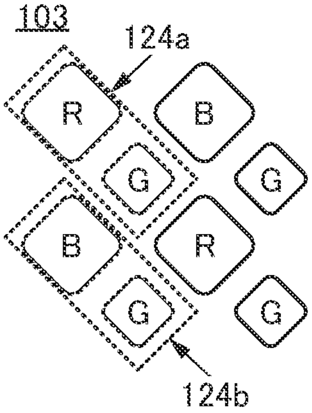

When color filters are used in the pixel portion 103 illustrated in FIG. 8B, the subpixel 110*a* can be the subpixel 110R that emits red light, the subpixel 110*b* can be the subpixel 110G that emits green light, and the subpixel 110*c* can be the subpixel 110B that emits blue light, as illustrated in FIG. 9B.

Figure 8C:
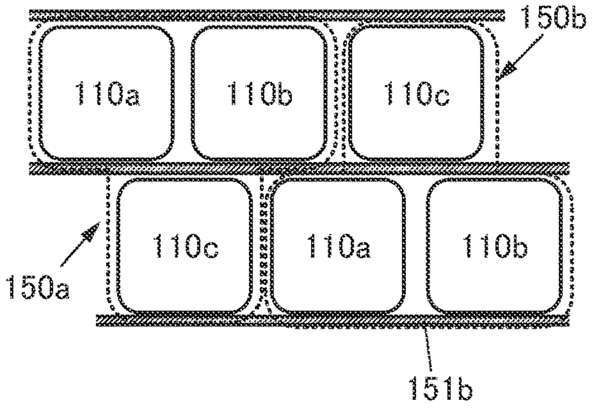

The pixel portion 103 illustrated in FIG. 8C includes the second wiring layer 151*b* as part of the auxiliary wiring, and a pixel 150*a* and a pixel 150*b* employ delta arrangement. In the delta arrangement, the pixel 150*a* includes two subpixels (the subpixel 110*a* and the subpixel 110*b*) in the upper row (first row) and one subpixel (the subpixel 110*c*) in the lower row (second row). The pixel 150*b* includes one subpixel (the subpixel 110*c*) in the upper row (first row) and two subpixels (the subpixel 110*a* and the subpixel 110*b*) in the lower row (second row).

Figure 9C:
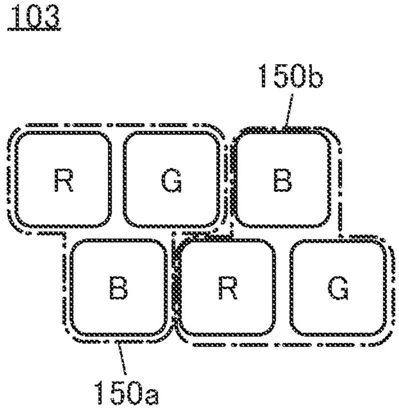

When color filters are used in the pixel portion 103 illustrated in FIG. 8C, the subpixel 110*a* can be the subpixel 110R that emits red light, the subpixel 110*b* can be the subpixel 110G that emits green light, and the subpixel 110*c* can be the subpixel 110B that emits blue light, as illustrated in FIG. 9C.

Figure 8D:
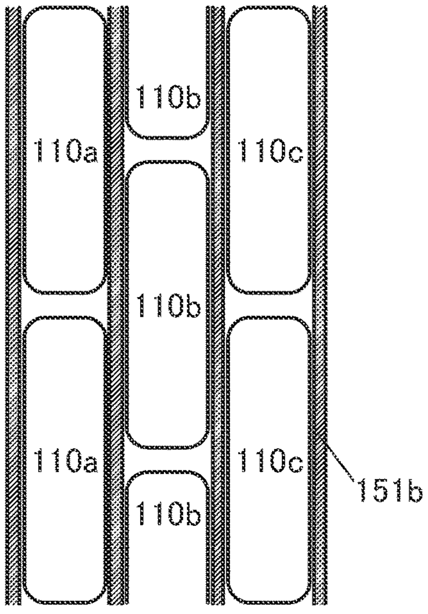

FIG. 8D illustrates an example in which the pixel portion 103 includes the second wiring layer 151*b* as part of the auxiliary wiring and the light-emitting devices of different colors are laid out in a zigzag manner. In the case of zigzag layout, the positions of the top sides of two subpixels arranged in the column direction (e.g., the subpixel 110*a* and the subpixel 110*b* or the subpixel 110*b* and the subpixel 110*c*) are not aligned in a top view.

Figure 9D:
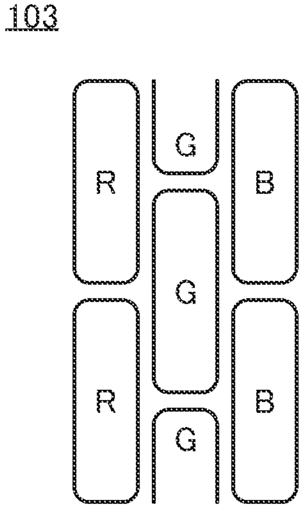

When color filters are used in the pixel portion 103 illustrated in FIG. 8D, the subpixel 110*a* can be the subpixel 110R that emits red light, the subpixel 110*b* can be the subpixel 110G that emits green light, and the subpixel 110*c* can be the subpixel 110B that emits blue light, as illustrated in FIG. 9D.

In a photolithography method, as a pattern to be formed by processing becomes finer, the influence of light diffraction becomes more difficult to ignore; accordingly, the fidelity in transferring a resist mask pattern by light exposure is degraded, and it becomes difficult to process a resist mask into a desired shape. Thus, a pattern with rounded corners is likely to be formed even when a resist mask pattern is rectangular. Consequently, the top surface shape of a light-emitting device may be a polygon with rounded corners, an ellipse, a circle, or the like, and also in the case where a light-emitting region is observed from above a color filter, the top surface shape of the light-emitting region is a polygon with rounded corners, an ellipse, a circle, or the like.

Furthermore, in the method for fabricating the display device of one embodiment of the present invention, the organic compound layer is processed using a resist mask. A resist mask formed over the organic compound layer needs to be cured at a temperature lower than the upper temperature limit of the organic compound layer. Thus, curing for the formation of the resist mask is insufficient in some cases depending on the upper temperature limit of the material of the organic compound layer and the curing temperature of a resist material. An insufficiently cured resist mask may have a shape different from a desired shape by processing. As a result, the top surface shape of the organic compound layer may be a polygon with rounded corners, an ellipse, a circle, or the like. For example, when a resist mask whose top surface shape is a square is intended to be formed, a resist mask whose top surface shape is a circle may be formed, and the top surface shape of the organic compound layer may be a circle.

To obtain a desired top surface shape of the organic compound layer, a technique of correcting a mask pattern in advance such that a transferred pattern agrees with a design pattern (OPC (Optical Proximity Correction) technique) may be used. Specifically, with the OPC technique, a pattern for correction is added to a corner portion or the like of a figure on a mask pattern.

This embodiment can be combined with any of the other embodiments as appropriate. In the case where a plurality of structure examples are described in one embodiment in this specification, the structure examples can be combined as appropriate.

Embodiment 4

In this embodiment, materials that can be used for a light-emitting device, for example, will be described.

[Light-Emitting Device]

<Electrode Material>

In a light-emitting device, it is preferable that a conductive film having a light-transmitting property be used for an electrode through which light is extracted and that a conductive film reflecting visible light be used for an electrode through which light is not extracted. An electrode having a light-transmitting property is referred to as a transparent electrode. An electrode having a reflective property is referred to as a reflective electrode. Light from the light-emitting device is reflected by the reflective electrode and extracted from a display device.

As a material that forms the electrodes of the light-emitting device, a metal, an alloy, an electrically conductive compound, a mixture thereof, and the like can be used. Specifically, a metal oxide such as an oxide containing indium and tin (also referred to as indium tin oxide), an oxide containing indium, silicon, and tin (also referred to as In—Si—Sn oxide), an oxide containing indium and zinc (also referred to as indium zinc oxide), or an oxide containing indium, tungsten, and zinc (also referred to as In—W—Zn oxide) can be used. An alloy may be used, and examples of the alloy include an alloy containing aluminum (also referred to as an aluminum alloy) such as an alloy of aluminum, nickel, and lanthanum (also referred to as an Al—Ni—La alloy), and an alloy of silver, palladium, and copper (Ag—Pd—Cu, also referred to as APC). It is also possible to use a metal selected from aluminum, titanium, chromium, manganese, iron, cobalt, nickel, copper, gallium, zinc, indium, tin, molybdenum, tantalum, tungsten, palladium, gold, platinum, silver, yttrium, neodymium, and the like; or an alloy containing two or more metals selected from these metals. It is also possible to use an element belonging to Group 1 or Group 2 of the periodic table (e.g., lithium, cesium, calcium, or strontium), a rare earth metal such as europium or ytterbium, or an alloy containing two or more selected from these elements and metals. Alternatively, graphene or the like can be used.

Among the above materials, a material that can release holes can be used as an anode, and a material that can release electrons can be used as a cathode.

<Microcavity Structure>

The light-emitting device preferably has a microcavity (micro-optical resonator) structure. The microcavity structure is a structure in which a specific wavelength $\lambda$ is resonated between an electrode on the side from which light is extracted (referred to as an extraction electrode) and an electrode facing the aforementioned electrode (referred to as a counter electrode). In order to obtain the microcavity structure, the extraction electrode and the counter electrode, i.e., a pair of electrodes of the light-emitting device, have the following structures.

<Extraction Electrode>

The extraction electrode has a structure in which a transparent electrode and a reflective electrode are stacked. That is, the extraction electrode contains a conductive material having a light-transmitting property and a conductive material having a light-reflecting property. Such an electrode is sometimes referred to as a transflective electrode. As the extraction electrode, a transparent electrode may be used.

<Counter Electrode>

As the counter electrode, a reflective electrode is used. Alternatively, the counter electrode may have a structure in which a reflective electrode and a transparent electrode are stacked. In the structure in which the reflective electrode and the transparent electrode are stacked, light passing through the transparent electrode is reflected by the reflective electrode, so that the microcavity structure can be obtained.

The specific wavelength $\lambda$ corresponds to the wavelength $\lambda$ of light extracted from a light-emitting device. Since the specific wavelength $\lambda$ to be extracted is different between light-emitting devices, the optical path length, specifically the distance between electrodes, varies in a display device having a microcavity structure. Note that the distance between electrodes corresponds to the distance between surfaces that reflect light. In the case of employing a stacked-layer structure of a reflective electrode and a transparent electrode, a surface that reflects light is the surface of the reflective electrode. Thus, the reflective surface of the reflective electrode is used as a starting point or an ending point of the distance between electrodes. Light-emitting devices with different distances between electrodes can be regarded as including organic compound layers with different thicknesses.

In order to resonate the specific wavelength $\lambda$, the optical path length is, for example, $n\lambda/2$ (where n is an integer greater than or equal to 1 and $\lambda$ is a wavelength of light to be resonated). In the above formula, the value of n may vary between the light-emitting devices. For example, the optical path length between electrodes in a subpixel that emits red light or a subpixel that emits green light may be determined with n being 1, and the optical path length between electrodes in a subpixel that emits blue light may be determined with n being 2.

Note that the light-emitting device can employ a combination of a tandem structure and a microcavity structure. In the case where the light-emitting device employs a combination of a tandem structure and a microcavity structure, the optical path length between the pair of electrodes, i.e., the distance between the pair of electrodes, increases in some cases. This might increase voltage applied between the pair of electrodes; thus, the optical path length between the pair of electrodes is preferably as short as possible. For example, in the case of a light-emitting device having a tandem structure, the thickness of one light-emitting unit is reduced as much as possible and the optical path length between a pair of electrodes is set to $n\lambda/2$. In the case of a tandem structure exhibiting white light emission, the optical path length between a pair of electrodes is set to a length that enables the wavelength $\lambda$ of light of a color exhibited through a color filter to be intensified.

In a microcavity structure, light with a wavelength that is not resonated is attenuated. Therefore, light with a small half width can be extracted from the light-emitting device. Light with a small half width has high directivity and is thus preferable, and light with high color purity can be extracted from the light-emitting device.

<Transparent Electrode>

The transparent electrode has a light transmittance higher than or equal to 40%. For example, the transparent electrode used in the light-emitting device preferably has a visible light (light with wavelengths greater than or equal to 400 nm and less than 750 nm) transmittance higher than or equal to 40%.

<Transflective Electrode>

The transflective electrode has a light reflectance higher than or equal to 10% and lower than or equal to 95%, preferably higher than or equal to 30% and lower than or equal to 80%. For example, the transflective electrode used in the light-emitting device preferably has a visible light (light with wavelengths greater than or equal to 400 nm and less than 750 nm) reflectance higher than or equal to 10% and lower than or equal to 95%, further preferably higher than or equal to 30% and lower than or equal to 80%.

<Reflective Electrode>

The reflective electrode has a light reflectance higher than or equal to 40% and lower than or equal to 100%, preferably higher than or equal to 70% and lower than or equal to 100%. For example, the reflective electrode used in the light-emitting device preferably has a visible light (light with wavelengths greater than or equal to 400 nm and less than 750 nm) reflectance higher than or equal to 40% and lower than or equal to 100%, further preferably higher than or equal to 70% and lower than or equal to 100%.

<Light-Emitting Layer>

An organic compound layer of a white-light-emitting device includes at least two light-emitting layers. The light-emitting layers can each contain one or more kinds of light-emitting substances. Examples of a color exhibited by the light-emitting substance include blue, violet, bluish violet, green, yellowish green, yellow, orange, and red. The light-emitting substances of the light-emitting layers included in the white-light-emitting device exhibit different colors. The colors exhibited are preferably complementary colors.

Examples of the light-emitting substance include a fluorescent material, a phosphorescent material, a TADF material, and a quantum dot material.

<Fluorescent Material>

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

<Phosphorescent Material>

Examples of the phosphorescent material include an organometallic complex (in particular, an iridium complex) having a 4H-triazole skeleton, a 1H-triazole skeleton, an imidazole skeleton, a pyrimidine skeleton, a pyrazine skeleton, or a pyridine skeleton; an organometallic complex (in particular, an iridium complex) having a phenylpyridine derivative including an electron-withdrawing group as a ligand; a platinum complex; and a rare earth metal complex.

A light-emitting substance contained in a light-emitting layer is sometimes referred to as a guest material, and the light-emitting layer may contain one or more host materials (sometimes referred to as assist materials) in addition to the guest material. As the host material, one or both of a hole-transport material and an electron-transport material can be used. As the host material, a bipolar material or a TADF material may also be used.

It is preferable that the light-emitting layer contain a phosphorescent material as the guest material and a hole-transport material and an electron-transport material as the host materials and that a combination of the hole-transport material and the electron-transport material easily form an exciplex, for example. With the light-emitting layer having such a structure, light emission can be efficiently obtained by ExTET (Exciplex-Triplet Energy Transfer), which is energy transfer from the exciplex to the phosphorescent material. Furthermore, when the combination of the materials is selected so as to form an exciplex that exhibits light emission whose wavelength overlaps with the wavelength on a lowest-energy-side absorption band of the phosphorescent material, energy can be transferred smoothly and light emission can be obtained efficiently. With the above structure, high efficiency, low-voltage driving, or a long lifetime of a light-emitting device can be achieved.

<Layer Other than Light-Emitting Layer>

The light-emitting device may further include, as a layer other than the light-emitting layer, a hole-injection layer, a hole-transport layer, a hole-blocking layer, an electron-transport layer, an electron-injection layer, an electron-blocking layer, or a layer containing a substance with a bipolar property (a substance with a high electron-transport property and a high hole-transport property) or the like.

<Hole-Injection Layer>

The hole-injection layer is a layer that injects holes from an anode to the hole-transport layer and contains a material with a high hole-injection property. Examples of the material with a high hole-injection property include an aromatic amine compound and a composite material containing a hole-transport material and an acceptor material (electron-accepting material).

<Hole-Transport Layer>

The hole-transport layer is a layer transporting holes, which are injected from the anode by the hole-injection layer, to the light-emitting layer. The hole-transport layer is a layer that contains a hole-transport material. As the hole-transport material, a substance having a hole mobility greater than or equal to $1\times10^{-6}$ $cm^2/Vs$ is preferable. Note that other substances can also be used as long as they have a hole-transport property higher than an electron-transport property. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

<Hole-Blocking Layer>

The hole-blocking layer is provided in contact with the light-emitting layer. The hole-blocking layer is a layer having an electron-transport property and containing a material that can block holes. Any of the materials having a hole-blocking property among the above electron-transport materials can be used for the hole-blocking layer.

The hole-blocking layer has an electron-transport property and thus can also be referred to as an electron-transport layer. A layer having a hole-blocking property among the electron-transport layers can also be referred to as a hole-blocking layer.

<Electron-Transport Layer>

The electron-transport layer is a layer transporting electrons, which are injected from the cathode by the electron-injection layer, to the light-emitting layer. The electron-transport layer is a layer that contains an electron-transport material. As the electron-transport material, a substance having an electron mobility greater than or equal to $1\times10^{-6}$ $cm^2/Vs$ is preferable. Note that other substances can also be used as long as they have an electron-transport property higher than a hole-transport property. As the electron-transport material, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

For example, a compound having an unshared electron pair and an electron deficient heteroaromatic ring can be used as another electron-transport material. Specifically, it is possible to use a compound having at least one of a pyridine ring, a diazine ring (a pyrimidine ring, a pyrazine ring, or a pyridazine ring), and a triazine ring.

Note that the lowest unoccupied molecular orbital (LUMO) level of an organic compound having an unshared electron pair is preferably higher than or equal to −3.6 eV and lower than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), 2,2-(1,3-phenylene)bis[9-phenyl-1,10-phenanthroline] (abbreviation: mPPhen2P), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition point (Tg) than BPhen and thus has high heat resistance.

<Electron-Injection Layer>

The electron-injection layer is a layer that injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

Examples of the alkali metal or the alkaline earth metal include lithium, cesium, and magnesium, and examples of the compound include lithium fluoride (LiF), cesium fluoride (CsF), calcium fluoride ($CaF_2$), a compound containing lithium and oxygen, and cesium carbonate. A typical example of the compound containing lithium and oxygen is lithium oxide ($Li_2O$).

Alternatively, an organic compound can be used as the material that can be used for the electron-injection layer. Examples of the organic compound include 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), 4,7-diphenyl-1,10-phenanthroline (abbreviation: BPhen), and 2,9-di(naphthalen-2-yl)-4,7-diphenyl-1,10-phenanthroline (abbreviation: NBPhen).

The organic compound may contain a dopant. A metal is used as the dopant; for example, silver (Ag) or ytterbium (Yb) can be used.

As the material that can be used for the electron-injection layer, a composite material containing the above alkali metal or alkaline earth metal and the above organic compound can also be used.

The electron-injection layer may have a stacked-layer structure of two or more layers. The above materials can be combined as appropriate for the stacked-layer structure. For example, it is possible to employ a structure in which lithium fluoride is used for a first layer and ytterbium is used for a second layer.

The above electron-transport material may be used for the electron-injection layer.

The electron-blocking layer is provided in contact with the light-emitting layer. The electron-blocking layer is a layer having a hole-transport property and containing a material that can block electrons. Any of the materials having an electron-blocking property among the above hole-transport materials can be used for the electron-blocking layer.

The electron-blocking layer has a hole-transport property and thus can also be referred to as a hole-transport layer. A layer having an electron-blocking property among the hole-transport layers can also be referred to as an electron-blocking layer.

<Charge-Generation Layer>

A white-light-emitting device includes at least two light-emitting layers, and a charge-generation layer is preferably provided between the light-emitting layers. The charge-generation layer is sometimes referred to as an intermediate layer and has functions of injecting electrons into a layer above the charge-generation layer and injecting holes into a layer below the charge-generation layer. The terms “above” and “below” are just examples and can be interchanged with each other.

For the charge-generation layer, for example, the material that can be used for the electron-injection layer can be used. For the charge-generation layer, for example, the material that can be used for the hole-injection layer can also be used. For the charge-generation layer, for example, a stack of the material that can be used for the electron-injection layer and the material that can be used for the hole-injection layer can also be used.

The charge-generation layer preferably contains an acceptor material, for example, the hole-transport material and the acceptor material that can be used for the hole-injection layer. In the charge-generation layer, the hole-transport material and the acceptor material may be mixed. In the charge-generation layer, a layer containing the hole-transport material and a layer containing the acceptor material may be stacked. In the case where the charge-generation layer is extremely thin and the layer containing the hole-transport material and the layer containing the acceptor material are stacked, a boundary therebetween is unclear.

The charge-generation layer preferably includes a layer containing a material with a high electron-injection property. The layer containing the material with a high electron-injection property can also be referred to as an electron-injection buffer layer. Providing the electron-injection buffer layer facilitates injection of electrons generated in the charge-generation layer into the electron-transport layer.

As the material with a high electron-injection property, the charge-generation layer preferably contains an alkali metal or an alkaline earth metal; for example, the charge-generation layer can contain an alkali metal compound or an alkaline earth metal compound. Specifically, an inorganic compound containing an alkali metal and oxygen or an inorganic compound containing an alkaline earth metal and oxygen is preferably contained, and an inorganic compound containing lithium and oxygen (e.g., lithium oxide ($Li_2O$)) is further preferably contained. Since having high diffusibility, an alkali metal or an alkaline earth metal is sometimes observed also in a functional layer other than the charge-generation layer.

In addition, the material that can be used for the electron-injection layer can be suitably used for the charge-generation layer.

The charge-generation layer preferably includes a layer containing a material with a high electron-transport property. The layer containing the material with a high electron-transport property can also be referred to as an electron-relay layer. Providing the electron-relay layer enables electrons to be smoothly transferred to the electron-transport layer or the electron-injection buffer layer.

As the material with a high electron-transport property, the charge-generation layer can contain a phthalocyanine-based material such as copper(II) phthalocyanine (abbreviation: CuPc) or a metal complex having a metal-oxygen bond and an aromatic ligand.

As the charge-generation layer, a layer containing the material with a high electron-transport property and a donor material can be used. In the charge-generation layer, the electron-transport material and the donor material may be mixed. In the charge-generation layer, a layer containing the electron-transport material and a layer containing the donor material may be stacked. In the case where the charge-generation layer is extremely thin and the layer containing the electron-transport material and the layer containing the donor material are stacked, a boundary therebetween is unclear.

Providing such a charge-generation layer can inhibit an increase in driving voltage of a white-light-emitting device.

As the organic compound contained in each of the layers of the light-emitting device, either a low molecular compound or a high molecular compound can be used. Furthermore, each of the layers included in the light-emitting device may contain an inorganic compound in addition to the organic compound.

<Common Layer of Light-Emitting Device>

As the common layer 114, one or more of a hole-injection layer, a hole-transport layer, a hole-blocking layer, an electron-blocking layer, an electron-transport layer, and an electron-injection layer can be used. For example, a hole-injection layer or an electron-injection layer is preferably used as the common layer 114. Note that the light-emitting device does not necessarily include the common layer 114.

<White-Light-Emitting Device>

Figure 10A:
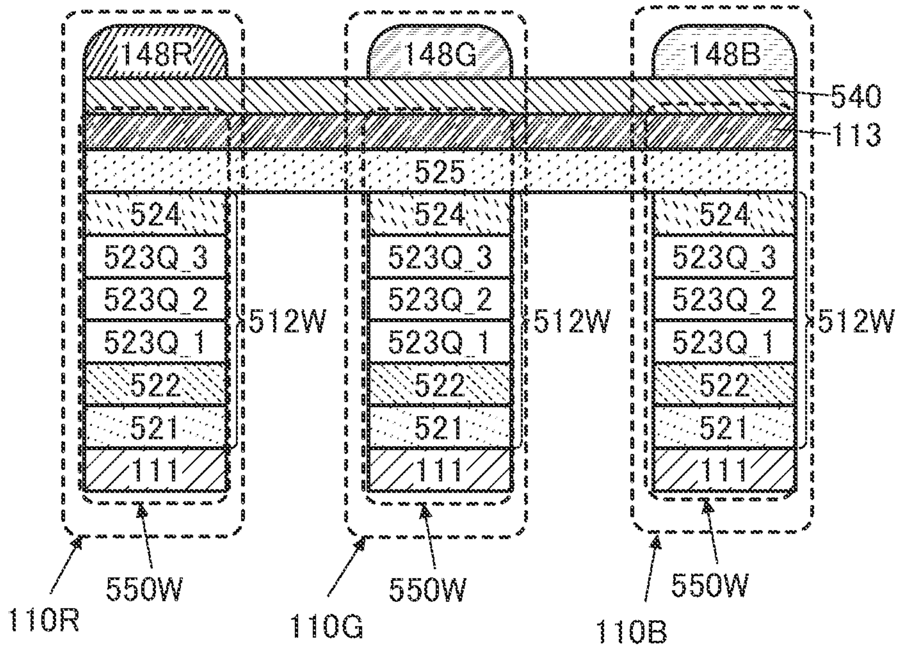
FIG. 10A and FIG. 10B are cross-sectional views illustrating examples of light-emitting devices.
Figure 10B:
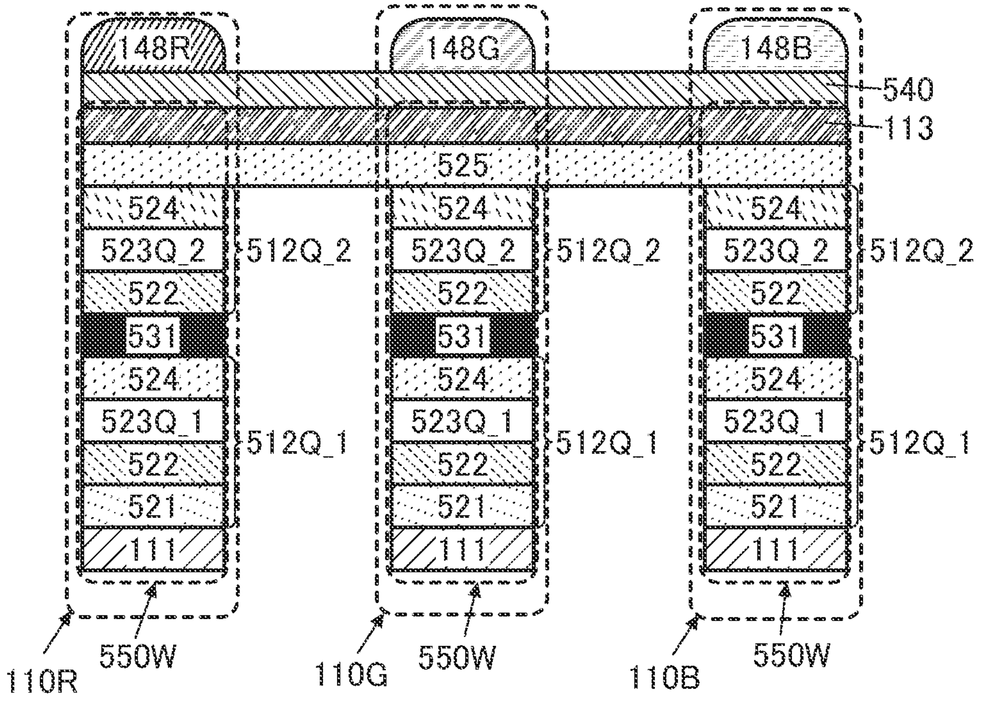

On the basis of the above materials, a structure of a white-light-emitting device will be described. FIG. 10A and FIG. 10B are conceptual diagrams of a white-light-emitting device 550W. The white-light-emitting device 550W can correspond to the light-emitting device 11W in the above embodiment.

The white-light-emitting device 550W illustrated in FIG. 10A includes a stack 512W between a pair of electrodes, i.e., between the lower electrode 111 and the common electrode 113. The stack 512W can correspond to the organic compound layer 112. The stack 512W includes at least two or more light-emitting layers. A stack including a light-emitting layer is sometimes referred to as a light-emitting unit.

The lower electrode 111 functions as a pixel electrode or an anode and is provided for each light-emitting device. The common electrode 113 functions as a cathode and is shared by a plurality of light-emitting devices.

In the white-light-emitting device 550W illustrated in FIG. 10A, a charge-generation layer is not positioned between the pair of electrodes. That is, the white-light-emitting device 550W illustrated in FIG. 10A includes one stack 512W, i.e., one light-emitting unit, between the pair of electrodes. Such a structure is referred to as a single structure.

The stack 512W includes a layer 521, a layer 522, a light-emitting layer 523Q_1, a light-emitting layer 523Q_2, a light-emitting layer 523Q_3, a layer 524, and the like. The white-light-emitting device 550W includes a layer 525 and the like between the stack 512W and the common electrode 113. The layer 525 is a common layer.

By providing one or more common layers as in FIG. 10A, the fabrication process can be simplified, resulting in a reduction in manufacturing cost. Note that the layer 525 is not necessarily used as a common layer and may be divided between the light-emitting devices.

The layer 521 includes a hole-injection layer, for example. The layer 522 includes a hole-transport layer, for example. The layer 524 includes an electron-transport layer, for example. The layer 525 includes an electron-injection layer, for example.

Alternatively, the layer 521 may include an electron-injection layer, the layer 522 may include an electron-transport layer, the layer 524 may include a hole-transport layer, and the layer 525 may include a hole-injection layer.

FIG. 10A illustrates the layer 521 and the layer 522 separately; however, one embodiment of the present invention is not limited thereto. For example, the layer 522 may be omitted when the layer 521 has functions of both a hole-injection layer and a hole-transport layer or the layer 521 has functions of both an electron-injection layer and an electron-transport layer.

In the white-light-emitting device 550W illustrated in FIG. 10A, the light-emitting layer 523Q_1, the light-emitting layer 523Q_2, and the light-emitting layer 523Q_3 are selected such that emission colors of these light-emitting layers are complementary colors, whereby white light emission can be obtained from the white-light-emitting device 550W. Although the example in which the stack 512W includes three light-emitting layers is illustrated here, the number of light-emitting layers is not limited; for example, two layers whose emission colors are complementary colors may be included.

When the color filter 148R, the color filter 148G, and the color filter 148B are provided to overlap with the white-light-emitting devices 550W, red light, green light, and blue light can be emitted from the respective pixels to perform full-color display.

A protective layer 540 is preferably provided between the white-light-emitting devices 550W and the color filter 148R, the color filter 148G, and the color filter 148B. The protective layer 540 can be a common layer.

The subpixel 110R includes at least the white-light-emitting device 550W and the color filter 148R. The subpixel 110G includes at least the white-light-emitting device 550W and the color filter 148G. The subpixel 1101B includes at least the white-light-emitting device 550W and the color filter 148B.

The layers 521, the layers 522, the layers 524, the layer 525, the light-emitting layers 523Q_1, the light-emitting layers 523Q_2, and the light-emitting layers 523Q_3 in the pixels of different colors each have the same structure (material, thickness, and the like) and thus light of a single color is emitted; however, full-color display can be performed by providing color filters. Consequently, in the display device of one embodiment of the present invention, the light-emitting devices do not need to be formed separately for the pixels; hence, the fabrication process can be simplified and the manufacturing cost can be reduced.

The white-light-emitting device 550W illustrated in FIG. 10B has a structure in which two stacks (a stack 512Q_1 and a stack 512Q_2) are stacked between the pair of electrodes and the charge-generation layer 531 is positioned between the stacks. Each of the stack 512Q_1 and the stack 512Q_2 includes a light-emitting layer and thus is sometimes referred to as a light-emitting unit.

The charge-generation layer 531 has functions of injecting electrons into one of the stack 512Q_1 and the stack 512Q_2 and injecting holes into the other when voltage is applied between the lower electrode 111 and the common electrode 113.

The stack 512Q_1 includes the layer 521, the layer 522, the light-emitting layer 523Q_1, the layer 524, and the like. The stack 512Q_2 includes the layer 522, the light-emitting layer 523Q_2, the layer 524, and the like. The white-light-emitting device 550W includes the layer 525 and the like between the stack 512Q_2 and the common electrode 113.

In the white-light-emitting device 550W illustrated in FIG. 10B, the light-emitting layer 523Q_1 and the light-emitting layer 523Q_2 are selected such that emission colors of these light-emitting layers are complementary colors, whereby white light emission can be obtained from the white-light-emitting device 550W. The light-emitting layers 523Q_1 and 523Q_2 each preferably contain a light-emitting substance that emits light of R (red), G (green), B (blue), Y (yellow), O (orange), or the like. Alternatively, light emitted from light-emitting substances contained in the light-emitting layers 523Q_1 and 523Q_2 preferably contains two or more of color spectral components of R, G, and B.

Described here are examples of the combination of emission colors of the light-emitting layers included in the light-emitting units that can be used for the white-light-emitting device 550W.

For example, the white-light-emitting device 550W can be obtained when one of the light-emitting units emits red and green light and the other light-emitting unit emits blue light. It is preferable that one of the light-emitting units correspond to the stack 512Q_2 and the other light-emitting unit correspond to the stack 512Q_1. The light-emitting layer 523Q_2 included in the stack 512Q_2 is illustrated as a single layer but may be a stack of layers. Note that the terms "one" and "the other" are just examples and can be interchanged with each other.

For another example, the white-light-emitting device 550W can be obtained when one of the light-emitting units emits yellow or orange light and the other light-emitting unit emits blue light. It is preferable that one of the light-emitting units correspond to the stack 512Q_2 and the other light-emitting unit correspond to the stack 512Q_1. The light-emitting layer 523Q_2 included in the stack 512Q_2 is illustrated as a single layer but may be a stack of layers. Note that the terms "one" and "the other" are just examples and can be interchanged with each other.

In the case where the white-light-emitting device 550W includes three light-emitting units between which the charge-generation layers are positioned, for example, the white-light-emitting device 550W can be obtained with the use of a light-emitting layer emitting red light in a first light-emitting unit, a light-emitting layer emitting green light in a second light-emitting unit, and a light-emitting layer emitting blue light in a third light-emitting unit.

For another example, the white-light-emitting device 550W can be obtained with the use of a light-emitting layer emitting blue light in the first light-emitting unit, a light-emitting layer emitting yellow light, yellowish green light, or green light in the second light-emitting unit, and a light-emitting layer emitting blue light in the third light-emitting unit.

For another example, the white-light-emitting device 550W can be obtained with the use of a light-emitting layer emitting blue light in the first light-emitting unit, a stacked-layer structure of a light-emitting layer emitting red light and a light-emitting layer emitting yellow light, yellowish green light, or green light in the second light-emitting unit, and a light-emitting layer emitting blue light in the third light-emitting unit.

In the case where the white-light-emitting device 550W includes four light-emitting units, for example, the white-light-emitting device 550W can be obtained with the use of a light-emitting layer emitting blue light in a first light-emitting unit, a light-emitting layer emitting red light in one of a second light-emitting unit and a third light-emitting unit, a light-emitting layer emitting yellow light, yellowish green light, or green light in the other, and a light-emitting layer emitting blue light in a fourth light-emitting unit.

Like the white-light-emitting device 550W illustrated in FIG. 10B and the like, a light-emitting device having a tandem structure in which a plurality of light-emitting units are connected in series with the charge-generation layer 531 therebetween can emit light at high luminance. Furthermore, a tandem structure allows the amount of current needed for obtaining the same luminance to be reduced as compared to the case of using a single structure; thus, the display device can have lower power consumption and higher reliability.

Note that each of the stacks 512Q_1 and 512Q_2 is not limited to including one light-emitting layer, and the numbers of light-emitting layers in the stacks 512Q_1 and 512Q_2 are not particularly limited. For example, the numbers of light-emitting layers included in the stacks 512Q_1 and 512Q_2 may be different from each other. For example, one of the light-emitting units may include two light-emitting layers, and the other light-emitting unit may include one light-emitting layer.

Figure 11A:
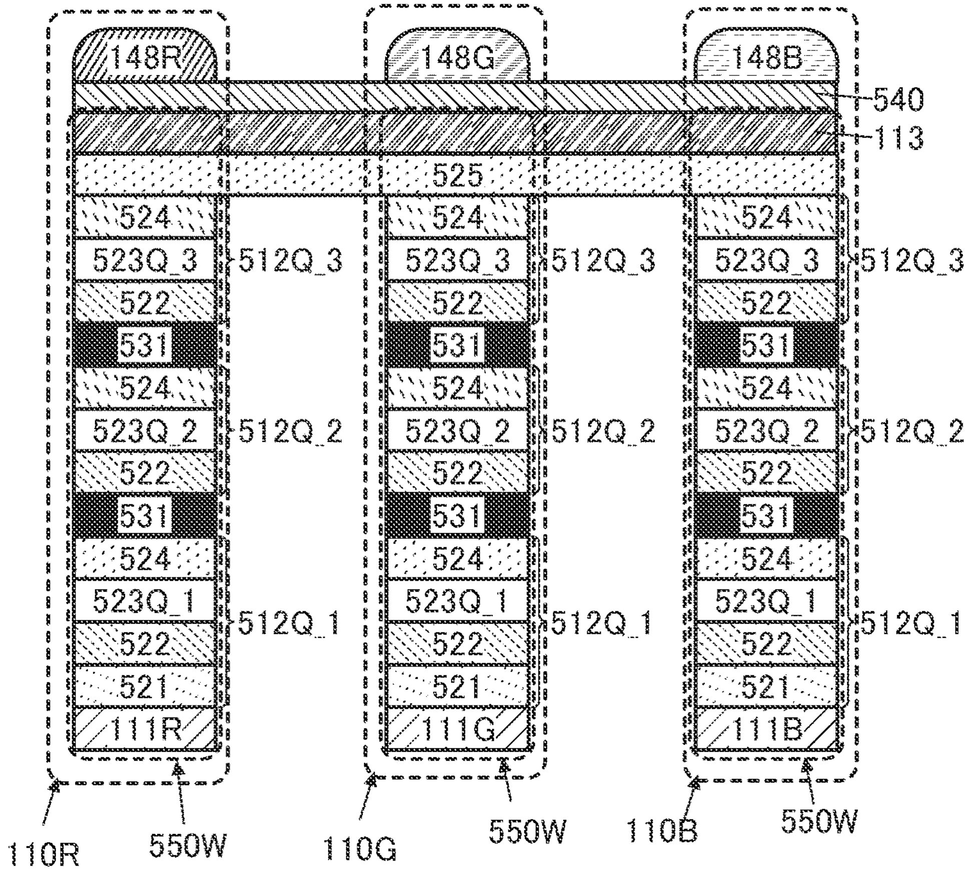
FIG. 11A and FIG. 11B are cross-sectional views illustrating examples of light-emitting devices.

FIG. 11A illustrates an example of the case where the white-light-emitting device 550W has a structure in which three light-emitting units are stacked. The three light-emitting units are stacked with the charge-generation layers 531 therebetween. A stack 512Q_3 includes the layer 522, the light-emitting layer 523Q_3, the layer 524, and the like. The stack 512Q_3 can have the same structure as the stack 512Q_2.

In the case where the light-emitting device has a tandem structure, the number of light-emitting units that are stacks is not particularly limited and can be two or more.

Figure 11B:
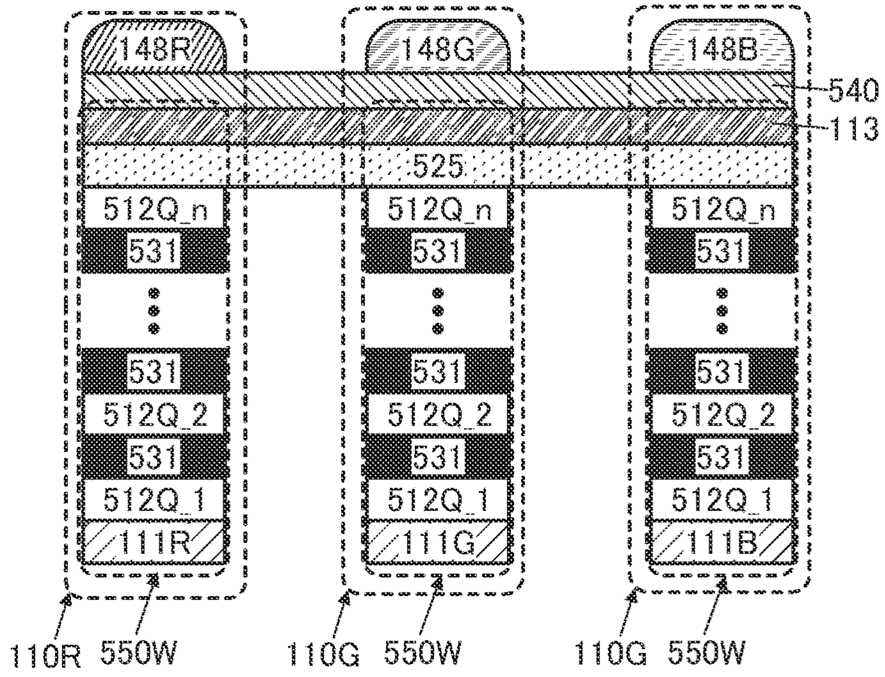

FIG. 11B illustrates an example of the case where n stacks 512Q_1 to 512Q n (n is an integer greater than or equal to 2) are stacked.

When the number of stacked light-emitting units that are stacks is increased in the above manner, luminance obtained from the light-emitting device with the same amount of current can be increased in accordance with the number of stacked layers. Moreover, increasing the number of stacked light-emitting units can reduce the amount of current needed for obtaining the same luminance; thus, power consumption of the light-emitting device can be reduced in accordance with the number of stacked layers.

Note that light-emitting materials of the light-emitting layers in the white-light-emitting device are not particularly limited. For example, a structure can be employed in which the light-emitting layer 523Q_1 included in the stack 512Q_1 contains a phosphorescent material and the light-emitting layer 523Q_2 included in the stack 512Q_2 contains a fluorescent material. Alternatively, a structure can be employed in which the light-emitting layer 523Q_1 included in the stack 512Q_1 contains a fluorescent material and the light-emitting layer 523Q_2 included in the stack 512Q_2 contains a phosphorescent material.

Note that the light-emitting materials of the light-emitting layers are not limited to the above materials. The white-light-emitting device may have a structure in which, for example, the light-emitting layer 523Q_1 included in the stack 512Q_1 contains a TADF material and the light-emitting layer 523Q_2 included in the stack 512Q_2 contains one of a fluorescent material and a phosphorescent material. Using different light-emitting materials, e.g., using a combination of a highly reliable light-emitting material and a light-emitting material with high emission efficiency, can compensate for their disadvantages and enables the display device to have both higher reliability and higher emission efficiency.

Note that in the white-light-emitting device, all the light-emitting layers may contain a fluorescent material or all the light-emitting layers may contain a phosphorescent material.

This embodiment can be combined with any of the other embodiments as appropriate. In the case where a plurality of structure examples are described in one embodiment in this specification, the structure examples can be combined as appropriate.

Embodiment 5

In this embodiment, a display device will be described.

[Structure Example of Display Device]

Figure 12A:
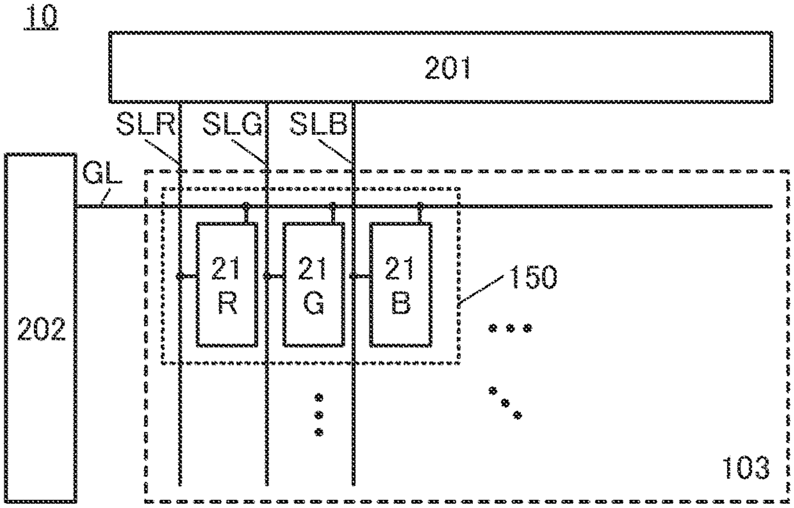
FIG. 12A is a conceptual diagram of a display device.

FIG. 12A illustrates a block diagram of a display device 10. The display device 10 includes the pixel portion 103, a driver circuit portion 201, a driver circuit portion 202, and the like.

The pixel portion 103 includes the plurality of pixels 150 laid out in a matrix. Each of the pixels 150 includes a subpixel 21R, a subpixel 21G, and a subpixel 21B.

The pixel 150 is electrically connected to a wiring GL, a wiring SLR, a wiring SLG, and a wiring SLB. The wiring SLR, the wiring SLG, and the wiring SLB are electrically connected to the driver circuit portion 201. The wiring GL is electrically connected to the driver circuit portion 202. The driver circuit portion 201 functions as a source line driver circuit (also referred to as a source driver), and the driver circuit portion 202 functions as a gate line driver circuit (also referred to as a gate driver). The wiring GL functions as a gate line, and the wiring SLR, the wiring SLG, and the wiring SLB each function as a source line.

The subpixel 21R emits red light. The subpixel 21G emits green light. The subpixel 21B emits blue light. Thus, the display device 10 can perform full-color display. Note that the pixel 150 may include a subpixel that emits light of another color. For example, the pixel 150 may include, in addition to the three subpixels, a subpixel that emits white light, a subpixel that emits yellow light, or the like.

The wiring GL is electrically connected to the subpixel 21R, the subpixel 21G, and the subpixel 21B arranged in the row direction (an extending direction of the wiring GL). The wiring SLR, the wiring SLG, and the wiring SLB are electrically connected to the subpixels 21R, the subpixels 21G, and the subpixels 21B (not illustrated), respectively, arranged in the column direction (an extending direction of the wiring SLR and the like).

[Structure Example of Pixel Circuit]

Figure 12B:
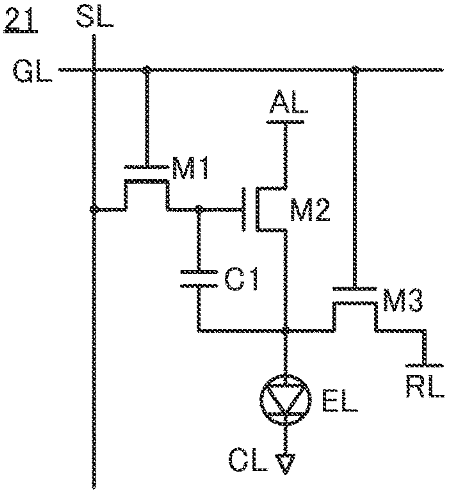
FIG. 12B to FIG. 12E are circuit diagrams.

FIG. 12B illustrates an example of a circuit diagram of the pixel 150 that can be used as the subpixel 21R, the subpixel 21G, and the subpixel 21B. The pixel 150 includes a transistor M1, a transistor M2, a transistor M3, a capacitor C1, and a light-emitting device EL. The wiring GL and a wiring SL are electrically connected to the pixel 150. The wiring SL corresponds to any of the wiring SLR, the wiring SLG, and the wiring SLB illustrated in FIG. 12A. A gate of the transistor M1 is electrically connected to the wiring GL, one of a source and a drain of the transistor M1 is electrically connected to the wiring SL, and the other of the source and the drain of the transistor M1 is electrically connected to one electrode of the capacitor C1 and agate of the transistor M2. One of a source and a drain of the transistor M2 is electrically connected to a wiring AL, and the other of the source and the drain of the transistor M2 is electrically connected to one electrode of the light-emitting device EL, the other electrode of the capacitor C1, and one of a source and a drain of the transistor M3. A gate of the transistor M3 is electrically connected to the wiring GL, and the other of the source and the drain of the transistor M3 is electrically connected to a wiring RL. The other electrode of the light-emitting device EL is electrically connected to a wiring CL.

A data potential D is supplied to the wiring SL. A selection signal is supplied to the wiring GL. The selection signal includes a potential for bringing a transistor into a conducting state and a potential for bringing a transistor into a non-conducting state.

A reset potential is supplied to the wiring RL. An anode potential is supplied to the wiring AL. A cathode potential is supplied to the wiring CL. In the pixel 150, the anode potential is a potential higher than the cathode potential. The reset potential supplied to the wiring RL can be set such that a potential difference between the reset potential and the cathode potential is lower than the threshold voltage of the light-emitting device EL. The reset potential can be a potential higher than the cathode potential, a potential equal to the cathode potential, or a potential lower than the cathode potential.

The transistor M1 and the transistor M3 each function as a switch. The transistor M2 functions as a transistor for controlling current flowing through the light-emitting device EL. For example, it can be said that the transistor M1 functions as a selection transistor and the transistor M2 functions as a driving transistor.

Here, it is preferable to use LTPS transistors as all of the transistor M1 to the transistor M3. Alternatively, it is preferable to use OS transistors as the transistor M1 and the transistor M3 and to use an LTPS transistor as the transistor M2.

Alternatively, OS transistors may be used as all of the transistor M1 to the transistor M3. In that case, an LTPS transistor can be used as at least one of a plurality of transistors included in the driver circuit portion 201 and a plurality of transistors included in the driver circuit portion 202, and OS transistors can be used as the other transistors. For example, OS transistors can be used as the transistors provided in the pixel portion 103, and LTPS transistors can be used as the transistors provided in the driver circuit portion 201 and the driver circuit portion 202.

As the OS transistor, a transistor containing an oxide semiconductor in a semiconductor layer where a channel is formed can be used. The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin. It is particularly preferable to use an oxide containing indium, gallium, and zinc (also referred to as IGZO) for the semiconductor layer of the OS transistor. Alternatively, it is preferable to use an oxide containing indium, tin, and zinc. Further alternatively, it is preferable to use an oxide containing indium, gallium, tin, and zinc.

A transistor containing an oxide semiconductor having a wider band gap and a lower carrier concentration than silicon can achieve an extremely low off-state current. Accordingly, such a low off-state current enables long-term retention of charge accumulated in a capacitor that is connected to the transistor in series. Thus, it is particularly preferable to use a transistor containing an oxide semiconductor as the transistor M1 and the transistor M3 each of which is connected to the capacitor C1 in series. The use of the transistor containing an oxide semiconductor as each of the transistor M1 and the transistor M3 can prevent leakage of charge retained in the capacitor C1 through the transistor M1 or the transistor M3. Furthermore, since charge retained in the capacitor C1 can be retained for a long time, a still image can be displayed for a long time without rewriting data in the pixel 150.

Although the transistors are illustrated as n-channel transistors in FIG. 12B, a p-channel transistor can also be used.

The transistors included in the pixel 150 are preferably formed to be arranged over the same substrate.

Transistors each including a pair of gates overlapping with each other with a semiconductor layer therebetween can be used as the transistors included in the pixel 150.

In the transistor including a pair of gates, the same potential is supplied to the pair of gates electrically connected to each other, which brings advantage that the transistor can have a higher on-state current and improved saturation characteristics. A potential for controlling the threshold voltage of the transistor may be supplied to one of the pair of gates. Furthermore, when a constant potential is supplied to one of the pair of gates, the stability of the electrical characteristics of the transistor can be improved. For example, one of the gates of the transistor may be electrically connected to a wiring to which a constant potential is supplied or may be electrically connected to a source or a drain of the transistor.

Figure 12C:
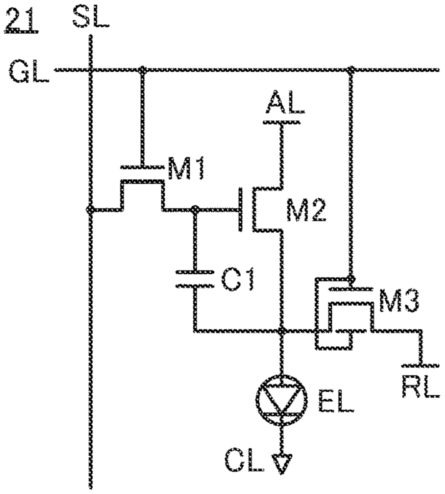

The pixel 150 illustrated in FIG. 12C is an example of the case where a transistor including a pair of gates is used as the transistor M3. The gates of the transistor M3 are electrically connected to each other. Such a structure can shorten the period in which data is written to the pixel 150.

Figure 12D:
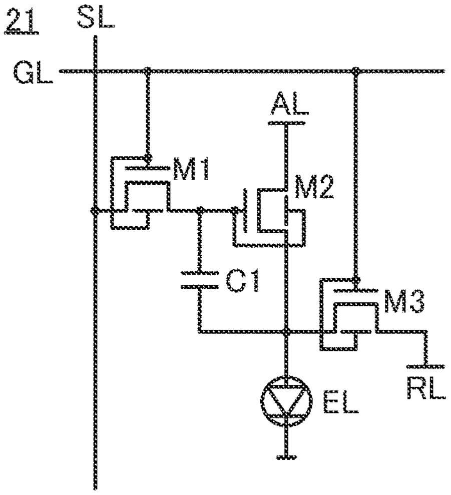

The pixel 150 illustrated in FIG. 12D is an example in which a transistor including a pair of gates is used also as each of the transistor M1 and the transistor M2 in addition to the transistor M3. In each of the transistors, the pair of gates are electrically connected to each other. When such a transistor is used at least as the transistor M2, the saturation characteristics are improved, so that the emission luminance of the light-emitting device EL can be controlled easily and the display quality can be improved.

Figure 12E:
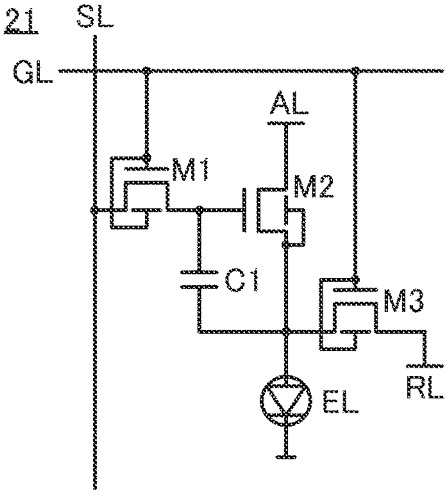

The pixel 150 illustrated in FIG. 12E is an example of the case where one of the pair of gates of the transistor M2 in the pixel 150 illustrated in FIG. 12D is electrically connected to the source of the transistor M2.

STRUCTURE EXAMPLE OF TRANSISTOR

Cross-sectional structure examples of the transistor will be described below.

Structure Example 1

Figure 13A:
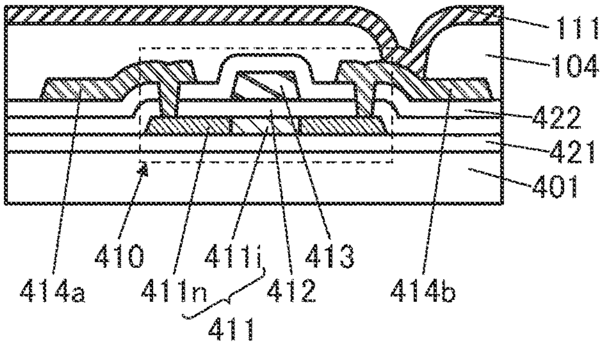
FIG. 13A to FIG. 13D are cross-sectional views of transistors.

FIG. 13A is a cross-sectional view including a transistor 410.

The transistor 410 is provided over a substrate 401 and contains polycrystalline silicon in its semiconductor layer. The transistor 410 corresponds to the transistor M2 in the pixel 150, for example. That is, FIG. 13A illustrates an example in which one of a source and a drain of the transistor 410 is electrically connected to the lower electrode 111 of the light-emitting device.

The transistor 410 includes a semiconductor layer 411, an insulating layer 412, a conductive layer 413, and the like. The semiconductor layer 411 includes a channel formation region 411*i* and low-resistance regions 411*n*. The semiconductor layer 411 contains silicon. The semiconductor layer 411 preferably contains polycrystalline silicon. Part of the insulating layer 412 functions as agate insulating layer. Part of the conductive layer 413 functions as agate electrode.

Note that the semiconductor layer 411 can include a metal oxide exhibiting semiconductor characteristics (also referred to as an oxide semiconductor). In that case, the transistor 410 can be referred to as an OS transistor.

The low-resistance regions 411*n* are each a region containing an impurity element. For example, in the case where the transistor 410 is an n-channel transistor, phosphorus, arsenic, or the like is added to the low-resistance regions 411*n*. Meanwhile, in the case where the transistor 410 is a p-channel transistor, boron, aluminum, or the like is added to the low-resistance regions 411*n*. In addition, in order to control the threshold voltage of the transistor 410, the above-described impurity may be added to the channel formation region 411*i*.

An insulating layer 421 is provided over the substrate 401. The semiconductor layer 411 is provided over the insulating layer 421. The insulating layer 412 is provided to cover the semiconductor layer 411 and the insulating layer 421. The conductive layer 413 is provided in a position that is over the insulating layer 412 and overlaps with the semiconductor layer 411.

An insulating layer 422 is provided to cover the conductive layer 413 and the insulating layer 412. A conductive layer 414*a* and a conductive layer 414*b* are provided over the insulating layer 422. The conductive layer 414*a* and the conductive layer 414*b* are electrically connected to the low-resistance regions 411*n* in opening portions provided in the insulating layer 422 and the insulating layer 412. Part of the conductive layer 414*a* functions as one of a source electrode and a drain electrode, and part of the conductive layer 414*b* functions as the other of the source electrode and the drain electrode. The insulating layer 104 is provided to cover the conductive layer 414*a*, the conductive layer 414*b*, and the insulating layer 422.

The lower electrode 111 functioning as a pixel electrode is provided over the insulating layer 104. The lower electrode 111 is provided over the insulating layer 104 and is electrically connected to the conductive layer 414*b* in an opening provided in the insulating layer 104. Although not illustrated here, an EL layer and a common electrode can be stacked over the lower electrode 111.

Structure Example 2

Figure 13B:
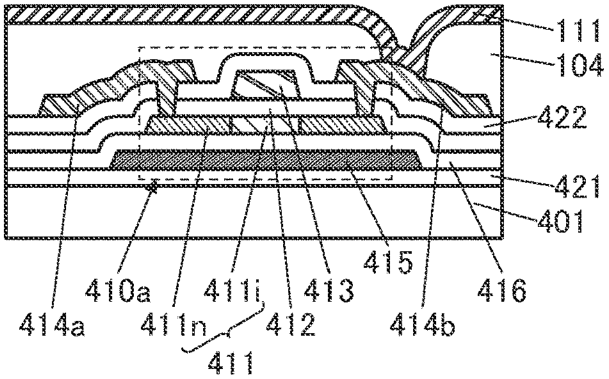

FIG. 13B illustrates a transistor 410*a* including a pair of gate electrodes. The transistor 410*a* illustrated in FIG. 13B is different from the transistor in FIG. 13A mainly in including a conductive layer 415 and an insulating layer 416.

The conductive layer 415 is provided over the insulating layer 421. The insulating layer 416 is provided to cover the conductive layer 415 and the insulating layer 421. The semiconductor layer 411 is provided such that at least the channel formation region 411*i* overlaps with the conductive layer 415 with the insulating layer 416 therebetween.

In the transistor 410*a* illustrated in FIG. 13B, part of the conductive layer 413 functions as a first gate electrode, and part of the conductive layer 415 functions as a second gate electrode. At this time, part of the insulating layer 412 functions as a first gate insulating layer, and part of the insulating layer 416 functions as a second gate insulating layer.

Here, to electrically connect the first gate electrode to the second gate electrode, the conductive layer 413 is electrically connected to the conductive layer 415 through an opening portion provided in the insulating layer 412 and the insulating layer 416 in a region not illustrated. To electrically connect the second gate electrode to a source or a drain, the conductive layer 415 is electrically connected to the conductive layer 414*a* or the conductive layer 414*b* through an opening portion provided in the insulating layer 422, the insulating layer 412, and the insulating layer 416 in a region not illustrated.

In the case of using LTPS transistors as all of the transistors included in the pixels 150, the transistor 410 exemplified in FIG. 13A or the transistor 410*a* exemplified in FIG. 13B can be used. In that case, the transistors 410*a* may be used as all of the transistors included in the pixels 150, the transistors 410 may be used as all of the transistors, or the transistors 410*a* and the transistors 410 may be used in combination.

Structure Example 3

Described below is an example of a structure including both a transistor containing silicon in its semiconductor layer and a transistor containing a metal oxide in its semiconductor layer.

Figure 13C:
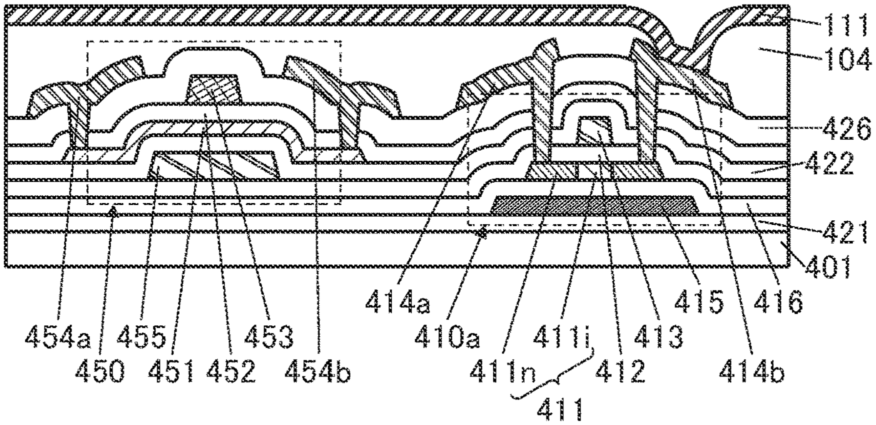

FIG. 13C is a cross-sectional view including the transistor 410*a* and a transistor 450.

Structure example 1 described above can be referred to for the transistor 410*a*. Although an example of using the transistor 410*a* is illustrated here, a structure including the transistor 410 and the transistor 450 or a structure including all the transistor 410, the transistor 410*a*, and the transistor 450 may alternatively be employed.

The transistor 450 is a transistor containing a metal oxide in its semiconductor layer. The structure illustrated in FIG. 13C is an example in which the transistor 450 and the transistor 410*a* respectively correspond to the transistor M1 and the transistor M2 in the pixel 150. That is, FIG. 13C illustrates an example in which one of a source and a drain of the transistor 410*a* is electrically connected to the lower electrode 111.

Moreover, FIG. 13C illustrates an example in which the transistor 450 includes a pair of gates.

The transistor 450 includes a conductive layer 455, the insulating layer 422, a semiconductor layer 451, an insulating layer 452, a conductive layer 453, and the like. Part of the conductive layer 453 functions as a first gate of the transistor 450, and part of the conductive layer 455 functions as a second gate of the transistor 450. In that case, part of the insulating layer 452 functions as a first gate insulating layer of the transistor 450, and part of the insulating layer 422 functions as a second gate insulating layer of the transistor 450.

The conductive layer 455 is provided over the insulating layer 412. The insulating layer 422 is provided to cover the conductive layer 455. The semiconductor layer 451 is provided over the insulating layer 422. The insulating layer 452 is provided to cover the semiconductor layer 451 and the insulating layer 422. The conductive layer 453 is provided over the insulating layer 452 and includes a region overlapping with the semiconductor layer 451 and the conductive layer 455.

An insulating layer 426 is provided to cover the insulating layer 452 and the conductive layer 453. A conductive layer 454*a* and a conductive layer 454*b* are provided over the insulating layer 426. The conductive layer 454*a* and the conductive layer 454*b* are electrically connected to the semiconductor layer 451 in opening portions provided in the insulating layer 426 and the insulating layer 452. Part of the conductive layer 454*a* functions as one of a source electrode and a drain electrode, and part of the conductive layer 454*b* functions as the other of the source electrode and the drain electrode. The insulating layer 104 is provided to cover the conductive layer 454*a*, the conductive layer 454*b*, and the insulating layer 426.

Here, the conductive layer 414*a* and the conductive layer 414*b* electrically connected to the transistor 410*a* are preferably formed by processing the same conductive film as the conductive layer 454*a* and the conductive layer 454*b*. In FIG. 13C, the conductive layer 414*a*, the conductive layer 414*b*, the conductive layer 454*a*, and the conductive layer 454*b* are formed on the same plane (i.e., in contact with the top surface of the insulating layer 426) and contain the same metal element. In that case, the conductive layer 414*a* and the conductive layer 414*b* are electrically connected to the low-resistance regions 411*n* through openings provided in the insulating layer 426, the insulating layer 452, the insulating layer 422, and the insulating layer 412. This is preferable because the fabrication process can be simplified.

Moreover, the conductive layer 413 functioning as the first gate electrode of the transistor 410*a* and the conductive layer 455 functioning as the second gate electrode of the transistor 450 are preferably formed by processing the same conductive film. FIG. 13C illustrates a structure in which the conductive layer 413 and the conductive layer 455 are formed on the same plane (i.e., in contact with the top surface of the insulating layer 412) and contain the same metal element. This is preferable because the fabrication process can be simplified.

Figure 13D:
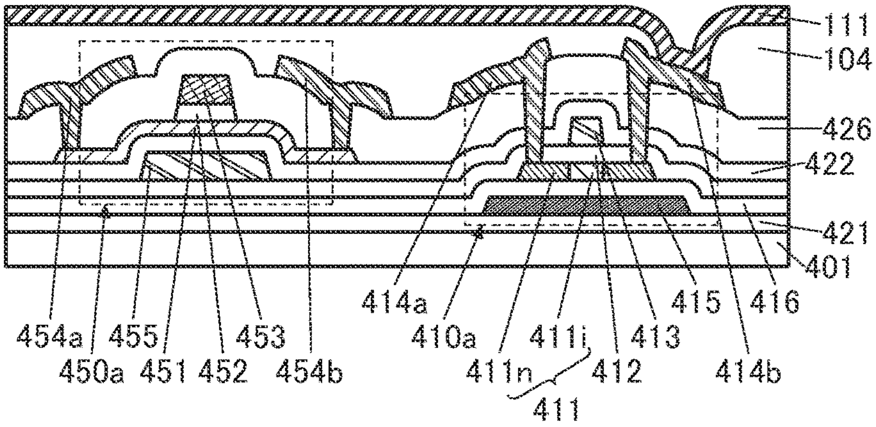

In the structure in FIG. 13C, the insulating layer 452 functioning as the first gate insulating layer of the transistor 450 covers the end portion of the semiconductor layer 451; however, the insulating layer 452 may be processed to have the same or substantially the same top surface shape as the conductive layer 453 as in the transistor 450*a* illustrated in FIG. 13D.

Note that in this specification and the like, the expression "top surface shapes are substantially the same" means that at least outlines of stacked layers partly overlap with each other. For example, the case of processing an upper layer and a lower layer with the use of the same mask pattern or mask patterns that are partly the same is included. However, in some cases, the outlines do not completely overlap with each other and the upper layer is positioned inward from the lower layer or the upper layer is positioned outward from the lower layer; such cases are also represented by the expression "top surface shapes are substantially the same".

Although the example in which the transistor 410*a* corresponds to the transistor M2 and is electrically connected to the pixel electrode is illustrated here, one embodiment of the present invention is not limited thereto. For example, a structure in which the transistor 450 or the transistor 450*a* corresponds to the transistor M2 may be employed. In that case, the transistor 410*a* corresponds to the transistor M1, the transistor M3, or another transistor.

By including the above pixel circuit and having the structure of the light-emitting device described in the above embodiment, the display device can display an image with any one or more of image crispness, image sharpness, high chroma, and a high contrast ratio. The display device is preferable; leakage current that might flow through the transistors in the pixel circuit is extremely low and lateral leakage current between the light-emitting devices in the above embodiment is extremely low, leading to little leakage of light or the like at the time of black display.

This embodiment can be combined with any of the other embodiments as appropriate. In the case where a plurality of structure examples are described in one embodiment in this specification, the structure examples can be combined as appropriate.

Embodiment 6

In this embodiment, a display device including a light-receiving device (also referred to as a light-receiving element) will be described.

A pixel portion may include a light-receiving device in addition to a light-emitting device, in which case a display device having a light-receiving function can be provided. The display device having a light-receiving function can detect touch or approach of an object while displaying an image. A region where the light-receiving device is positioned is referred to as a light-receiving portion, and the light-receiving portion also includes a switching element that controls the light-receiving device. The light-receiving device controlled by the switching element can detect one or both of visible light and infrared light. Specifically, the light-receiving device has a function of receiving light from a light source and can convert the received light into an electric signal.

As a visible light source, light from the light-emitting device can be used. In the case of using the light-emitting device, a wavelength of green light obtained through a green color filter is preferably used because the light-receiving sensitivity is high. When some of the light-emitting devices emit light as a light source, an image may be displayed by the remaining subpixels. As an infrared light source, an infrared light source positioned outside the pixel portion can be used.

Figure 14A:
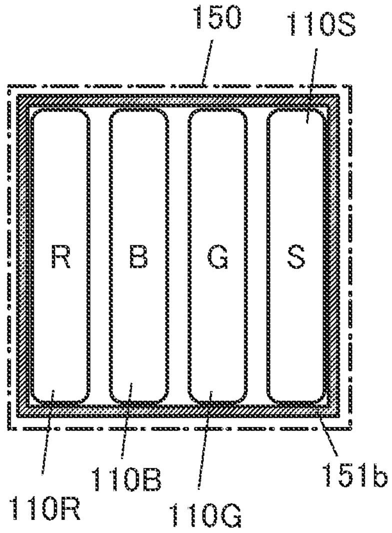
FIG. 14A to FIG. 14C are top views of a pixel portion.
Figure 14B:
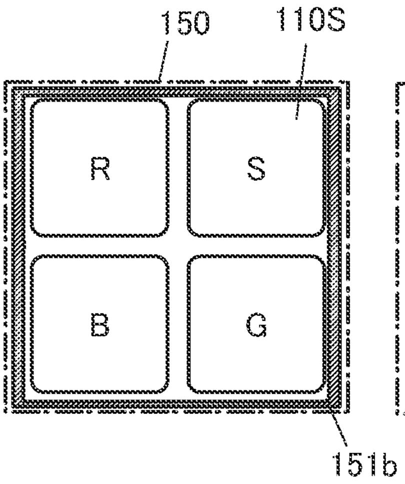
Figure 14C:
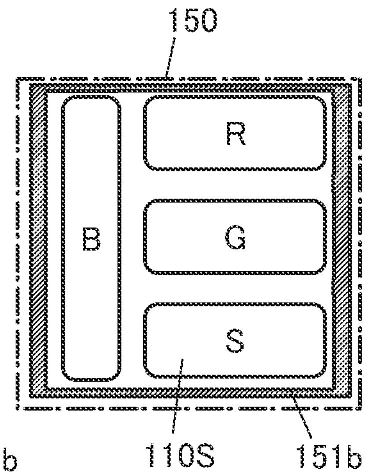

The pixel 150 illustrated in each of FIG. 14A, FIG. 14B, and FIG. 14C includes the subpixel 110G, the subpixel 110B, the subpixel 110R, and a light-receiving portion 110S, and further includes the auxiliary wiring. FIG. 14A, FIG. 14B, and FIG. 14C illustrate the second wiring layer 151*b* that is part of the auxiliary wiring 151. In FIG. 14A, FIG. 14B, and FIG. 14C, regions are denoted by reference numerals R, G, B, and S to easily differentiate the subpixels and the like.

The pixel 150 illustrated in FIG. 14A employs stripe arrangement, and the second wiring layer 151*b* is provided to surround the subpixel 110G, the subpixel 1101B, the subpixel 110R, and the light-receiving portion 110S.

The pixel illustrated in FIG. 14B employs matrix arrangement, and the second wiring layer 151*b* is provided to surround the subpixel 110G, the subpixel 1101B, the subpixel 110R, and the light-receiving portion 110S.

The pixel 150 illustrated in FIG. 14C employs arrangement in which three subpixels (the subpixel 110R, the subpixel 110G, and the light-receiving portion 110S) are vertically arranged next to one subpixel (the subpixel 110B), and the second wiring layer 151*b* is provided to surround the subpixel 110G, the subpixel 1101B, the subpixel 110R, and the light-receiving portion 110S.

Note that the layout of the subpixels is not limited to the structures in FIG. 14A to FIG. 14C. The layout of the second wiring layer 151*b* is not limited to the structures in FIG. 14A to FIG. 14C.

In the case where a light-receiving area of the light-receiving portion 110S is smaller than a light-emitting area of each of the other subpixels, an image-capturing range becomes narrow, which can inhibit a blur in a captured result and increase the definition. Thus, the display device of one embodiment of the present invention can perform high-resolution or high-definition image capturing. For example, image capturing for personal authentication with the use of a fingerprint, a palm print, the iris, the shape of a blood vessel (including the shape of a vein and the shape of an artery), a face, or the like is possible by using the light-receiving portion 110S.

Moreover, the light-receiving portion 110S can be used in a touch sensor (also referred to as a direct touch sensor), a near touch sensor (also referred to as a hover sensor, a hover touch sensor, a contactless sensor, or a touchless sensor), or the like.

A touch sensor or a near touch sensor can sense an approach or contact of an object (a finger, a hand, a pen, or the like). The touch sensor can sense the object when the display device and the object come in direct contact with each other. The near touch sensor can sense an object even when the object is not in contact with the display device. For example, the display device is preferably capable of sensing an object when the distance between the display device and the object is more than or equal to 0.1 mm and less than or equal to 300 mm, preferably more than or equal to 3 mm and less than or equal to 50 mm. This structure enables the display device to be operated without direct contact of an object, that is, enables the display device to be operated in a contactless (touchless) manner. With the above-described structure, the display device can have a reduced risk of being dirty or damaged, or can be operated without the object directly touching dirt (e.g., dust or a virus) attached to the display device.

For high-resolution image capturing, the light-receiving portion 110S is preferably provided in all pixels included in the display device. Meanwhile, in the case where the light-receiving portion 110S is used in a touch sensor, a near touch sensor, or the like, high accuracy is not required as compared to the case of capturing an image of a fingerprint; accordingly, the light-receiving portion 110S only needs to be provided in some of the pixels in the display device. When the number of light-receiving portions 110S included in the display device is smaller than the number of subpixels 110R or the like, higher sensing speed can be achieved.

Figure 14D:
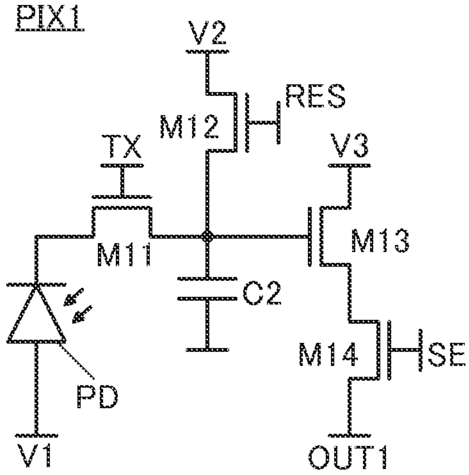
FIG. 14D is a circuit diagram.

FIG. 14D illustrates an example of a pixel circuit of a subpixel (PIX1) including a light-receiving device.

The pixel circuit illustrated in FIG. 14D includes a light-receiving device PD, a transistor M11, a transistor M12, a transistor M13, a transistor M14, and a capacitor C2. Here, an example in which a photodiode is used as the light-receiving device PD is illustrated.

An anode of the light-receiving device PD is electrically connected to a wiring V1, and a cathode of the light-receiving device PD is electrically connected to one of a source and a drain of the transistor M11. A gate of the transistor M11 is electrically connected to a wiring TX, and the other of the source and the drain of the transistor M11 is electrically connected to one electrode of the capacitor C2, one of a source and a drain of the transistor M12, and a gate of the transistor M13. Agate of the transistor M12 is electrically connected to a wiring RES, and the other of the source and the drain of the transistor M12 is electrically connected to a wiring V2. One of a source and a drain of the transistor M13 is electrically connected to a wiring V3, and the other of the source and the drain of the transistor M13 is electrically connected to one of a source and a drain of the transistor M14. Agate of the transistor M14 is electrically connected to a wiring SE, and the other of the source and the drain of the transistor M14 is electrically connected to a wiring OUT1.

A constant potential is supplied to each of the wiring V1, the wiring V2, and the wiring V3. To drive the light-receiving device PD, the wiring V2 is supplied with a potential higher than the potential of the wiring V1. The transistor M12 is controlled by a signal supplied to the wiring RES and has a function of resetting the potential of a node connected to the gate of the transistor M13 to a potential supplied to the wiring V2. The transistor M11 is controlled by a signal supplied to the wiring TX and has a function of controlling the timing at which the potential of the node changes, in accordance with current flowing through the light-receiving device PD. The transistor M13 functions as an amplifier transistor for performing output corresponding to the potential of the node. The transistor M14 is controlled by a signal supplied to the wiring SE and functions as a selection transistor for reading the output corresponding to the potential of the node by an external circuit electrically connected to the wiring OUT1.

A transistor containing a metal oxide (an oxide semiconductor) in a semiconductor layer where a channel is formed (an OS transistor) is preferably used as each of the transistor M11, the transistor M12, the transistor M13, and the transistor M14.

An OS transistor having a wider band gap and a lower carrier concentration than silicon can achieve an extremely low off-state current.

Alternatively, a transistor containing silicon as a semiconductor where a channel is formed can be used as each of the transistor M11 to the transistor M14. It is particularly preferable to use silicon with high crystallinity, such as single crystal silicon or polycrystalline silicon, in which case high field-effect mobility can be achieved and higher-speed operation can be performed.

Alternatively, a transistor containing an oxide semiconductor may be used as one or more of the transistor M11 to the transistor M14, and transistors containing silicon may be used as the other transistors.

Although n-channel transistors are illustrated as the transistors in FIG. 14D, p-channel transistors can be used.

The refresh rate of the display device of one embodiment of the present invention can be variable. For example, the refresh rate is adjusted (in the range from 0.01 Hz to 240 Hz inclusive, for example) in accordance with contents displayed on the display device, whereby power consumption can be reduced. Moreover, driving with a lowered refresh rate that reduces the power consumption of the display device may be referred to as idling stop (IDS) driving.

The driving frequency of the touch sensor or the near touch sensor may be changed in accordance with the refresh rate. For example, when the refresh rate of the display device is 120 Hz, the driving frequency of the touch sensor or the near touch sensor can be higher than 120 Hz (can typically be 240 Hz). With this structure, low power consumption can be achieved, and the response speed of the touch sensor or the near touch sensor can be increased.

This embodiment can be combined with any of the other embodiments as appropriate. In the case where a plurality of structure examples are described in one embodiment in this specification, the structure examples can be combined as appropriate.

Embodiment 7

In this embodiment, a metal oxide (also referred to as an oxide semiconductor) that can be used in the OS transistor described in the above embodiment will be described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a CVD method such as a metal organic chemical vapor deposition (MOCVD: Metal Organic CVD) method, an ALD method, or the like.

<Classification of Crystal Structure>

Amorphous (including completely amorphous), CAAC (c-axis-aligned crystalline), nc (nanocrystalline), CAC (cloud-aligned composite), single crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of a quartz glass substrate shows a peak with a substantially bilaterally symmetrical shape. On the other hand, the peak of the XRD spectrum of an IGZO film having a crystal structure has a bilaterally asymmetrical shape. The bilaterally asymmetrical peak of the XRD spectrum clearly shows the existence of crystals in the film or the substrate. In other words, the crystal structure of the film or the substrate cannot be regarded as an amorphous state unless it has a bilaterally symmetrical peak in the XRD spectrum.

A crystal structure of a film or a substrate can also be evaluated with a diffraction pattern obtained by a nanobeam electron diffraction method (NBED) (such a pattern is also referred to as a nanobeam electron diffraction pattern). For example, a halo pattern is observed in the diffraction pattern of the quartz glass substrate, which indicates that the quartz glass is in an amorphous state. Furthermore, not a halo pattern but a spot-like pattern is observed in the diffraction pattern of the IGZO film formed at room temperature. Thus, it is suggested that the IGZO film formed at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a plurality of fine crystals, the size of the crystal region may be approximately several tens of nanometers.

In the case of an In-M-Zn oxide (an element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Thus, indium may be contained in the (M,Zn) layer. In addition, the element M may be contained in the Inlayer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Hence, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region contains an indium oxide, an indium zinc oxide, or the like as its main component. The second region contains a gallium oxide, a gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and lower than 30%, further preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has higher conductivity than the second region. That is, when carriers flow through the first region, the conductivity of a metal oxide is exhibited.

Accordingly, when the first regions are distributed in a metal oxide like a cloud, high field-effect mobility (μ) can be achieved.

The second region has a higher insulating property than the first region. That is, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

A transistor using the CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used for a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/$cm^3$, preferably lower than or equal to $2\times10^{16}$ atoms/$cm^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

This embodiment can be combined with any of the other embodiments as appropriate. In the case where a plurality of structure examples are described in one embodiment in this specification, the structure examples can be combined as appropriate.

Embodiment 8

An example of a method for fabricating the above-described display device will be described with reference to FIG. 15 to FIG. 19 and the like. In the drawings, a region related to the pixel 150 is illustrated on the left side, and a region related to the auxiliary wiring 151 is illustrated on the right side.

Fabrication Method Example 1

Thin films included in the display device (insulating films, semiconductor films, conductive films, and the like) can be formed by a sputtering method, a CVD method, a vacuum evaporation method, a PLD method, an ALD method, or the like. Examples of the CVD method include a plasma-enhanced chemical vapor deposition (PECVD) method and a thermal CVD method. An example of a thermal CVD method is an MOCVD method.

Thin films included in the display device (insulating films, semiconductor films, conductive films, resin films, and the like) can be formed by a method such as spin coating, dipping, spray coating, ink-jetting, dispensing, screen printing, offset printing, a doctor knife method, slit coating, roll coating, curtain coating, or knife coating. These are wet deposition methods.

The thin films included in the display device can be processed by a photolithography method or the like. Besides, the thin films may be processed by a nanoimprinting method, a sandblasting method, a lift-off method, or the like. Furthermore, the thin films may be directly formed by a deposition method using a metal mask or the like.

There are the following two typical methods of a photolithography method. In one of the methods, a resist mask is formed over a thin film that is to be processed, the thin film is processed by etching or the like, and then the resist mask is removed. In the other method, a photosensitive thin film is deposited and then processed into a desired shape by light exposure and development.

For light used for light exposure in a photolithography method, for example, an i-line (with a wavelength of 365 nm), a g-line (with a wavelength of 436 nm), an h-line (with a wavelength of 405 nm), or light in which these lines are mixed can be used. Besides, ultraviolet light, KrF laser light, ArF laser light, or the like can be used. Alternatively, for the light used for the light exposure, extreme ultraviolet (EUV) light, X-rays, or the like may be used. Furthermore, instead of the light used for the light exposure, an electron beam can also be used. Extreme ultraviolet light, X-rays, or an electron beam is preferably used, in which case extremely minute processing can be performed. Note that when light exposure is performed by scanning of a beam such as an electron beam, a resist mask is not needed.

For etching of the thin films, a dry etching method, a wet etching method, a sandblasting method, or the like can be used.

[Preparation of Substrate]

Although not illustrated, a substrate is prepared. As the substrate, a substrate having at least heat resistance high enough to withstand heat treatment performed later can be used. In the case where an insulating substrate is used as the substrate, a glass substrate, a quartz substrate, a sapphire substrate, a ceramic substrate, an organic resin substrate, or the like can be used. Alternatively, it is possible to use a semiconductor substrate such as a single crystal semiconductor substrate or a polycrystalline semiconductor substrate containing silicon, silicon carbide, or the like as a material; a compound semiconductor substrate of silicon germanium or the like; or an SOI substrate.

As the substrate, it is preferable to prepare the semiconductor substrate or the insulating substrate where a pixel circuit including a semiconductor element such as a transistor is formed. A substrate where a gate line driver circuit (a gate driver), a source line driver circuit (a source driver), or the like is formed besides the pixel circuit may be used. In addition to the above, a substrate where an arithmetic circuit, a memory circuit, or the like is formed may be used.

[Formation of Insulating Layer 102]

Figure 15A:
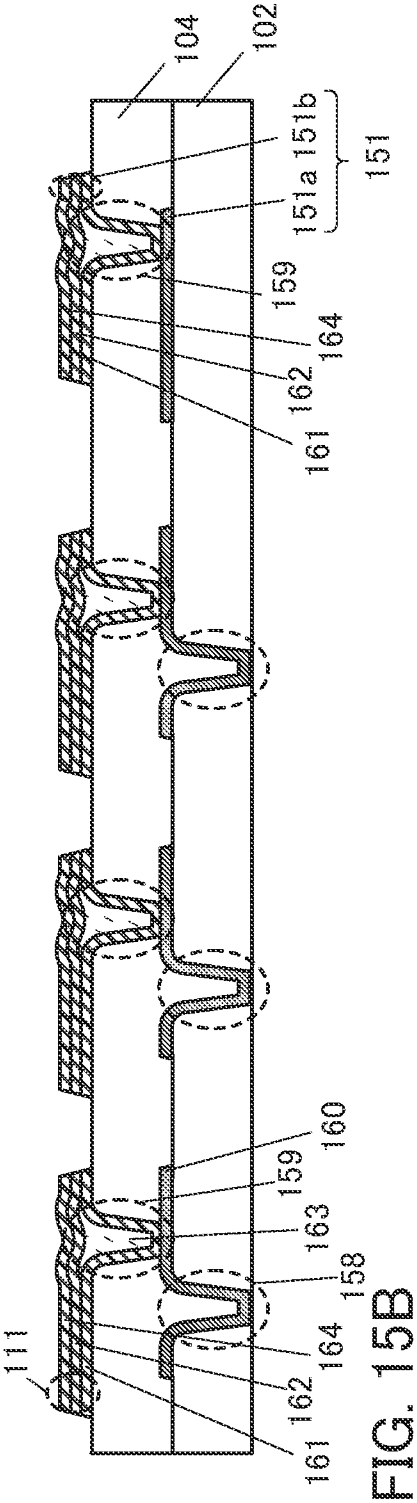
FIG. 15A to FIG. 15C are cross-sectional views illustrating a fabrication method.

As illustrated in FIG. 15A, an insulating layer 102 is formed over the above substrate. For the insulating layer 102, an inorganic material or an organic material can be used. The organic material is preferable because it enables the insulating layer 104 to surely have a planar top surface. As the organic material, one or two or more selected from an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like can be used. In the case where two or more of the organic materials are used, the selected organic materials are stacked.

As illustrated in FIG. 15A, the insulating layer 102 includes a contact hole 158. The contact hole 158 can be formed by a photolithography method, for example.

[Formation of Conductive Layer 160 and First Wiring Layer 151*a*]

As illustrated in FIG. 15A, a conductive layer 160 is formed over the insulating layer 102 and in the contact hole 158. The first wiring layer 151*a* is formed over the insulating layer 102. That is, the conductive layer 160 and the first wiring layer 151*a* are formed on the same formation surface through the same process. Specifically, a conductive film formed over the insulating layer 102 and in the contact hole 158 is processed to obtain the conductive layer 160 and the first wiring layer 151*a*.

The conductive layer 160 is electrically connected to the transistor of the pixel circuit and is one conductive layer included in the lower electrode 111. The conductive layer 160 can be processed to have an elongated shape over the insulating layer 102 and can function as a signal line, a power supply line, a scan line, or the like. The conductive layer 160 does not necessarily function as a wiring and may be a conductive layer for electrically connecting the transistor and the lower electrode 111 to each other. The first wiring layer 151*a* can function as a lower wiring layer of the auxiliary wiring 151 and is processed to have an elongated shape, a lattice shape, or the like over the insulating layer 102. Note that the first wiring layer 151*a* is not in contact with the conductive layer 160. The first wiring layer 151*a* can be formed to have a large area over the insulating layer 102 and is thus preferable as the auxiliary wiring.

For the conductive layer 160 and the first wiring layer 151*a*, one or two or more metal materials selected from aluminum, titanium, chromium, manganese, iron, cobalt, nickel, copper, gallium, zinc, indium, tin, molybdenum, tantalum, tungsten, palladium, gold, platinum, silver, yttrium, neodymium, and the like, an alloy containing an appropriate combination of any of these, or the like can be used. Since the first wiring layer 151*a* functions as a lower wiring layer of the auxiliary wiring, a metal material having low resistivity, such as aluminum, is preferably used.

The conductive layer 160 and the first wiring layer 151*a* may each have a single-layer structure containing the above metal material or a stacked-layer structure containing the above metal material.

[Formation of Insulating Layer 104]

As illustrated in FIG. 15A, the insulating layer 104 is formed over the insulating layer 102. For the insulating layer 104, an inorganic material or an organic material can be used. The organic material is preferable because it enables the insulating layer 104 to surely have a planar top surface. As the organic material, one or two or more selected from an acrylic resin, a polyimide resin, an epoxy resin, an imide resin, a polyamide resin, a polyimide-amide resin, a silicone resin, a siloxane resin, a benzocyclobutene-based resin, a phenol resin, or precursors of these resins can be used. In the case where two or more of the organic materials are used, the selected organic materials are stacked.

The insulating layer 104 includes a contact hole 159. The contact hole 159 can be formed by a photolithography method or the like, and parts of the conductive layer 160 and the first wiring layer 151*a* are exposed in the contact hole 159. The contact hole 159 does not overlap with the contact hole 158 and is preferably provided in a position overlapping with the conductive layer 160 provided on the flat top surface of the insulating layer 102. In the case where the contact hole 159 overlaps with the contact hole 158, the contact hole 159 is preferably larger than the contact hole 158.

[Formation of Conductive Layer 161, Resin Layer 163, and Conductive Layer 162]

As illustrated in FIG. 15A, in the contact hole 159, a conductive layer 161 is formed followed by formation of a resin layer 163, and then a conductive layer 162 is formed. A conductive layer 164 described later may be formed without formation of the conductive layer 161, the resin layer 163, and the conductive layer 162.

A conductive film to be the conductive layer 161 is formed over the insulating layer 104 and the contact hole 159. Preferably, the top surface of the insulating layer 104 is a formation surface of the conductive film and has planarity to make the conductive film less likely to be cut. For the conductive layer 161, it is possible to use one or two or more metal materials selected from aluminum, titanium, chromium, manganese, iron, cobalt, nickel, copper, gallium, zinc, indium, tin, molybdenum, tantalum, tungsten, palladium, gold, platinum, silver, yttrium, neodymium, and the like, an alloy containing an appropriate combination of any of these, or the like.

In the case where the surface of the formed conductive film has a depressed portion, a layer containing a resin as an organic material (referred to as a resin layer) 163 is preferably formed in the depressed portion. With the resin layer 163, unevenness due to the insulating layer 104, the contact hole 159, and the conductive layer 161 can be reduced.

It is preferable to use a photosensitive resin for the resin layer 163. In that case, the resin layer 163 can be formed in the following manner: a resin film is formed first, and the resin film is exposed to light through a resist mask and is then subjected to development treatment. Further preferably, in order to adjust the level of the top surface of the resin layer 163, an upper portion of the resin layer 163 may be etched by ashing or the like.

In the case where a non-photosensitive resin is used for the resin layer 163, the resin layer 163 can be formed in the following manner: a resin film is formed, and then an upper portion of the resin film is etched by ashing or the like. The ashing is performed until the surface of the conductive film to be the conductive layer 161 is exposed. The thickness of the resin layer 163 can be optimized by ashing or the like.

Next, a conductive film to be the conductive layer 162 is formed over the resin layer 163. The conductive layer 162 preferably contains one or two or more selected from the metals and the like described for the conductive layer 161.

[Formation of Conductive Layer 164]

As illustrated in FIG. 15A, a conductive film to be the conductive layer 164 is formed to cover the conductive film to be the conductive layer 161 and the conductive film to be the conductive layer 162.

A stack of the conductive layer 161, the conductive layer 162, and the conductive layer 164 can correspond to the lower electrode 111. The lower electrode 111 functions as an anode or a cathode and the conductive layer 164 is positioned in the uppermost layer of the lower electrode 111; thus, refer to the description of the lower electrode 111 for a specific material that can be used for the conductive layer 164.

Alternatively, a stack of the conductive layer 161, the conductive layer 162, and the conductive layer 164 can correspond to the second wiring layer 151*b*.

After that, a resist mask is formed over the three conductive films by a photolithography method, and unnecessary portions of the conductive films are removed by etching. Then, the resist mask is removed, whereby the conductive layer 161, the conductive layer 162, and the conductive layer 164 can be formed using the same resist mask in the same etching step. Owing to the resin layer 163 or the like, the conductive layer 164 can have a flat top surface.

Although the conductive layer 161 and the conductive layer 162 are formed using the same resist mask in the same etching step here, the conductive layer 161 and the conductive layer 162 may be separately processed using different resist masks. In that case, the conductive layer 161 and the conductive layer 162 are preferably processed such that the conductive layer 162 is positioned inward from the outline of the conductive layer 161 in a top view.

Although the conductive layer 162, the conductive layer 164, and the like are formed using the same resist mask in the same etching step, the conductive layer 162, the conductive layer 164, and the like may be separately processed using different resist masks. In that case, the conductive layer 162, the conductive layer 164, and the like are preferably processed such that the conductive layer 164 is positioned inward from the outlines of the conductive layer 162 and the like in a top view.

[Formation of Organic Compound Film 112*f*W]

Figure 15B:
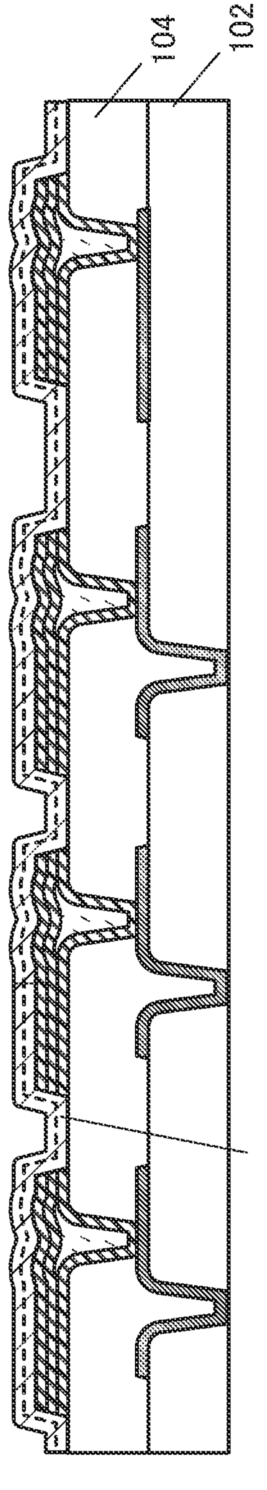

As illustrated in FIG. 15B, an organic compound film 112*f*W that can emit white light is formed to cover the conductive layer 164. The organic compound film 112*f*W is a stack of functional layers of a light-emitting device, and the stack described above in Embodiment 4 is formed, for example. Note that the functional layers of the stack described above in Embodiment 4 are sequentially formed.

The organic compound film 112*f*W may have either a single structure or a tandem structure. In the case of a single structure, the layer 521, the layer 522, the light-emitting layer 523Q_1, the light-emitting layer 523Q_2, the light-emitting layer 523Q_3, and the layer 524 of the stack can be sequentially formed in accordance with Embodiment 4 above.

In the case where the organic compound film 112*f*W has a tandem structure, a charge-generation layer is preferably also formed. For example, the layer 521, the layer 522, the light-emitting layer 523Q_1, the layer 524, the charge-generation layer 531, the layer 522, the light-emitting layer 523Q_2, and the layer 524 of the stack can be sequentially formed in accordance with Embodiment 4 above.

For the charge-generation layer, any of the materials and the like described above in Embodiment 4 can be used.

Note that the charge-generation layer is processed by etching or the like later; thus, a material that contains neither an alkali metal nor an alkaline earth metal may be used.

The functional layers included in the organic compound film 112fW can be formed by an evaporation method (including vacuum evaporation); without limitation thereto, the functional layers included in the organic compound film 112fW can also be formed by a sputtering method, an ink-jet method, or the like.

Note that an electron-injection layer is one of the functional layers of the light-emitting device; however, in this embodiment, the electron-injection layer is a common layer and thus is not included in the organic compound film 112fW but is formed later. The common layer may be any layer as long as it is a functional layer positioned between the light-emitting layer and the common electrode. Needless to say, all the functional layers may be divided for each subpixel without providing the common layer.

Since the electron-injection layer is not included in the organic compound film 112fW, an electron-transport layer is positioned in the uppermost layer of the organic compound film 112fW. The electron-transport layer is exposed to a processing process using a photolithography method. Thus, a material having high heat resistance is preferably used for the electron-transport layer. As the material having high heat resistance, a material whose glass transition point is higher than or equal to 110° C. and lower than or equal to 165° C., preferably higher than or equal to 120° C. and lower than or equal to 135° C. is preferably used, for example.

The electron-transport layer exposed to the processing may have a stacked-layer structure. An example of the stacked-layer structure is a structure in which a second electron-transport layer is stacked over a first electron-transport layer. The processing includes a period in which the first electron-transport layer is covered with the second electron-transport layer; accordingly, the first electron-transport layer may have lower heat resistance than the second electron-transport layer. For example, a material with a glass transition point higher than or equal to 110° C. and lower than or equal to 165° C., preferably higher than or equal to 120° C. and lower than or equal to 135° C. can be used for the second electron-transport layer, and a material with a glass transition point lower than that of the second electron-transport layer, for example, higher than or equal to 100° C. and lower than or equal to 155° C., preferably higher than or equal to 110° C. and lower than or equal to 125° C. can be used for the first electron-transport layer.

Since the electron-transport layer can be the common layer, the light-emitting layer can be regarded as the uppermost layer of the organic compound film 112fW; however, damage to the light-emitting layer caused by the processing might significantly degrade the reliability. Thus, in the fabrication of the display device of one embodiment of the present invention, the processing is preferably performed after the functional layer (e.g., the electron-transport layer) is formed above the light-emitting layer.

[Formation of Mask Film 144]

Figure 15C:
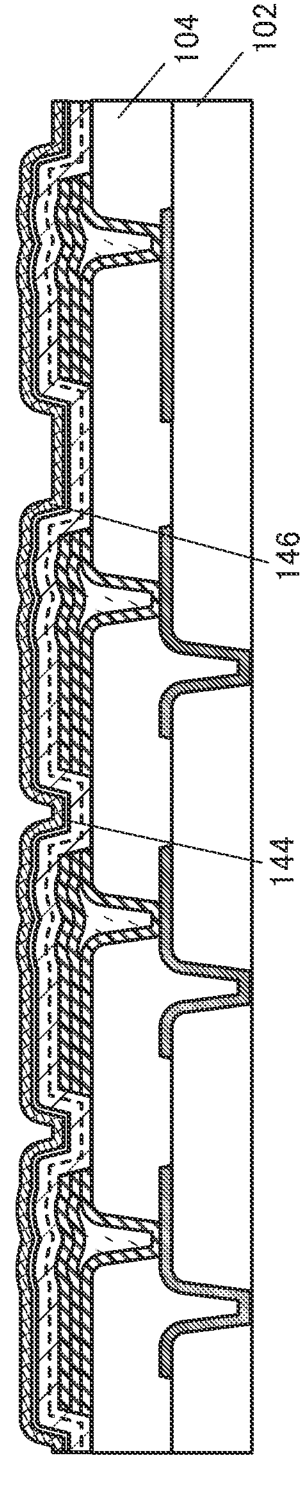

Furthermore, a mask layer or the like is preferably formed over the organic compound film 112fW. The mask layer can inhibit damage to the light-emitting layer caused by processing. This method can provide a highly reliable display panel. Note that in this specification and the like, the mask layer is positioned above the organic compound film and has a function of protecting the organic compound film in the manufacturing process. Thus, as illustrated in FIG. 15C, a mask film 144 is formed to cover the organic compound film 112fW.

As the mask film 144, a film having high etching selectivity with respect to the organic compound film 112fW is preferably used during the etching treatment of the organic compound film 112fW. The mask film 144 is in a stacked-layer structure in some cases; a film having high etching selectivity with respect to a mask film in the upper layer described later (specifically, a mask film 146) or the like is preferably used as the mask film 144. Furthermore, at the time of removing the mask film 144, it is preferable to use a film that can be removed by a wet etching method that is less likely to cause damage to the organic compound film 112fW.

As the mask film 144, an inorganic film such as a metal film, an alloy film, a metal oxide film, a semiconductor film, or an inorganic insulating film can be suitably used, for example. The mask film 144 can be formed by any of a variety of deposition methods such as a sputtering method, an evaporation method, a CVD method, and an ALD method.

In particular, the mask film 144, which is directly formed on the organic compound film 112fW, is preferably formed by an ALD method that gives less deposition damage to a formation layer.

For the mask film 144, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used, for example. It is particularly preferable to use a low-melting-point material such as aluminum or silver.

Alternatively, a metal oxide such as an indium-gallium-zinc oxide (also referred to as an In—Ga—Zn oxide or IGZO) can be used for the mask film 144. It is also possible to use an indium oxide, an indium zinc oxide (an In—Zn oxide), an indium tin oxide (an In—Sn oxide), an indium titanium oxide (an In—Ti oxide), an indium tin zinc oxide (an In—Sn—Zn oxide), an indium titanium zinc oxide (an In—Ti—Zn oxide), an indium gallium tin zinc oxide (an In—Ga—Sn—Zn oxide), or the like. Alternatively, an indium tin oxide containing silicon, or the like can be used.

Note that the element M (M is one or more selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) can be used instead of gallium. Specifically, M is preferably one or more kinds selected from gallium, aluminum, and yttrium.

The mask film 144 may contain an inorganic material. As the inorganic material, an oxide such as aluminum oxide, hafnium oxide, or silicon oxide, a nitride such as silicon nitride or aluminum nitride, or an oxynitride such as silicon oxynitride can be used. Such an inorganic material can be formed by a deposition method such as a sputtering method, a CVD method, or an ALD method.

The mask film 144 may contain an organic material. As the organic material, for example, a material that can be dissolved in a solvent chemically stable with respect to the organic compound film 112fW may be used. In particular, a material that is dissolved in water or alcohol can be suitably used for the mask film 144. In formation of the mask film 144, it is preferable that application of such a material that has been dissolved in a solvent such as water or alcohol be performed by a wet deposition method and followed by heat treatment for evaporating the solvent. At this time, the heat treatment is preferably performed in a reduced-pressure atmosphere, in which case the solvent can be removed at a low temperature in a short time and thermal damage to the EL layer can be reduced accordingly.

A wet deposition method can be used to form the mask film 144.

For the mask film 144, an organic resin such as polyvinyl alcohol (PVA), polyvinyl butyral, polyvinylpyrrolidone, polyethylene glycol, polyglycerin, pullulan, water-soluble cellulose, or an alcohol-soluble polyamide resin can be used. For the mask film 144, a fluorine resin such as a perfluoropolymer may be used.

[Formation of Mask Film 146]

As illustrated in FIG. 15C, the mask film 146 is formed over the mask film 144. Although a stacked-layer structure of mask films is employed in this embodiment, the organic compound film **112*f*W can be protected using only either the mask film 144 or the mask film 146** as a single mask film.

The mask film 146 is preferably used as a hard mask when the mask film 144 is etched later. After the mask film 146 is processed, the mask film 144 is exposed. Thus, in the case where the mask film 146 is used as a hard mask, the combination of films having high etching selectivity therebetween is preferably selected for the mask film 144 and the mask film 146.

A material of the mask film 146 can be selected from a variety of materials depending on an etching condition of the mask film 144 and an etching condition of the mask film 146. For example, any of the films that can be used as the mask film 144 can be selected, or a material different from the material for the mask film 144 can be selected.

For example, an oxide film or an oxynitride film can be used as the mask film 146. Typical examples of the oxide film and the oxynitride film include silicon oxide, silicon oxynitride, aluminum oxide, aluminum oxynitride, hafnium oxide, and hafnium oxynitride.

As the mask film 146, a nitride film can be used, for example. Typical examples of the nitride film include silicon nitride, aluminum nitride, hafnium nitride, titanium nitride, tantalum nitride, tungsten nitride, gallium nitride, and germanium nitride.

For the combination of the mask film 144 and the mask film 146, for example, it is possible to use an inorganic material such as aluminum oxide, hafnium oxide, or silicon oxide formed by an ALD method for the mask film 144 and to use a metal oxide containing indium, such as an indium gallium zinc oxide (also referred to as an In—Ga—Zn oxide or IGZO), formed by a sputtering method for the mask film 146.

Alternatively, for the mask film 146 combined with the mask film 144, one or two or more metals selected from tungsten, molybdenum, copper, aluminum, titanium, tantalum, and the like or an alloy containing any of the metals can be used. In the case where the mask film 146 is formed as a hard mask, the above metal or alloy is preferably used. In the case where the mask film 146 is formed as a hard mask, the thickness of the mask film 146 is preferably larger than that of the mask film 144.

[Formation of Resist Mask 143]

Figure 16A:
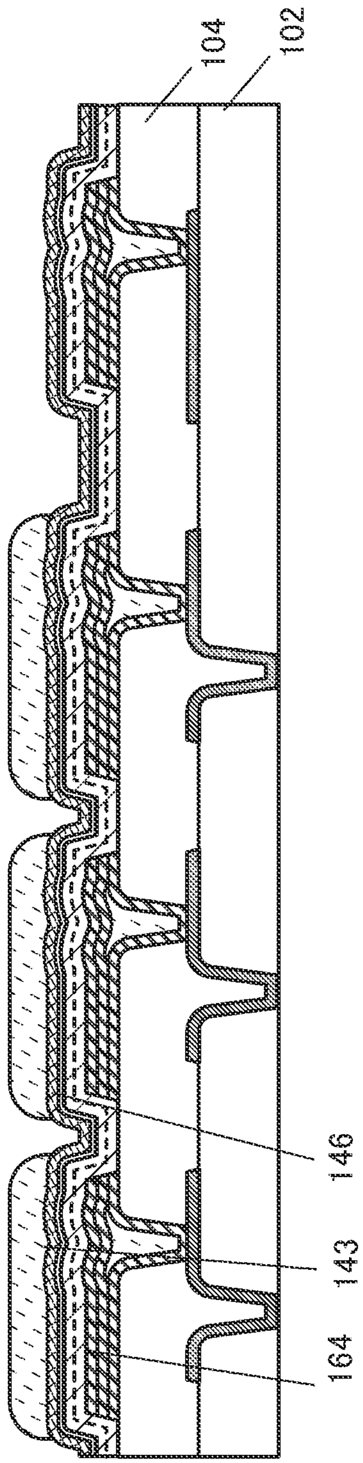
FIG. 16A to FIG. 16C are cross-sectional views illustrating a fabrication method.

As illustrated in FIG. 16A, a resist mask 143 is formed in a position that is over the mask film 146 and overlaps with the conductive layer 164. In that case, the resist mask is not formed in a position overlapping with the auxiliary wiring 151.

For the resist mask 143, a resist material containing a photosensitive resin, such as a positive type resist material or a negative type resist material, can be used.

The organic compound film **112*f*W or the like might be dissolved in the case where a material that dissolves the organic compound film 112*f*W is used for a solvent of the resist material, the mask film 146 is not provided, and defects such as pinholes exist in the mask film 144. In that case, the mask film 146 positioned over the mask film 144 at the time of formation of the resist mask 143** can prevent such defects.

In the case where a material that does not dissolve the organic compound film **112*f*W is used for the solvent of the resist material, the resist mask 143 may be formed directly on the mask film 144 without providing the mask film 146**.

[Etching of Mask Film 146]

Figure 16B:
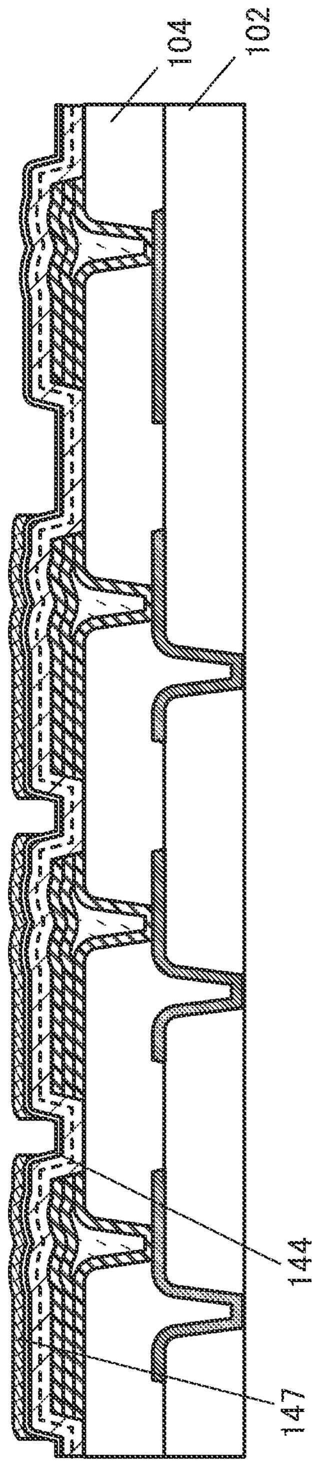

As illustrated in FIG. 16B, part of the mask film 146 that is not covered with the resist mask 143 is removed by etching, so that a mask layer 147 is formed.

In the etching of the mask film 146, an etching condition with high selectivity is preferably employed so that the mask film 144 is not removed by the etching. The etching of the mask film 146 can be performed by wet etching or dry etching.

[Removal of Resist Mask 143]

The resist mask 143 is removed as illustrated in FIG. 16B. The resist mask 143 can be removed by wet etching or dry etching. It is particularly preferable to perform dry etching (also referred to as plasma ashing) using an oxygen gas as an etching gas to remove the resist mask 143.

The resist mask 143 is removed in a state where the organic compound film **112*f*W is covered with the mask film 144; thus, damage to the organic compound film 112*f*W caused by the processing is inhibited. In particular, when the organic compound film 112*f*W is exposed to oxygen, the characteristics thereof might be adversely affected; accordingly, the organic compound film 112*f*W is preferably covered with the mask film 144 in the case where etching using the above oxygen gas is performed. Even in the case where the resist mask 143 is removed by wet etching, the organic compound film 112*f*W can be prevented from being dissolved because the organic compound film 112*f***W is not exposed to a chemical solution.

[Etching of Mask Film 144]

Figure 16C:
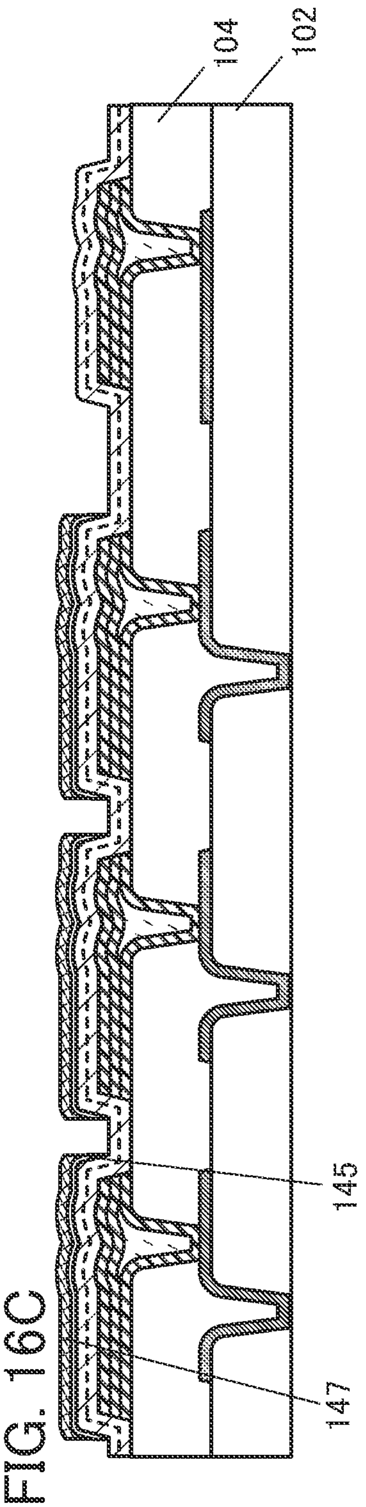

As illustrated in FIG. 16C, part of the mask film 144 is removed by etching using the mask layer 147 as a hard mask, so that a mask layer 145 is formed.

The etching of the mask film 144 can be performed by wet etching or dry etching.

[Etching of Organic Compound Film **112*f***W]

Figure 17A:
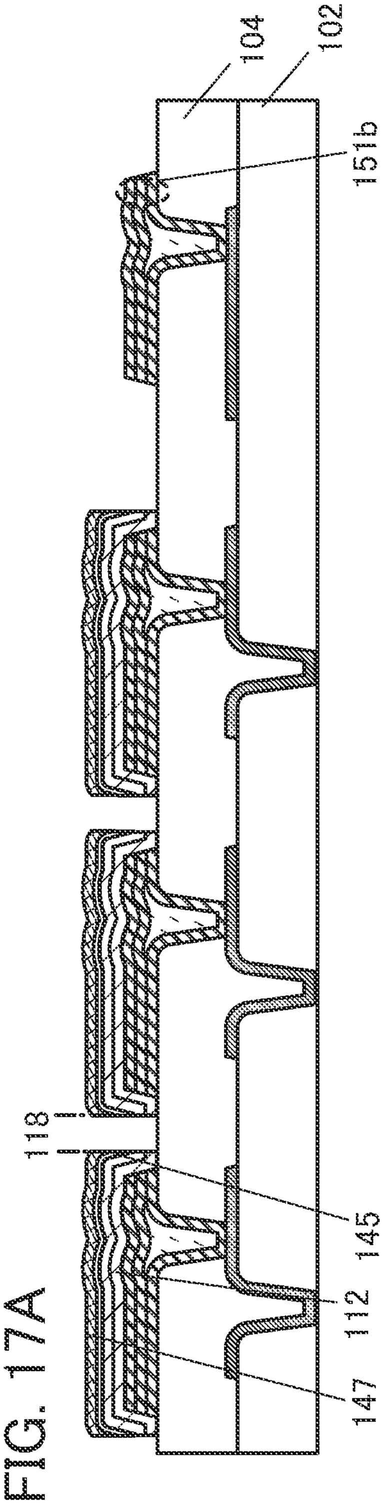
FIG. 17A to FIG. 17C are cross-sectional views illustrating a fabrication method.

As illustrated in FIG. 17A, part of the organic compound film **112*f*W that is not covered with the mask layer 145 is removed by etching, whereby the organic compound layer 112** is formed.

For the etching of the organic compound film **112*f*W, it is preferable to use dry etching using an etching gas that does not contain oxygen as its main component. This is because, as described above, the exposure of the organic compound film 112*f*W to oxygen adversely affects characteristics in some cases. Specifically, the organic compound film 112*f***W may be changed in quality; however, using an etching gas that does not contain oxygen as its main component can inhibit the change, whereby a highly reliable display device can be achieved. Examples of the etching gas that does not contain oxygen as its main component include $CF_4$, $C_4F_8$, $SF_6$, $CHF_3$, $Cl_2$, $H_2O$, $BCl_3$, $H_2$, and a rare gas such as He. Alternatively, a mixed gas of the above gas and a dilution gas that does not contain oxygen may be used as the etching gas.

Note that the etching of the organic compound film **112*f***W is not limited to the above and may be performed by dry etching using another gas or wet etching.

When dry etching using, as an etching gas, an oxygen gas or a mixed gas containing an oxygen gas is used for the etching of the organic compound film **112*f***W, the etching rate can be increased. Consequently, etching under a low-power condition can be performed while the etching rate is kept adequately high; hence, damage due to the etching can be reduced. Furthermore, a defect such as attachment of a reaction product generated in the etching can be inhibited. For example, a mixed gas obtained by adding an oxygen gas to the etching gas that does not contain oxygen as its main component can be used as the etching gas.

After the etching, the taper angle of the end surface of the organic compound layer 112 is preferably greater than or equal to 45° and less than 90°.

The insulating layer 104 is exposed when the organic compound film 112*f*W is etched. Thus, a depressed portion is sometimes formed in the insulating layer 104 in a region overlapping with a slit 118. Note that in the case where formation of the depressed portion is not desired, a film highly resistant to etching treatment of the organic compound film 112*f*W is preferably used as the insulating layer 104. For example, an insulating film containing an inorganic material is preferably used as the insulating layer 104.

An organic compound film is not provided over the second wiring layer 151*b*, and the second wiring layer 151*b* is exposed.

The slit 118 is formed between the organic compound layers 112. That is, the width of the slit 118 which is indicated by the arrow in FIG. 17B and is between the organic compound layers 112 obtained through a processing step using a photolithography method can be less than or equal to 8 μm, less than or equal to 3 μm, less than or equal to 2 μm, or less than or equal to 1 μm. The width of the slit 118 corresponds to the distance between the subpixels. The distance between the subpixels is shortened in this manner, whereby a display device with high resolution and a high aperture ratio can be provided.

The adjacent organic compound layers 112 are apart or separated from each other as shown by the slit 118, which makes it possible to divide a leakage current path and accordingly inhibit leakage current (also referred to as side leakage or side leakage current). Accordingly, a higher luminance, a higher contrast, higher display quality, higher power efficiency, lower power consumption, or the like can be achieved in the light-emitting device.

The end surfaces of the adjacent organic compound layers 112 preferably face each other with the slit 118 therebetween. Note that the end surfaces of organic compound layers formed using a metal mask cannot face each other. The end surfaces facing each other are clearly different from the end surfaces of the organic compound layers formed using a metal mask.

As described above, the insulating layer 104 is exposed when the organic compound film is etched. Thus, a depressed portion is sometimes formed in the insulating layer 104 in a region overlapping with the slit 118. Note that in the case where formation of the depressed portion is not desired, a film highly resistant to etching of the organic compound film is preferably used as the insulating layer 104. For example, an insulating film containing an inorganic material is preferably used as the insulating layer 104.

[Removal of Mask Layer]

Figure 17B:
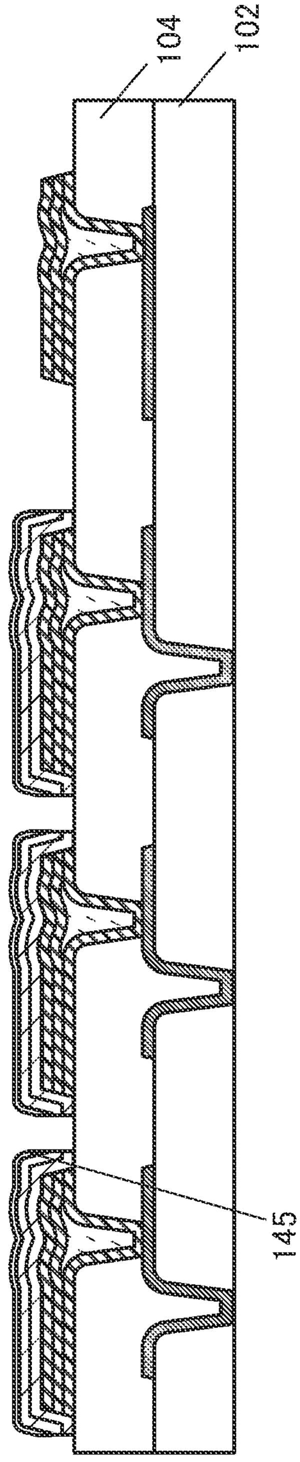

As illustrated in FIG. 17B, the mask layer 147 is removed, and the top surface of the mask layer 145 is exposed.

[Formation of Insulating Film 125*f*]

Figure 17C:
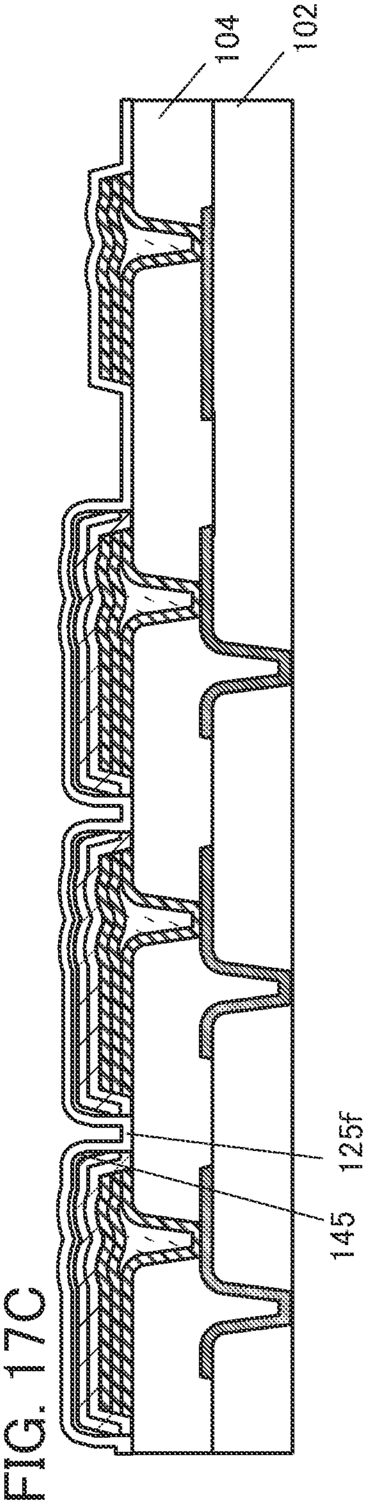

As illustrated in FIG. 17C, an insulating film 125*f* is formed to cover the mask layer 145 and the second wiring layer 151*b*.

The insulating film 125*f* functions as a barrier layer that prevents diffusion of impurities such as water into the organic compound layer 112. The insulating film 125*f* is preferably formed by an ALD method with excellent step coverage so as to suitably cover the side surface of the organic compound layer 112.

The same film as the mask layer 145 and the mask layer 147 is preferably used as the insulating film 125*f*, in which case simultaneous removal is easily performed in etching treatment in a later step. For example, one or two or more inorganic materials selected from aluminum oxide, hafnium oxide, silicon oxide, and the like, which is formed by an ALD method, is preferably used for the insulating film 125*f*, the mask layer 145, and the mask layer 147.

Note that the materials that can be used for the insulating film 125*f* are not limited thereto. For example, any of the materials that can be used for the mask layer 145 can be used as appropriate.

[Formation of Insulating Layer 126]

Figure 18A:
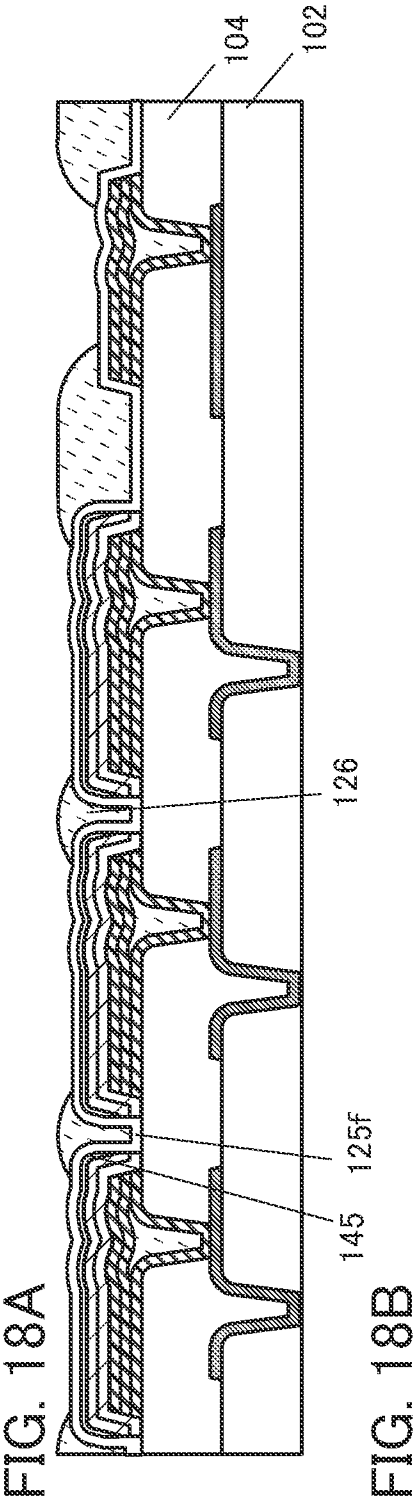
FIG. 18A to FIG. 18C are cross-sectional views illustrating a fabrication method.

As illustrated in FIG. 18A, the insulating layer 126 is formed in a region overlapping with the slit 118, for example. The insulating layer 126 can be formed by a method similar to that for the resin layer 163. For example, a photosensitive resin is formed, and then light exposure and development are performed, whereby the insulating layer 126 can be formed. The insulating layer 126 may be formed in the following manner: a resin is formed on the entire surface, and then part of the resin is etched by ashing or the like.

Here, a structure is illustrated in which the insulating layer 126 has a larger width than the slit 118. Note that the insulating layer 126 is provided such that part of the top surface of the second wiring layer 151*b* is exposed.

[Etching of Insulating Film 125*f* and Mask Layer 145]

Figure 18B:
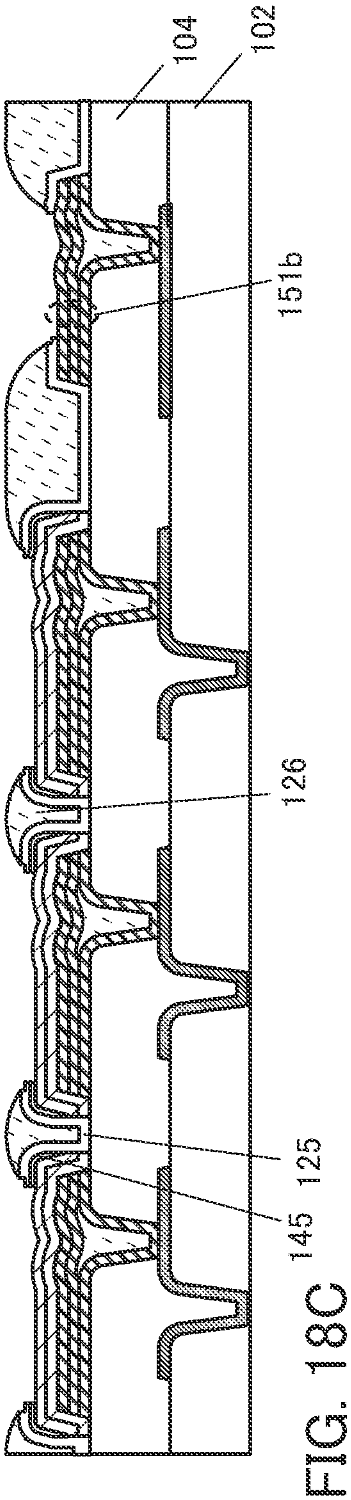

As illustrated in FIG. 18B, portions of the insulating film 125*f* and the mask layer 145 that are not covered with the insulating layer 126 are removed by etching, so that part of the top surface of the organic compound layer 112 is exposed. The insulating layer 125 and the mask layer 145 remain in a region overlapping with the insulating layer 126. It is preferable that the center portion of the insulating layer 126 be positioned above the end portion of the insulating layer 126 and that the center portion include a region rising above the end portion. The top surface of the insulating layer 126 is preferably positioned above the top surface of the organic compound layer 112. Furthermore, the end portion of the insulating layer 126 preferably has a tapered shape.

The insulating film 125*f* and the mask layer 145 are preferably etched in the same step. It is particularly preferable that the etching of the mask layer 145 be performed by wet etching that gives less etching damage to the organic compound layer 112. For example, it is preferable to employ wet etching using a tetramethyl ammonium hydroxide (TMAH) aqueous solution, diluted hydrofluoric acid, oxalic acid, phosphoric acid, acetic acid, nitric acid, or a mixed solution thereof. In the case of employing a wet etching method, a mixed acid chemical solution containing water, phosphoric acid, diluted hydrofluoric acid, and nitric acid may be used. A chemical solution used for the wet etching treatment may be alkaline or acid.

At least one of the insulating film 125*f* and the mask layer 145 are preferably removed by being dissolved in a solvent such as water or alcohol. As the alcohol in which the insulating film 125*f* and the mask layer 145 can be dissolved, any of various alcohols such as ethyl alcohol, methyl alcohol, isopropyl alcohol (IPA), and glycerin can be used.

After the insulating film 125*f* and the mask layer 145 are partly removed, drying treatment is preferably performed to remove water contained in the organic compound layer 112 or the like and water adsorbed on the surface thereof. For example, heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. Employing a reduced-pressure atmosphere is preferable, in which case drying at a lower temperature is possible.

Part of the top surface of the second wiring layer 151*b* is exposed by the removal of part of the insulating film 125*f*.

[Formation of Common Layer 114]

Figure 18C:
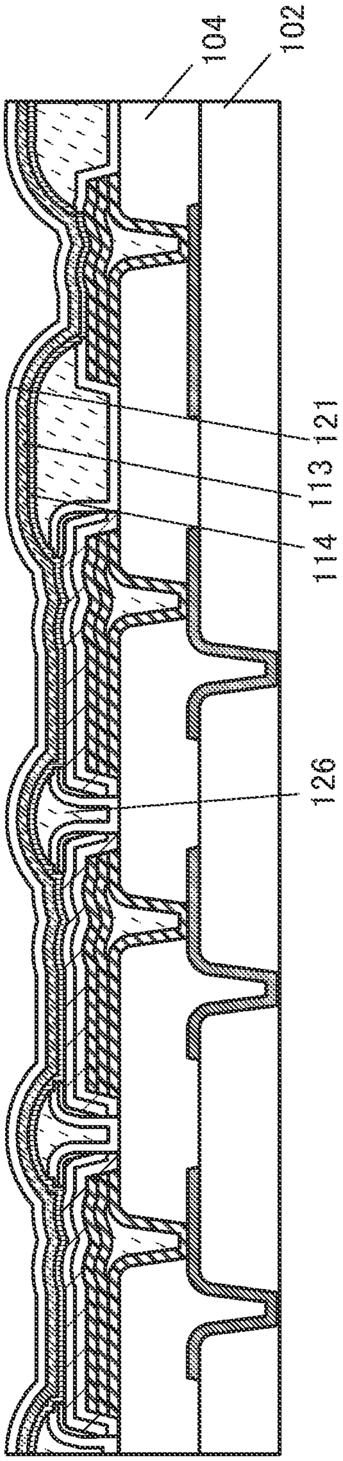

As illustrated in FIG. 18C, the common layer 114 is formed to cover the organic compound layer 112, the insulating film 125, the mask layer 145, the insulating layer 126, and the like.

For the common layer 114, any of the above-described materials that can be used for the electron-injection layer can be used; for example, an alkali metal, an alkaline earth metal, or a compound thereof can be used.

The common layer 114 can be formed by a method similar to that for the organic compound film 112*f*W or the like, and is preferably formed by evaporation.

[Formation of Common Electrode 113]

As illustrated in FIG. 18C, the common electrode 113 is formed to cover the common layer 114.

The common electrode 113 can be formed by a deposition method such as an evaporation method or a sputtering method. Alternatively, a film formed by an evaporation method and a film formed by a sputtering method may be stacked.

The common electrode 113 is preferably formed to cover a region where the common layer 114 is formed.

The common layer 114 may be positioned between the second wiring layer 151*b* and the common electrode 113. In that case, for the common layer 114, a material with as low electric resistance as possible is preferably used. Alternatively, it is preferable to form the common layer 114 as thin as possible, in which case the electric resistance of the common layer 114 in the thickness direction can be reduced. For example, an electron-injection or hole-injection material with a thickness greater than or equal to 1 nm and less than or equal to 5 nm, preferably greater than or equal to 1 nm and less than or equal to 3 nm is used for the common layer 114, whereby electric resistance between the second wiring layer 151*b* and the common electrode 113 can be made small enough to be negligible.

The common layer 114 is not necessarily positioned between the second wiring layer 151*b* and the common electrode 113.

[Formation of Protective Layer]

As illustrated in FIG. 18C, the protective layer 121 is formed over the common electrode 113. An inorganic insulating film used as the protective layer 121 is preferably formed by a sputtering method, a PECVD method, or an ALD method. In particular, an ALD method is preferable because it provides excellent step coverage and is unlikely to cause a defect such as a pinhole. In addition, an organic insulating film is preferably formed by an ink-jet method, in which case a uniform film can be formed in a desired area.

[Formation of Counter Substrate]

Figure 19:
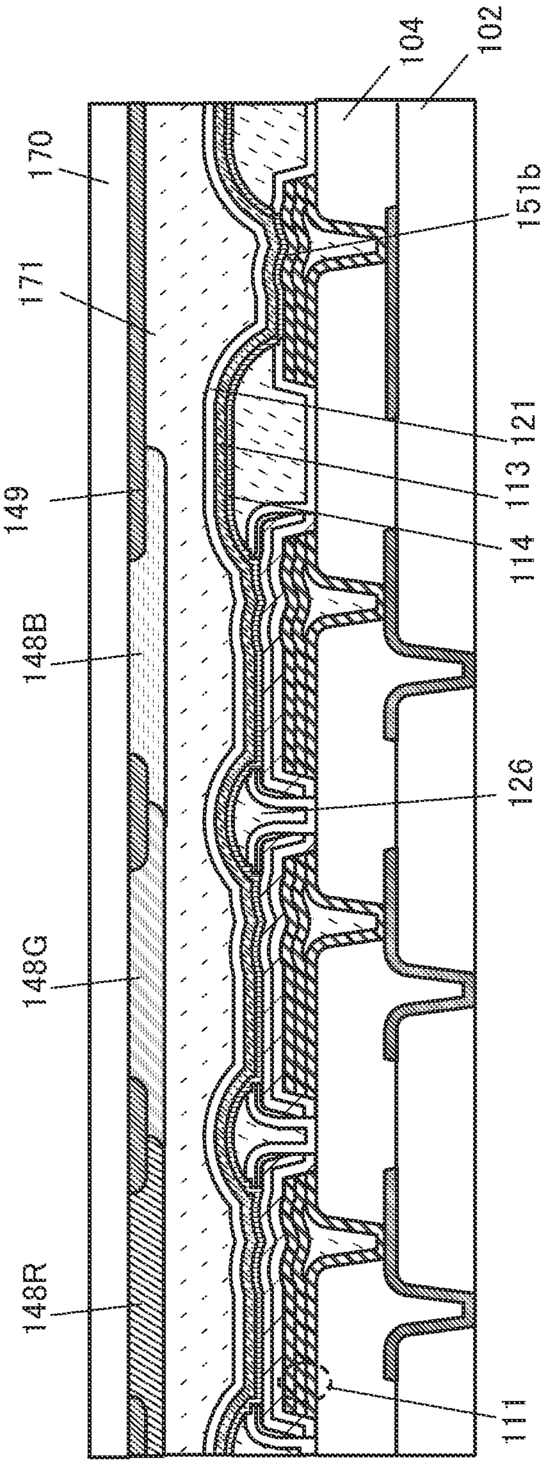
FIG. 19 is a cross-sectional view illustrating a fabrication method.

As illustrated in FIG. 19, the substrate 170 is bonded with the adhesive layer 171. The substrate 170 to be bonded is sometimes referred to as a counter substrate. The substrate 170 is provided with the light-blocking layer 149, the color filter 148R, the color filter 148G, and the color filter 148B. The light-blocking layer 149 is provided in a region overlapping with the insulating layer 126. The substrate 170 is preferably bonded such that the color filter 148R, the color filter 148G, and the color filter 148B overlap with the lower electrodes 111.

The color filter 148R, the color filter 148G, and the color filter 148B may be provided over the protective layer 121 instead of over the substrate 170.

The color filter 148R, the color filter 148G, and the color filter 148B can be formed at desired positions through etching treatment or the like using an ink-jet method or a photolithography method.

Light emitted toward the common electrode 113 side is colored resulting from absorption of light in a predetermined wavelength range by the color filter 148R, the color filter 148G, or the color filter 148B and the colored light exits through the substrate 170, enabling full color display.

For the adhesive layer 171, an organic material such as a reactive curable adhesive, a photocurable adhesive, a thermosetting adhesive, or/and an anaerobic adhesive can be used, for example.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the adhesive layer 171 or the like.

Note that in the case where the display device has a hollow sealing structure, the substrate 170 is preferably bonded with a sealant or the like without providing the adhesive layer. Although a space is generated when the substrate is bonded with the sealant, the space is preferably filled with an inert gas (a gas containing nitrogen or argon).

Fabrication Method Example 2

An example of a method for fabricating the display device, which is different from the above-described one, will be described with reference to FIG. 20A to FIG. 20C and the like. In the drawings, a region related to the pixel 150 is illustrated on the left side, and a region related to the auxiliary wiring 151 is not illustrated.

Figures 20A, 20B, 20C:
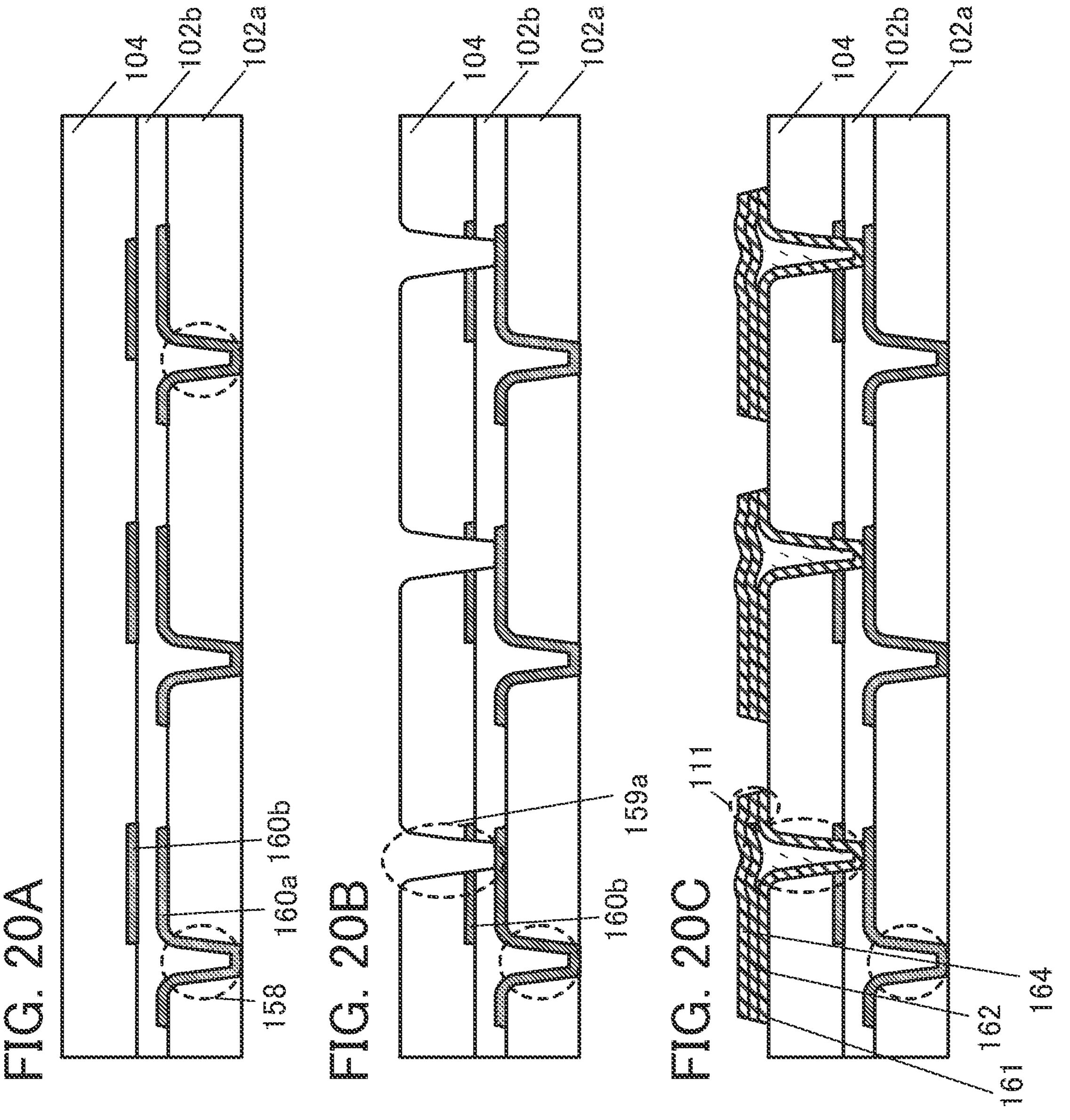
FIG. 20A to FIG. 20C are cross-sectional views illustrating a fabrication method.

A substrate is prepared as in Fabrication method example 1, and an insulating layer 102*a* is formed as illustrated in FIG. 20A. The insulating layer 102*a* can be formed using a material and the like similar to those for the insulating layer 102 in Fabrication method example 1. Next, the contact hole 158 is formed in the insulating layer 102*a* as in Fabrication method example 1, and a conductive layer 160*a* is formed in the contact hole 158. The conductive layer 160*a* can be formed using a material and the like similar to those for the conductive layer 160 in Fabrication method example 1.

The conductive layer 160*a* has a shape along the shape of the contact hole 158 and thus has a depressed portion in a region overlapping with the contact hole 158.

Next, an insulating layer 102*b* is formed. For the insulating layer 102*b*, a material that can fill the depressed portion is preferably used. Thus, the insulating layer 102*b* is preferably formed using the organic material among the materials for the insulating layer 102 described in Fabrication method example 1.

Next, a conductive layer 160*b* is formed over the insulating layer 102*b*. The conductive layer 160*a* can be formed using a material and the like similar to those for the conductive layer 160 in Fabrication method example 1. The conductive layer 160*b* is formed to overlap with the conductive layer 160*a*.

As illustrated in FIG. 20B, the insulating layer 104 is formed. The insulating layer 104 can be formed using a material and the like similar to those for the insulating layer 104 in Fabrication method example 1.

Next, a contact hole 159*a* is formed in the insulating layer 104, the conductive layer 160*b*, and the insulating layer 102*b*. The contact hole 159*a* provided in a plurality of materials is sometimes referred to as a through contact. The contact hole 159*a* can be formed in a manner similar to that of the contact hole 159 in Fabrication method example 1. The contact hole 159*a* is preferably formed by dry etching, in which case the sidewall surface of the contact hole 159*a* can be processed uniformly. Examples of the etching gas include $CF_4$, $C_4F_8$, $SF_6$, $CHF_3$, $Cl_2$, $H_2O$, $BCl_3$, $H_2$, and a rare gas such as He.

As illustrated in FIG. 20C, the conductive layer 161 is formed in the contact hole 159*a*. The conductive layer 161 can be formed using a material and the like similar to those for the conductive layer 161 in Fabrication method example 1. The conductive layer 161 includes a region in contact with the side surface of the conductive layer 160*b* to obtain electrical connection. Such a structure is sometimes referred to as a side contact.

The conductive layer 161 has a shape along the shape of the contact hole 159*a* and thus has a depressed portion in a region overlapping with the contact hole 159*a*.

Next, the resin layer 163 is formed. For the resin layer 163, a material that can fill the depressed portion is preferably used. The resin layer 163 is preferably formed using any of the materials for the resin layer 163 described in Fabrication method example 1.

Next, the conductive layer 162 is formed. The conductive layer 162 can be formed using a material and the like similar to those for the conductive layer 162 in Fabrication method example 1.

After that, the conductive layer 164 is formed in each of the light-emitting devices. The conductive layer 164 can be formed using a material and the like similar to those for the conductive layer 164 in Fabrication method example 1. The lower electrode 111 has a stacked-layer structure of the conductive layer 164, the conductive layer 162, and the conductive layer 161.

After such a structure is obtained, steps from the formation of the organic compound film and the like to bonding of the counter substrate are performed as in Fabrication method example 1, whereby the display device can be fabricated.

The through contact is preferably formed as in Fabrication method 2, in which case formation of a plurality of contact holes overlapping with one another without misalignment is possible and thus an aperture ratio can be kept high.

Fabrication Method Example 3

An example of a method for fabricating the display device, which is different from the above-described one, will be described with reference to FIG. 21 and the like. In the drawing, a region related to the pixel 150 is illustrated on the left side, and a region related to the auxiliary wiring 151 is not illustrated.

Figure 21:
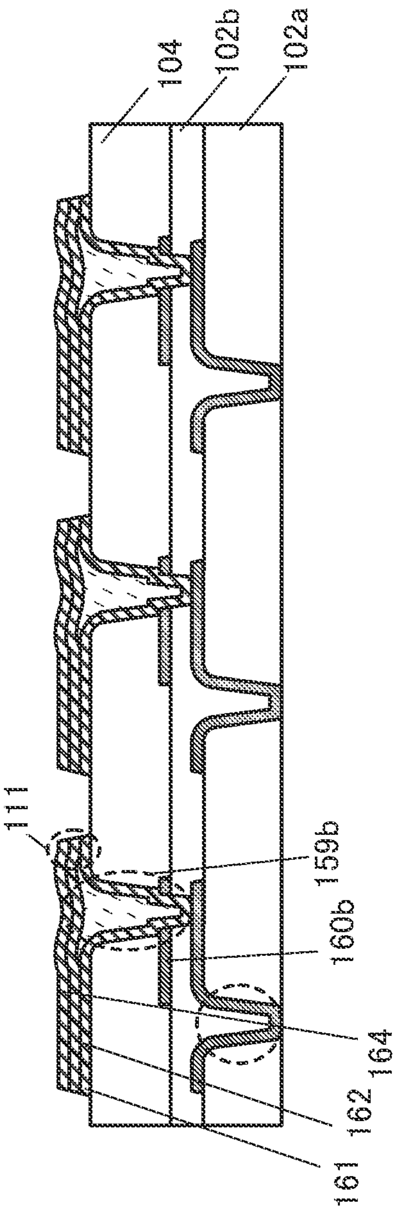
FIG. 21 is a cross-sectional view illustrating a fabrication method.

A substrate is prepared as in Fabrication method examples 1 and 2, and the components up to the insulating layer 104 are formed as illustrated in FIG. 21 in a manner similar to that of Fabrication method 2. A contact hole 159*b* is formed in the insulating layer 104. The contact hole 159*b* is also sometimes referred to as a through contact.

The contact hole 159*b* is formed such that the diameter of the contact hole formed above the conductive layer 160*b* is larger than the diameter of the contact hole formed in and below the conductive layer 160*b*. Like the contact hole 159*a*, the contact hole 159*b* is preferably formed by dry etching. Examples of the etching gas include $CF_4$, $C_4F_8$, $SF_6$, $CHF_3$, $Cl_2$, $H_2O$, $BCl_3$, $H_2$, and a rare gas such as He.

As illustrated in FIG. 21, the conductive layer 161 is formed in the contact hole 159*b*. The conductive layer 161 can be formed using a material and the like similar to those for the conductive layer 161 in Fabrication method example 1. The conductive layer 161 includes a region in contact with the side surface and the top surface of the conductive layer 160*b* to obtain electrical connection. Such a structure in contact with a side surface is sometimes referred to as a side contact.

After that, the resin layer 163, the conductive layer 161, the conductive layer 162, and the conductive layer 164 are formed as in Fabrication method 2.

After such a structure is obtained, steps from the formation of the organic compound film and the like to bonding of the counter substrate are performed as in Fabrication method example 1, whereby the display device can be fabricated.

The through contact including the contact holes with different diameters is preferably formed as in Fabrication method 3, in which case the surface where the conductive layers are in contact with each other, i.e., the contact surface, in the through electrode can be larger as well as an aperture ratio can be kept high.

In the above manner, the display device can be fabricated.

This embodiment can be combined with any of the other embodiments as appropriate. In the case where a plurality of structure examples are described in one embodiment in this specification, the structure examples can be combined as appropriate.

Embodiment 9

In this embodiment, a display device of one embodiment of the present invention will be described with reference to drawings.

Specific Example of Display Device

One embodiment of the display device described in the above embodiment is a display module DP provided with an FPC 74. A large display device using a plurality of the display modules DP will be described with reference to FIG. 22.

Figure 22A:
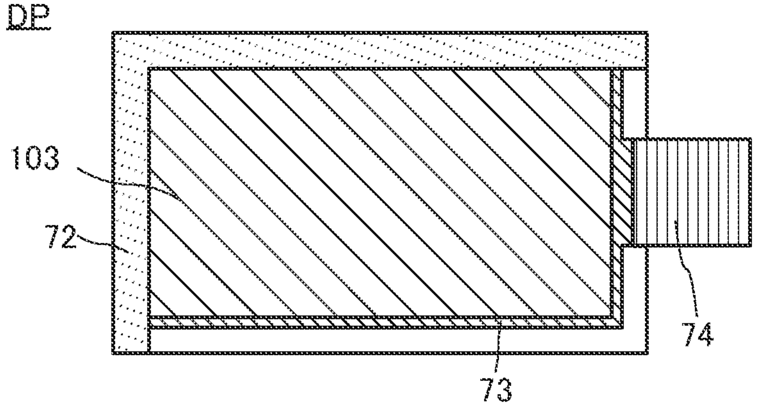
FIG. 22A is a top view of a display device.

FIG. 22A is a top view of the display module DP. The display module DP includes a visible-light-transmitting region 72 and a visible-light-blocking region 73 that are adjacent to the pixel portion 103.

Figure 22B:
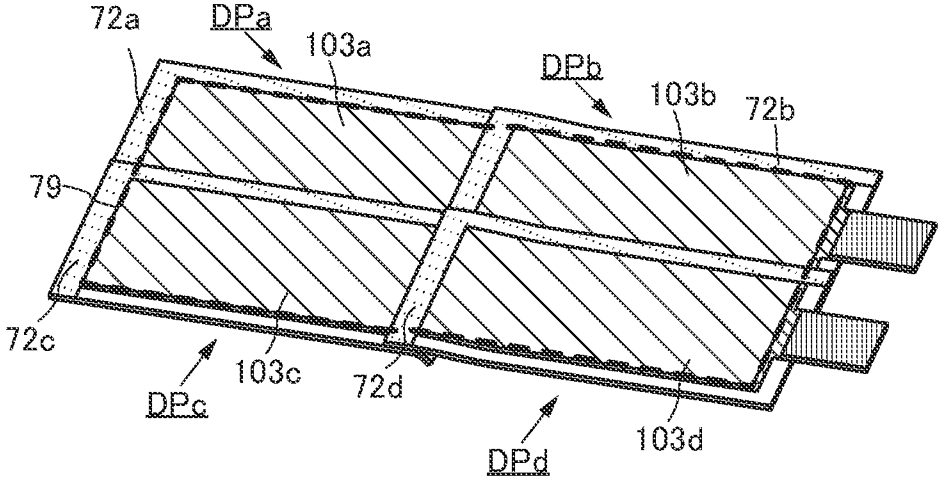
FIG. 22B and FIG. 22C are perspective views of the display device.
Figure 22C:
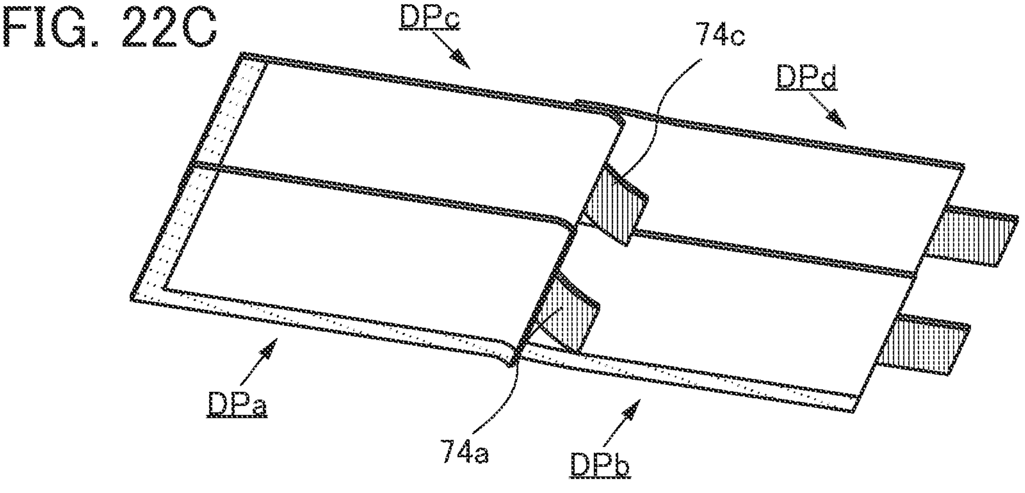

FIG. 22B and FIG. 22C are perspective views of a display device including four display modules DP. When a plurality of display modules DP are arranged in one or more directions (e.g., in one column or in a matrix), a large display device with a large display region can be fabricated.

In the case where a large display device is fabricated using the plurality of display modules DP, each of the display modules DP is not required to be large. Thus, a manufacturing apparatus for fabricating the display modules DP does not need to be increased in size, whereby space-saving can be achieved. Furthermore, since a manufacturing apparatus for small- and medium-sized display panels can be used and a novel manufacturing apparatus does not need to be utilized for a larger display device, manufacturing cost can be reduced. In addition, a decrease in yield caused by an increase in the size of the display modules DP can be inhibited.

A non-display region where wirings and the like are led is positioned in the periphery of the pixel portion 103. The non-display region corresponds to the visible-light-blocking region 73. When the plurality of display modules DP overlap with one another, one image is sometimes perceived as images separated by the non-display region or the like.

Thus, in one embodiment of the present invention, the visible-light-transmitting region 72 is provided in the display module DP, and in two display modules overlapping with each other, the pixel portion 103 of the display module DP placed on the lower side and the visible-light-transmitting region 72 of the display module DP placed on the upper side overlap with each other.

The visible-light-transmitting region 72 provided in this manner eliminates the need for actively downsizing the non-display region in the display module DP. Note that two display modules DP overlapping with each other are preferable because of the downsized non-display region. As a result, a large display device in which a seam between the display modules DP is hardly seen by a user can be obtained.

In the display module DP positioned on the upper side, the visible-light-transmitting region 72 may be provided in at least part of the non-display region. The visible-light-transmitting region 72 can overlap with the pixel portion 103 of the display module DP positioned on the lower side.

Furthermore, at least part of the non-display region of the display module DP positioned on the lower side overlaps with the pixel portion 103 or the visible-light-blocking region 73 of the display module DP positioned on the upper side.

The non-display region of the display module DP is preferably large because an increase in the distance between the end portion of the display module DP and an element in the display module DP can inhibit the deterioration of the element due to impurities entering from the outside of the display module DP.

In the case where the plurality of display modules DP are provided in the display device as described above, the pixel portion 103 is continuous between the adjacent display modules DP; thus, a display region with a large area can be provided.

The pixel portion 103 includes a plurality of pixels.

In the visible-light-transmitting region 72, a pair of substrates that constitute the display module DP, a resin material for sealing a display element sandwiched between the pair of substrates, and the like may be provided. In that case, for members provided in the visible-light-transmitting region 72, materials having a property of transmitting visible light are used.

In the visible-light-blocking region 73, a wiring electrically connected to the pixels included in the pixel portion 103 may be provided, for example. Moreover, one or both of a scan line driver circuit and a signal line driver circuit may be provided in the visible-light-blocking region 73. Furthermore, a terminal connected to the FPC 74, a wiring connected to the terminal, and the like may be provided in the visible-light-blocking region 73.

FIG. 22B and FIG. 22C illustrate an example in which the display modules DP each of which is illustrated in FIG. 22A are arranged in a 2×2 matrix (two display modules DP are arranged in the longitudinal direction and the lateral direction). FIG. 22B is a perspective view of the display surface side of the display modules DP, and FIG. 22C is a perspective view of the side opposite to the display surface side of the display modules DP.

Four display modules DP (display modules DPa, DPb, DPc, and DPd) are arranged to have regions overlapping with one another. Specifically, the display modules DPa, DPb, DPc, and DPd are arranged such that the visible-light-transmitting region 72 included in one display module DP (72*a* of the display module DPa, 72*b* of the display module DPb, 72*c* of the display module DPc, or 72*d* of the display module DPd) has a region overlapping with the pixel portion 103 (on the display surface side) included in another display module DP In addition, the display modules DPa, DPb, DPc, and DPd are arranged such that the visible-light-blocking region 73 included in each of the display modules DP does not overlap with the pixel portion 103 of another display module DP. In a portion where four display modules DP overlap with one another, the display module DPb is stacked over the display module DPa, the display module DPc is stacked over the display module DPb, and the display module DPd is stacked over the display module DPc.

The short sides of the display modules DPa and DPb overlap with each other, and part of a pixel portion 103*a* and part of the visible-light-transmitting region 72*b* overlap with each other. Furthermore, the long sides of the display modules DPa and DPc overlap with each other, and part of the pixel portion 103*a* and part of the visible-light-transmitting region 72*c* overlap with each other.

Part of a pixel portion 103*b* overlaps with part of the visible-light-transmitting region 72*c* and part of the visible-light-transmitting region 72*d*. In addition, part of a pixel portion 103*c* overlaps with part of the visible-light-transmitting region 72*d*.

Thus, a region where the pixel portion 103*a* to the pixel portion 103*d* are placed almost seamlessly can be a display region 79.

Here, it is preferable that the display module DP have flexibility. For example, the pair of substrates included in the display module DP preferably have flexibility.

Thus, as illustrated in FIG. 22B and FIG. 22C, the vicinity of an FPC 74*a* of the display module DPa can be bent such that part of the display module DPa and part of the FPC 74*a* are placed under the pixel portion 103*b* of the display module DPb adjacent to the FPC 74*a*, for example. As a result, the FPC 74*a* can be placed without physical interference with the rear surface of the display module DPb. Furthermore, when the display module DPa and the display module DPb overlap with and are fixed to each other, it is not necessary to consider the thickness of the FPC 74*a*; thus, the level difference between the top surface of the visible-light-transmitting region 72*b* and the top surface of the display module DPa can be reduced. This can make the end portion of the display module DPb positioned over the pixel portion 103*a* less noticeable. As illustrated in FIG. 22C, an FPC 74*c* of the display module DPc is preferably bent in a manner similar to that of the FPC 74*a*.

Moreover, when each of the display modules DP has flexibility, the display module DPb can be curved gently such that the top surface of the pixel portion 103*b* of the display module DPb is level with the top surface of the pixel portion 103*a* of the display module DPa. Thus, the display regions can be level with each other except in the vicinity of a region where the display module DPa and the display module DPb overlap with each other, and the display quality of a video displayed on the display region 79 can be improved.

Although the relationship between the display module DPa and the display module DPb is taken as an example in the above description, the same can apply to the relationship between any other two adjacent display modules DP.

Note that to reduce a step between two adjacent display modules DP, the thicknesses of the display modules DP are preferably small. For example, the thicknesses of the display modules DP are preferably less than or equal to 1 mm, further preferably less than or equal to 300 m, still further preferably less than or equal to 100 μm.

The display module DP preferably incorporates both a scan line driver circuit and a signal line driver circuit. In the case where a driver circuit is provided separately from the display panel, a printed circuit board including a driver circuit and a large number of wirings, terminals, and the like are provided on the back side (the side opposite to the display surface side) of the display panel. Thus, the number of components of the whole display device becomes enormous, which leads to an increase in weight of the display device in some cases. When the display module DP incorporates both a scan line driver circuit and a signal line driver circuit, the number of components of the display device can be reduced and the weight of the display device can be reduced. This leads to higher portability of the display device.

Here, the scan line driver circuit and the signal line driver circuit are required to operate at a high driving frequency in accordance with the frame frequency of an image to be displayed. In particular, the signal line driver circuit is required to operate at a higher driving frequency than the scan line driver circuit. Thus, some transistors used for the signal line driver circuit require the capability of supplying a large amount of current in some cases. Meanwhile, some transistors provided in the pixel portion require adequate withstand voltage for driving a display element in some cases.

In view of the above, the transistor included in the driver circuit and the transistor included in the pixel portion are preferably formed to have different structures. For example, a transistor with high withstand voltage is used as one or more of the transistors provided in the pixel portion, and a transistor with a high driving frequency is used as one or more of the transistors provided in the driver circuit.

Specifically, one or more of the transistors used for the signal line driver circuit include a gate insulating layer thinner than that of the transistor used for the pixel portion. By forming two kinds of transistors separately as described above, the signal line driver circuit can be formed over the substrate where the pixel portion is provided.

In each transistor used for the scan line driver circuit, the signal line driver circuit, and the pixel portion, a metal oxide is preferably used for a semiconductor where a channel is formed.

Alternatively, in each transistor used for the scan line driver circuit, the signal line driver circuit, and the pixel portion, silicon is preferably used for a semiconductor where a channel is formed.

As transistors used for the scan line driver circuit, the signal line driver circuit, and the pixel portion, a transistor in which a metal oxide is used for a semiconductor where a channel is formed and a transistor in which silicon is used for a semiconductor where a channel is formed are preferably used in combination.

This embodiment can be combined with any of the other embodiments as appropriate. In the case where a plurality of structure examples are described in one embodiment in this specification, the structure examples can be combined as appropriate.

Embodiment 10

In this embodiment, a large display device using the plurality of flexible display modules DP will be described with reference to FIG. 23, FIG. 24, and the like. The large display device using the plurality of display modules DP has a curved display surface. When such a large display device is seen, a sense of immersion can be obtained.

Figure 23A:
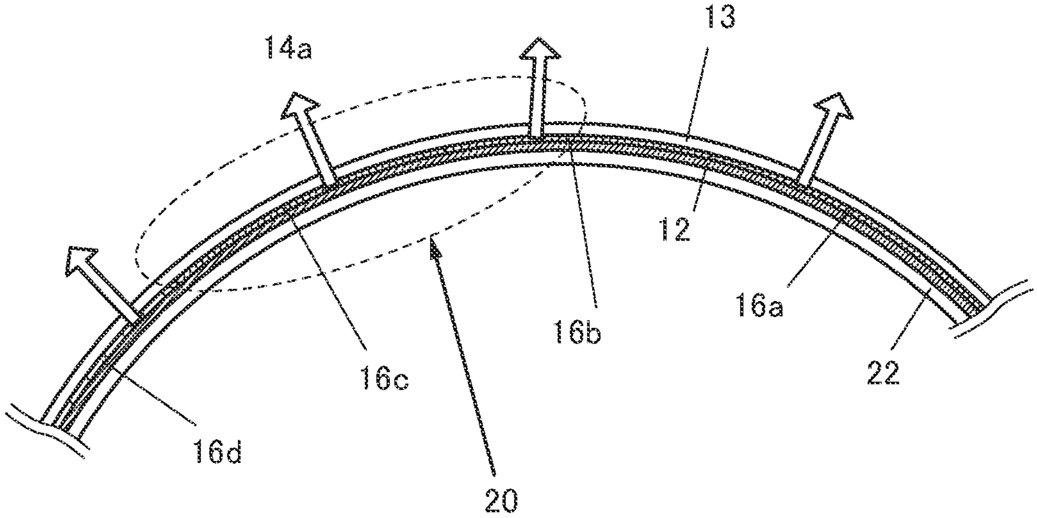
FIG. 23A and FIG. 23B are cross-sectional views of display devices.
Figure 24A:
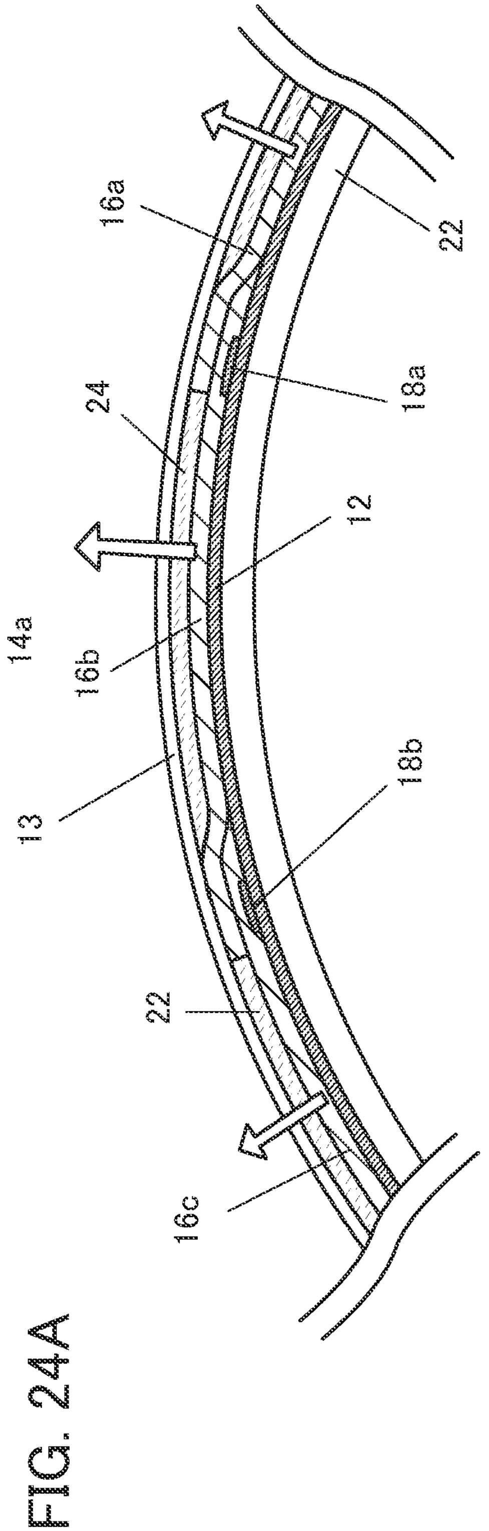
FIG. 24A and FIG. 24B are cross-sectional views of display devices.

FIG. 23A is a cross-sectional view of a display device in which a pixel portion is provided in a support 22 having a curved surface. Although an FPC is not illustrated in FIG. 23A, the FPC can be provided in a manner similar to that in the above embodiment. FIG. 24A is an enlarged view of a region 20 surrounded by a dotted line in FIG. 23A.

The support 22 can also be referred to as a housing or a support member and is formed using a component that can partly have a curved surface. In the case where the display device is provided inside a motor vehicle, for example, plastic, a metal, glass, rubber, or the like can be used for the support 22. Although the support 22 having a plate-like shape is illustrated in FIG. 23A, the shape of the support 22 is not limited to a plate-like shape and the support 22 has a shape partly having a curved surface.

In FIG. 23A, four display modules of a first display module 16*a*, a second display module 16*b*, a third display module 16*c*, and a fourth display module 16*d* are arranged side by side. Pixel portions of light-emitting devices can be arranged side by side to form one display surface. Although FIG. 23A illustrates an example in which the four display modules form one display surface in the display device, there is no particular limitation and two or more display modules can form one display surface. Arrows in FIG. 23A indicate light-emitting directions 14*a* of the third display module 16*c*.

A wiring layer 12 is provided over the support 22. The wiring layer 12 includes a plurality of wirings. At least one of the plurality of wirings is electrically connected to an electrode included in the second display module 16*b*. The wiring layer 12 includes, in addition to the wirings, an insulating film covering the wirings. A contact hole is provided in the insulating film, and the plurality of wirings of the wiring layer 12 can be electrically connected to electrodes included in the display modules through the contact hole. The wirings of the wiring layer 12 can each function as a connection wiring, a power supply line, a signal line, a fixed potential line, or the like.

The wirings of the wiring layer 12 can be formed over the support 22 by a method in which a silver paste is selectively formed, a transposition method, or a transfer method.

In the display device illustrated in FIG. 23A, the wirings of the wiring layer 12 can function as common wirings. The common wirings refer to wirings that can be shared by at least the first display module 16*a* and the second display module 16*b*. For example, the wirings of the wiring layer 12 can be electrically connected to the electrode of the first display module 16*a* and can be electrically connected also to the electrode of the second display module 16*b*. Note that the common wirings may be shared also by the third display module 16*c* and the like. Such common wirings preferably function as power supply lines.

The viewing surfaces of the first display module 16*a*, the second display module 16*b*, and the third display module 16*c* are preferably covered with a cover member 13. As illustrated in FIG. 24A, the cover member 13 is bonded to each of the display modules with the use of a resin 24 or the like. For example, by adjusting the refractive index of the resin 24, lines (vertical stripes or horizontal stripes) that might be generated around the boundaries between the first display module 16*a*, the second display module 16*b*, and the third display module 16*c* can be less noticeable. The structure in which the cover member 13 is bonded to each of the display modules with the use of the resin 24 allows the first display module 16*a*, the second display module 16*b*, the third display module 16*c*, and the fourth display module 16*d* to be fixed firmly.

For the cover member 13, for example, polyimide (PI), aramid, polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), or a silicone resin can be used. A substrate containing any of these materials can be referred to as a plastic substrate. The plastic substrate has a light-transmitting property and has a film-like shape.

The cover member 13 may be formed using an optical film (a polarizing film, a circularly polarizing film, or alight-scattering film). Alternatively, a stacked-layer film in which a plurality of optical films are stacked may be used as the cover member 13.

In FIG. 24A, the end portion of the second display module 16*b* and the end portion of the third display module 16*c* overlap with each other. An electrode 18*b* of the third display module 16*c* is provided in the region where the end portions overlap with each other, and the electrode 18*b* is electrically connected to the wirings of the wiring layer 12. When the vicinity of the electrode 18*b* overlaps with the end of the pixel portion of the second display module 16*b*, a line (a vertical stripe or a horizontal stripe) that might be generated around the boundary between the third display module 16*c* and the second display module 16*b* can be less noticeable.

Also when a light-blocking layer such as a black matrix is placed to overlap with the vicinity of the boundary, a line (a vertical stripe or a horizontal stripe) that might be generated around the boundary between the third display module 16*c* and the second display module 16*b* can be less noticeable.

When the vicinity of an electrode 18*a* of the second display module 16*b* overlaps with the end of the pixel portion of the first display module 16*a*, a line (a vertical stripe or a horizontal stripe) that might be generated around the boundary between the first display module 16*a* and the second display module 16*b* can be less noticeable.

Also when a light-blocking layer such as a black matrix is placed to overlap with the vicinity of the boundary, a line (a vertical stripe or a horizontal stripe) that might be generated around the boundary between the first display module 16*a* and the second display module 16*b* can be less noticeable.

Figure 24B:
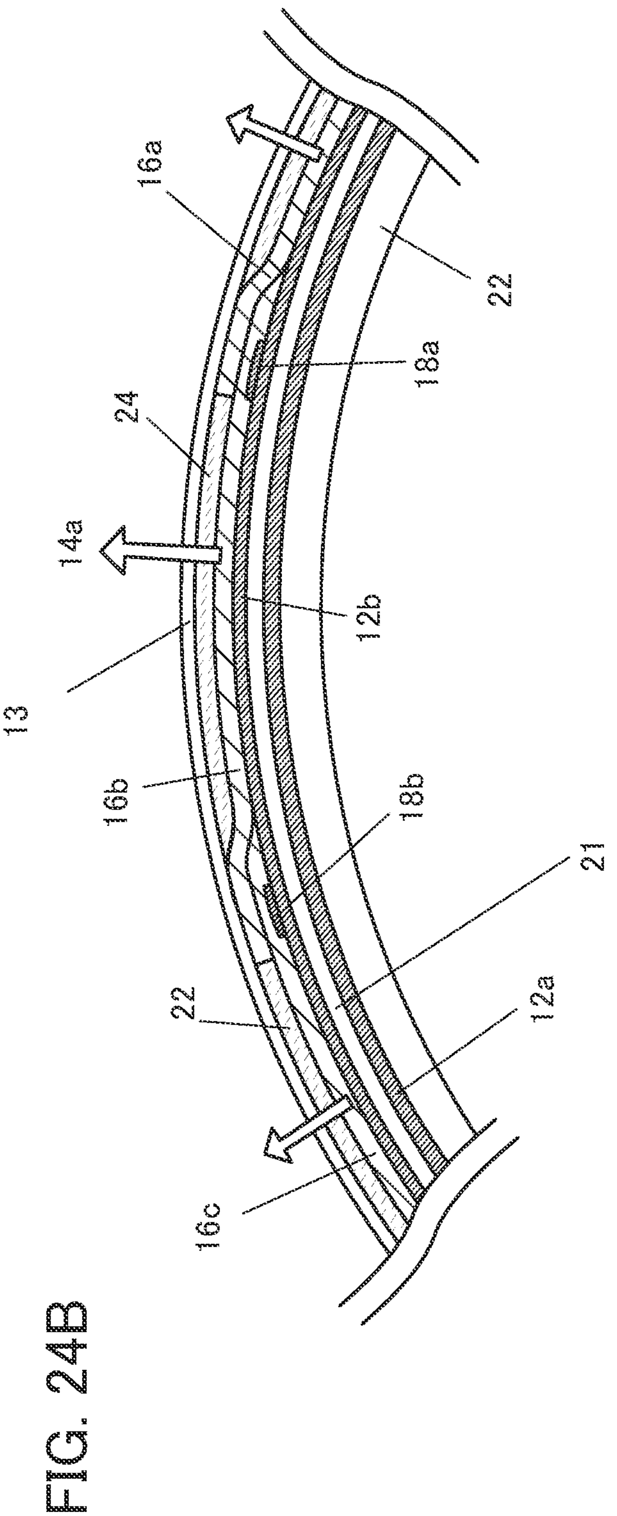

The wiring layer 12 can have a multilayer structure and an example of such a case is illustrated in FIG. 24B.

In FIG. 24B, the support 22 having a curved surface is provided with a stack including a wiring layer 12*a*, an insulating film 21 over the wiring layer 12*a*, and a wiring layer 12*b* over the insulating film 21. The wirings of the wiring layer 12*a* and the wiring layer 12*b* may be arranged to intersect with each other. Like the wiring layer 12 in FIG. 24A, the wiring layer 12*b* can be electrically connected to the electrodes of the display modules. The wiring layer 12*a* can be electrically connected to the electrodes of the display modules through a contact hole provided in the insulating film 21.

The wirings of the wiring layer 12 can function as some lead wirings of the first display module 16*a*, the second display module 16*b*, the third display module 16*c*, and the fourth display module 16*d*. The wiring density in each of the display modules can be reduced to decrease the parasitic capacitance, for example.

Figure 23B:
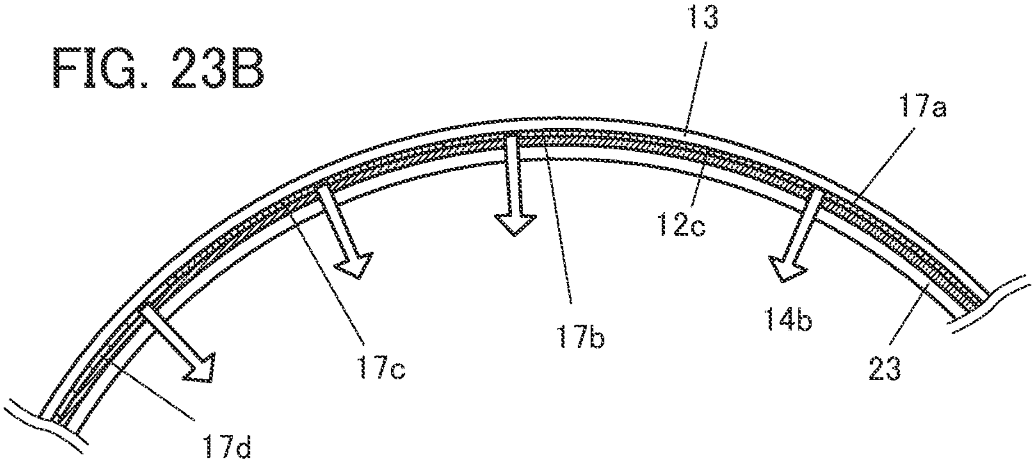

FIG. 23B illustrates a modification example of the structure in FIG. 23A. Light-emitting directions 14*b* in FIG. 23B are different from the light-emitting directions 14*a* in FIG. 23A. That is, the display surface in FIG. 23A has a convex shape and the display surface in FIG. 23B has a concave shape.

In FIG. 23B, a wiring layer 12*c* is provided, and a fifth display module 17*a*, a sixth display module 17*b*, a seventh display module 17*c*, and an eighth display module 17*d* are arranged side by side and fixed to a support 23 having a light-transmitting property. Note that the fifth display module 17*a* and the like can have structures similar to those of the first display module 16*a* and the like.

The material of the cover member 13 in the display device illustrated in FIG. 23B does not necessarily have a light-transmitting property, and a ceiling of a motor vehicle can be used for the cover member 13. Furthermore, a glass roof can be used for the cover member 13. The support 23 having a light-transmitting property is placed on the viewing surface, and the support 23 has a curved surface.

Although FIG. 23B illustrates an example in which the four display modules form one display surface in the display device, there is no particular limitation and two or more display modules can form one display surface.

The entire surface of the support illustrated in each of FIG. 23A to FIG. 24B is not necessarily a curved surface, and part of the surface may be a flat surface. The flat surface can be provided in accordance with, for example, a component inside a motor vehicle (e.g., a dashboard, a ceiling, a pillar, window glass, a steering wheel, a seat, or an inner portion of a door).

Furthermore, the display surface, i.e., the viewing surface, of the display device can be provided with a touch sensor. With the touch sensor, the display surface that can be operated by touch of a hand or a finger of a driver of a motor vehicle can be provided.

The flexible substrate included in the support is more fragile than a glass substrate. Thus, in the case where the touch sensor is provided, a surface protective film is preferably provided to prevent a scratch from being caused by touch of a hand or a finger. As the surface protective film, a silicon oxide film having optically good characteristics (a high visible light transmittance or a high infrared light transmittance) is preferably used. The surface protective film may be formed using DLC (diamond-like carbon), alumina (AlOx), a polyester-based material, a poly carbonate-based material, or the like. Note that a material having high hardness is suitable for the surface protective film. Providing the surface protective film can prevent dirt from attaching to the support.

In the case where the surface protective film is formed by a coating method, the surface protective film can be formed before the display device is fixed to the support having a curved surface or can be formed after the display device is fixed to the support having a curved surface.

In this manner, a large display device having a curved surface can be provided. When a large display device having a curved surface is seen, a sense of immersion can be obtained.

This embodiment can be implemented in combination with any of the other embodiments described in this specification and the like as appropriate. For example, part of the structure described in this embodiment may be implemented in combination with any of the other embodiments described in this specification and the like as appropriate.

Embodiment 11

In this embodiment, a display device of one embodiment of the present invention will be described with reference to FIG. 25.

The display device in this embodiment can be a high-resolution display device. Accordingly, the display device in this embodiment can be used for display portions of information terminals (wearable devices) such as watch-type and bracelet-type information terminals and display portions of wearable devices that can be worn on a head, such as a VR device like a head-mounted display and a glasses-type AR device.

[Display Module]

Figure 25A:
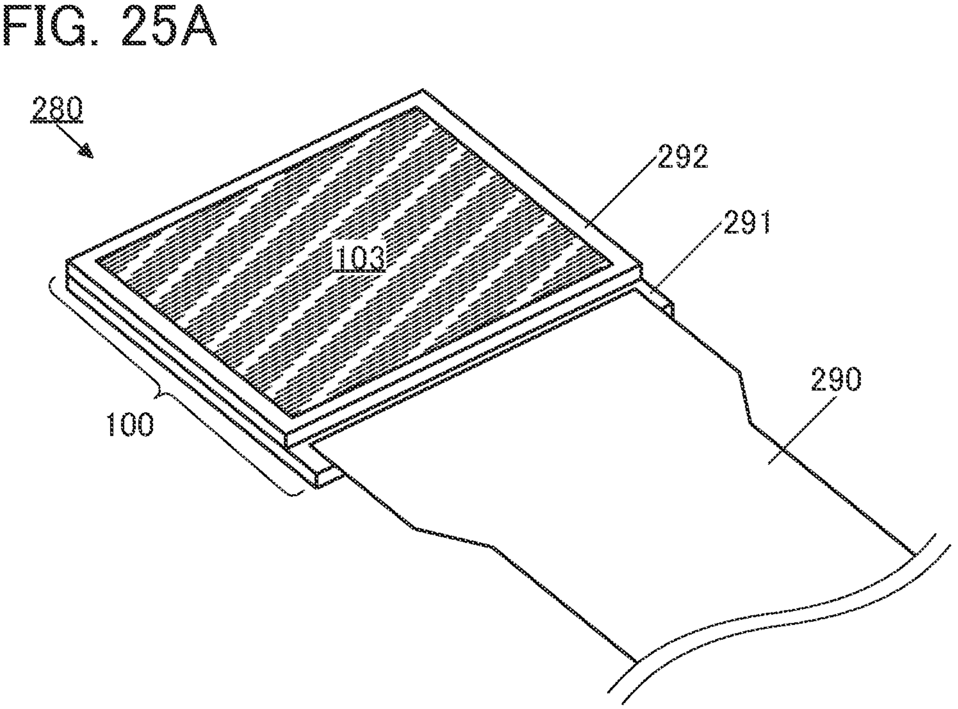
FIG. 25A and FIG. 25B are perspective views of a display device.

FIG. 25A is a perspective view of a display module 280. The display module 280 includes the display device 100 and an FPC 290.

The display module 280 includes a substrate 291 and a substrate 292. The display module 280 includes the pixel portion 103. The pixel portion 103 is a region of the display module 280 where an image is displayed, and is a region where light from pixels provided in the pixel portion 103 described later can be seen.

Figure 25B:
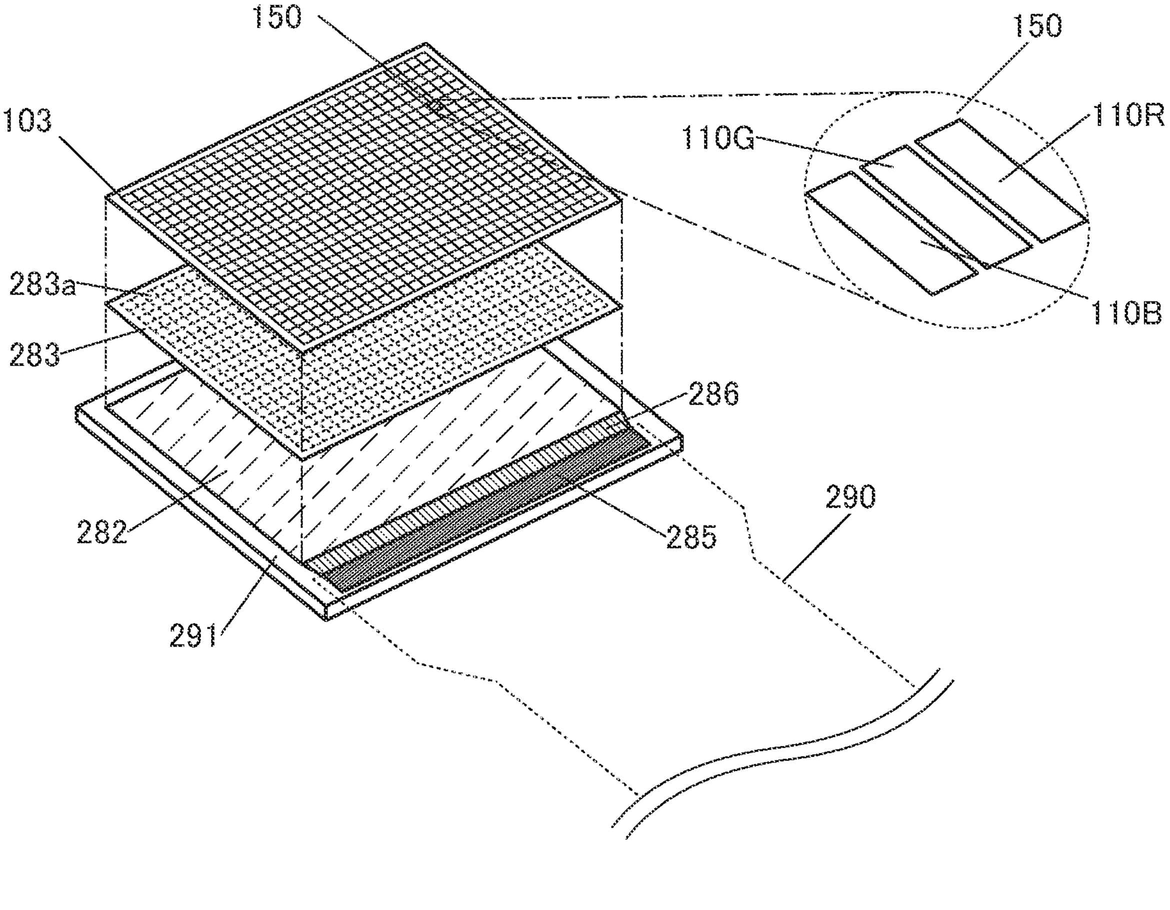

FIG. 25B is a perspective view schematically illustrating a structure on the substrate 291 side. Over the substrate 291, a circuit portion 282, a pixel circuit portion 283 over the circuit portion 282, and the pixel portion 103 over the pixel circuit portion 283 are stacked. A terminal portion 285 (sometimes referred to as an FPC terminal portion) to be connected to the FPC 290 is provided in a portion that is over the substrate 291 and does not overlap with the pixel portion 103. The terminal portion 285 and the circuit portion 282 are electrically connected to each other through a wiring portion 286 formed of a plurality of wirings.

The pixel portion 103 includes the plurality of pixels 150 arranged periodically. An enlarged view of one pixel 150 is shown on the right side of FIG. 25B. The pixel 150 includes the subpixels 110 that emit light of different colors. The plurality of light-emitting devices can be laid out in stripe arrangement as illustrated in FIG. 25B. Alternatively, a variety of arrangement methods of light-emitting devices, such as delta arrangement and PenTile arrangement, can be employed.

The pixel circuit portion 283 includes pixel circuits 283*a* including a plurality of transistors and the like arranged periodically.

One pixel circuit 283*a* is a circuit that controls light emission from light-emitting devices included in one pixel 150. One pixel circuit 283*a* may be provided with three circuits each of which controls light emission from one light-emitting device. For example, the pixel circuit 283*a* can include at least one selection transistor, one current control transistor (driving transistor), and a capacitor for one light-emitting device. In that case, a gate signal is input to a gate of the selection transistor, and a source signal is input to one of a source and a drain of the selection transistor. Thus, an active-matrix display device is achieved.

The circuit portion 282 includes a circuit for driving the pixel circuits 283*a* in the pixel circuit portion 283. For example, one or both of agate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 103; hence, the aperture ratio (effective display area ratio) of the pixel portion 103 can be significantly high. For example, an aperture ratio of the pixel portion 103 can be higher than or equal to 40% and lower than 100%, preferably higher than or equal to 50% and lower than or equal to 95%, further preferably higher than or equal to 60% and lower than or equal to 95%. Furthermore, the pixels 150 can be laid out extremely densely, and thus the resolution of the pixel portion 103 can be extremely high. For example, the pixels 150 are preferably laid out in the pixel portion 103 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has extremely high resolution and thus can be suitably used for a VR device such as ahead-mounted display or a glasses-type AR device. For example, even with a structure in which the display portion of the display module 280 is seen through a lens, pixels of the extremely-high-density pixel portion 103 included in the display module 280 are prevented from being perceived when the display portion is enlarged by the lens, so that display providing a high sense of immersion can be performed. Without being limited thereto, the display module 280 can be suitably used for electronic devices including relatively small display portions. For example, the display module 280 can be suitably used in a display portion of a wearable electronic device such as a watch.

This embodiment can be combined with any of the other embodiments as appropriate. In the case where a plurality of structure examples are described in one embodiment in this specification, the structure examples can be combined as appropriate.

Embodiment 12

In this embodiment, electronic devices of one embodiment of the present invention will be described with reference to FIG. 26 and FIG. 27.

Electronic devices of this embodiment are each provided with the display device of one embodiment of the present invention in a display portion. The display device of one embodiment of the present invention can be easily increased in resolution and definition. Thus, the display device of one embodiment of the present invention can be used for display portions of a variety of electronic devices.

Examples of electronic devices include a digital camera, a digital video camera, a digital photo frame, a mobile phone, a portable game machine, a portable information terminal, and an audio reproducing device in addition to electronic devices with a relatively large screen, such as a television device, a desktop or laptop personal computer, a monitor of a computer or the like, digital signage, and a large game machine like a pachinko machine.

In particular, the display device of one embodiment of the present invention can have a high resolution, and thus can be suitably used for an electronic device having a relatively small display portion. Examples of such an electronic device include watch-type and bracelet-type information terminals (wearable devices) and wearable devices that can be worn on a head, such as a VR device like a head-mounted display, a glasses-type AR device, and an MR device.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the definition is preferably 4K, 8K, or higher. Furthermore, the pixel density (resolution) of the display device of one embodiment of the present invention is preferably higher than or equal to 100 ppi, preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. The use of such a display device having one or both of high definition and high resolution can further increase realistic sensation, sense of depth, and the like. There is no particular limitation on the screen ratio (aspect ratio) of the display device of one embodiment of the present invention. For example, the display device is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, electric power, radiation, a flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 26A:
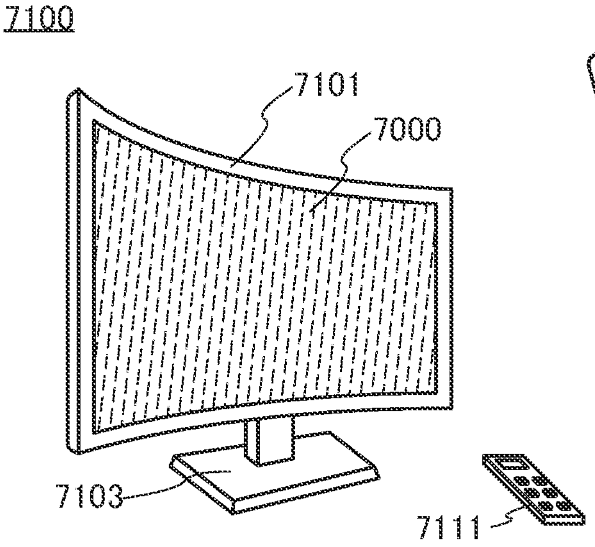
FIG. 26A to FIG. 26D are diagrams of electronic devices.

FIG. 26A illustrates an example of a television device. In a television device 7100, a pixel portion 7000 is incorporated in a housing 7101. Here, the housing 7101 is supported by a stand 7103.

The pixel portion 103 of one embodiment of the present invention can be used as the pixel portion 7000.

Operation of the television device 7100 illustrated in FIG. 26A can be performed with an operation switch provided in the housing 7101 and a separate remote control 7111. Alternatively, the pixel portion 7000 may include a touch sensor, and the television device 7100 may be operated by touch on the pixel portion 7000 with a finger or the like. The remote control 7111 may be provided with a display portion for displaying information output from the remote control 7111. With operation keys or a touch panel provided in the remote control 7111, channels and volume can be operated and videos displayed on the pixel portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) information communication can be performed.

Figure 26B:
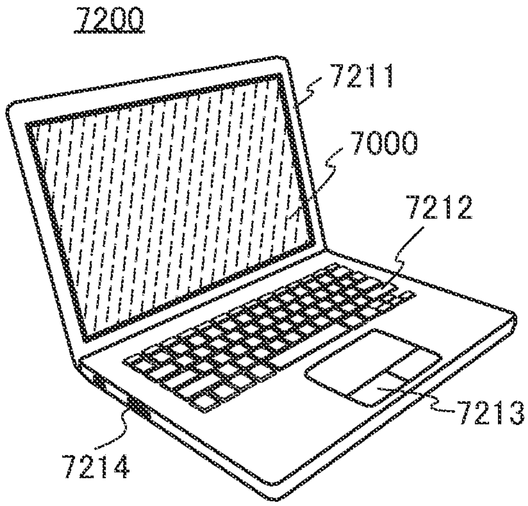

FIG. 26B illustrates an example of a laptop personal computer. A laptop personal computer 7200 includes a housing 7211, a keyboard 7212, a pointing device 7213, an external connection port 7214, and the like. In the housing 7211, the pixel portion 7000 is incorporated.

The pixel portion 103 of one embodiment of the present invention can be used as the pixel portion 7000.

Figure 26C:
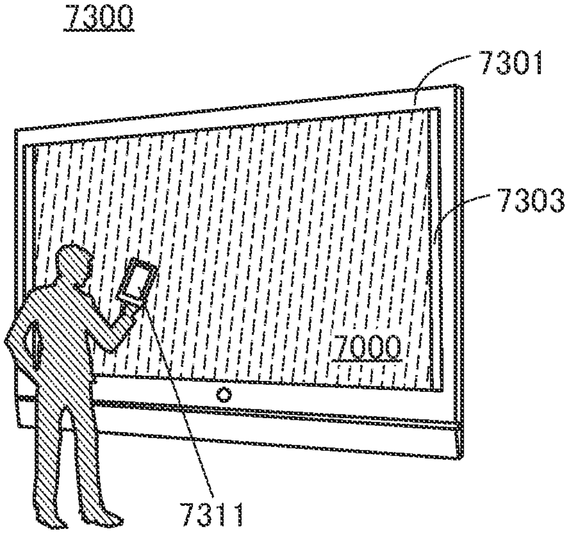
Figure 26D:
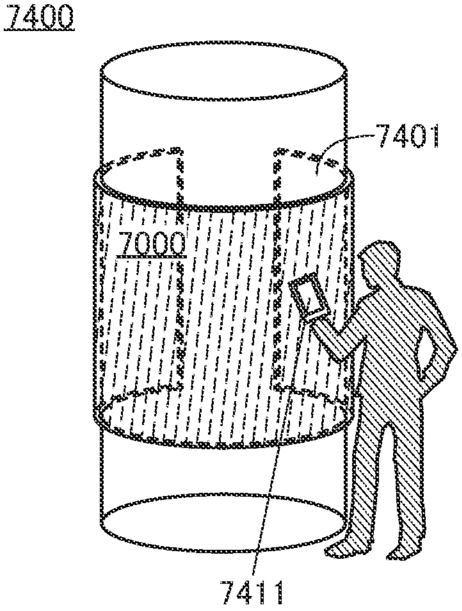

FIG. 26C and FIG. 26D illustrate examples of digital signage.

Digital signage 7300 illustrated in FIG. 26C includes a housing 7301, the pixel portion 7000, a speaker 7303, and the like. The digital signage 7300 can also include an LED lamp, an operation key (including a power switch or an operation switch), a connection terminal, a variety of sensors, a microphone, and the like.

FIG. 26D is digital signage 7400 attached to a cylindrical pillar 7401. The digital signage 7400 includes the pixel portion 7000 provided along a curved surface of the pillar 7401.

The pixel portion 103 of one embodiment of the present invention can be used as the pixel portion 7000 in FIG. 26C and FIG. 26D.

A larger area of the pixel portion 7000 can increase the amount of information that can be provided at a time. The larger pixel portion 7000 attracts more attention, so that the effectiveness of the advertisement can be increased, for example.

The use of a touch panel in the pixel portion 7000 is preferable because in addition to display of a still image or a moving image on the pixel portion 7000, intuitive operation by a user is possible. Moreover, for an application for providing information such as route information or traffic information, usability can be enhanced by intuitive operation.

As illustrated in FIG. 26C and FIG. 26D, it is preferable that the digital signage 7300 or the digital signage 7400 be capable of working with an information terminal 7311 or an information terminal 7411 such as a smartphone a user has through wireless communication. For example, information of an advertisement displayed on the pixel portion 7000 can be displayed on a screen of the information terminal 7311 or the information terminal 7411. By operation of the information terminal 7311 or the information terminal 7411, display on the pixel portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Figure 27A:
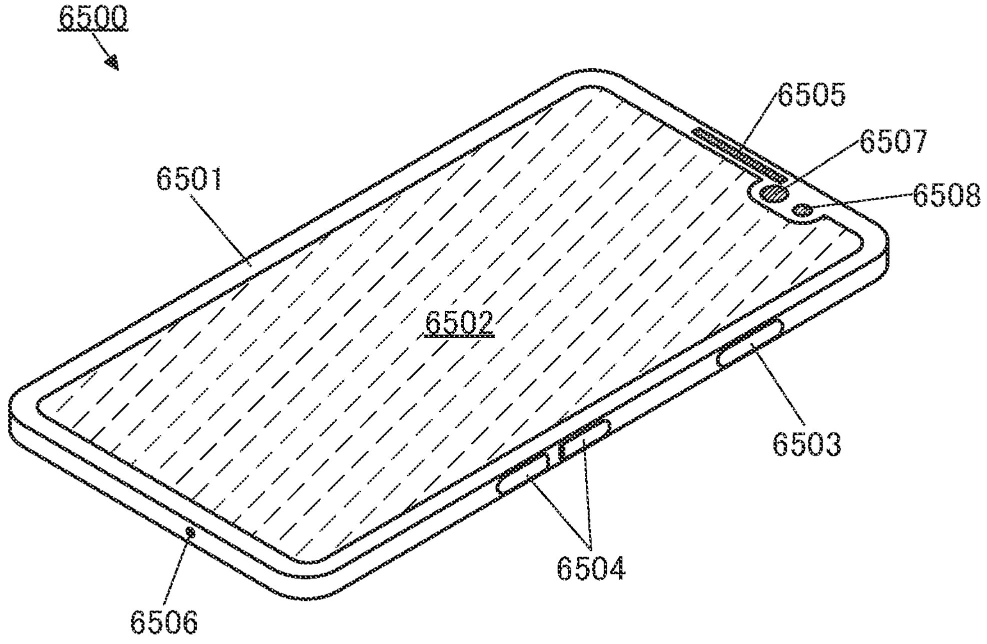
FIG. 27A and FIG. 27B are diagrams of an electronic device.

An electronic device 6500 illustrated in FIG. 27A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The pixel portion 103 of one embodiment of the present invention can be used in the display portion 6502.

Figure 27B:
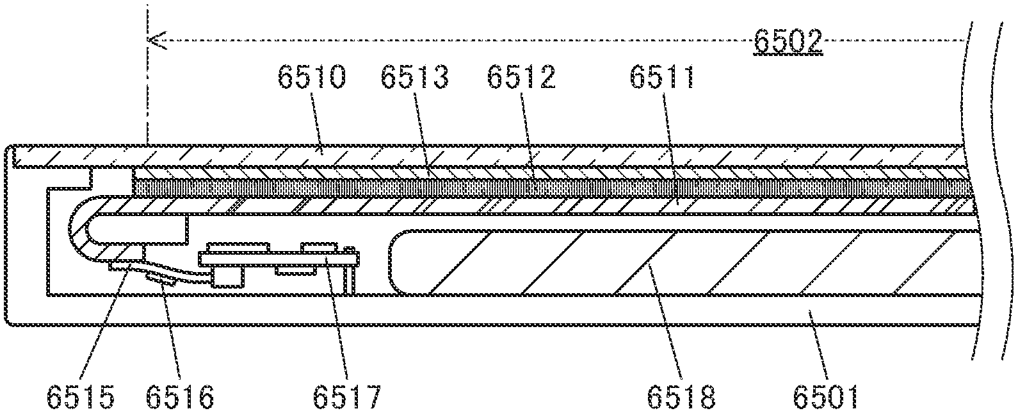

FIG. 27B is a cross-sectional view including the end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is reduced. Moreover, part of the display panel 6511 is folded back such that a connection portion with the FPC 6515 is provided on the back side of the pixel portion, whereby an electronic device with a narrow bezel can be achieved.

This embodiment can be combined with any of the other embodiments as appropriate. In the case where a plurality of structure examples are described in one embodiment in this specification, the structure examples can be combined as appropriate.

REFERENCE NUMERALS

14*a*: light-emitting direction, 14: insulating layer, 15: contact hole, 103: pixel portion, 110R: subpixel, 110G: subpixel, 110B: subpixel, 111: lower electrode, 112: organic compound layer, 113: common electrode, 151*a*: first wiring layer, 151*b*: second wiring layer, 151: auxiliary wiring, 152: opening, 153*a*: third wiring layer, 153*b*: fourth wiring layer, 154: bridge wiring

The invention claimed is:

1. A display device comprising:

a first light-emitting device comprising a first lower electrode, a first light-emitting layer over the first lower electrode, a first charge-generation layer over the first light-emitting layer, and a second light-emitting layer over the first charge-generation layer;

a first color filter overlapping with the first light-emitting device;

a second light-emitting device comprising a second lower electrode, a third light-emitting layer over the second lower electrode, a second charge-generation layer over the third light-emitting layer, and a fourth light-emitting layer over the second charge-generation layer;

a second color filter overlapping with the second light-emitting device;

a common electrode in the first light-emitting device and the second light-emitting device; and an auxiliary wiring electrically connected to the common electrode, wherein a color exhibited by a light-emitting material of the first light-emitting layer is different from a color exhibited by a light-emitting material of the second light-emitting layer, wherein a color exhibited by a light-emitting material of the third light-emitting layer is different from a color exhibited by a light-emitting material of the fourth light-emitting layer, wherein the auxiliary wiring comprises a first wiring layer and a second wiring layer, wherein the second wiring layer is electrically connected to the first wiring layer through a contact hole of an insulating layer, and wherein the second wiring layer has a lattice shape in a top view.

2. The display device according to claim 1, wherein the first charge-generation layer and the second charge-generation layer each comprise an inorganic compound comprising lithium and oxygen.

3. The display device according to claim 1, wherein end portions of the first lower electrode and the second lower electrode each have a tapered shape.

4. The display device according to claim 1, wherein a taper angle of an end surface of a first organic compound layer comprising the first light-emitting layer and the second light-emitting layer is greater than or equal to 45° and less than 90°.

5. The display device according to claim 1, wherein a taper angle of an end surface of a second organic compound layer comprising the third light-emitting layer and the fourth light-emitting layer is greater than or equal to 45° and less than 90°.

6. The display device according to claim 1, wherein the first wiring layer has a lattice shape in a top view.

7. A display device comprising:

a first light-emitting device comprising a first lower electrode, a first light-emitting layer over the first lower electrode, a first charge-generation layer over the first light-emitting layer, and a second light-emitting layer over the first charge-generation layer;

a first color filter overlapping with the first light-emitting device;

a second light-emitting device comprising a second lower electrode, a third light-emitting layer over the second lower electrode, a second charge-generation layer over the third light-emitting layer, and a fourth light-emitting layer over the second charge-generation layer;

a second color filter overlapping with the second light-emitting device;

a common electrode in the first light-emitting device and the second light-emitting device; and an auxiliary wiring electrically connected to the common electrode, wherein a color exhibited by a light-emitting material of the first light-emitting layer is different from a color exhibited by a light-emitting material of the second light-emitting layer, wherein a color exhibited by a light-emitting material of the third light-emitting layer is different from a color exhibited by a light-emitting material of the fourth light-emitting layer, wherein the auxiliary wiring comprises a first wiring layer and a second wiring layer, wherein the second wiring layer is electrically connected to the first wiring layer through a contact hole of an insulating layer, wherein the first wiring layer has a lattice shape in a top view, and wherein the first lower electrode, the second lower electrode, and the second wiring layer each comprise a region over the insulating layer.

8. The display device according to claim 7, wherein the second wiring layer has a lattice shape in a top view.

9. The display device according to claim 7, wherein the first charge-generation layer and the second charge-generation layer each comprise an inorganic compound comprising lithium and oxygen.

10. The display device according to claim 7, wherein end portions of the first lower electrode and the second lower electrode each have a tapered shape.

11. The display device according to claim 7, wherein a taper angle of an end surface of a second organic compound layer comprising the third light-emitting layer and the fourth light-emitting layer is greater than or equal to 45° and less than 90°.

12. A display device comprising:

a first light-emitting device comprising a first lower electrode, a first light-emitting layer over the first lower electrode, and a second light-emitting layer over the first light-emitting layer;

a first color filter overlapping with the first light-emitting device;

a second light-emitting device comprising a second lower electrode, a third light-emitting layer over the second lower electrode, and a fourth light-emitting layer over the third light-emitting layer;

a second color filter overlapping with the second light-emitting device;

a common electrode in the first light-emitting device and the second light-emitting device; and an auxiliary wiring electrically connected to the common electrode, wherein a color exhibited by a light-emitting material of the first light-emitting layer is different from a color exhibited by a light-emitting material of the second light-emitting layer, wherein a color exhibited by a light-emitting material of the third light-emitting layer is different from a color exhibited by a light-emitting material of the fourth light-emitting layer, wherein the auxiliary wiring comprises a first wiring layer and a second wiring layer, wherein the second wiring layer is electrically connected to the first wiring layer through a contact hole of an insulating layer, and wherein at least one of the first wiring layer and the second wiring layer has a lattice shape in a top view.

13. The display device according to claim 12, wherein end portions of the first lower electrode and the second lower electrode each have a tapered shape.

14. The display device according to claim 7, wherein a taper angle of an end surface of a first organic compound layer comprising the first light-emitting layer and the second light-emitting layer is greater than or equal to 45° and less than 90°.

15. The display device according to claim 12, wherein a taper angle of an end surface of a first organic compound layer comprising the first light-emitting layer and the second light-emitting layer is greater than or equal to 45° and less than 90°.

16. The display device according to claim 12, wherein a taper angle of an end surface of a second organic compound layer comprising the third light-emitting layer and the fourth light-emitting layer is greater than or equal to 45° and less than 90°.

* * * * *